(12) United States Patent
Sharma et al.

(10) Patent No.: US 11,650,403 B2
(45) Date of Patent: May 16, 2023

(54) OPTICAL ELEMENTS FOR BEAM-SHAPING AND ILLUMINATION

(71) Applicant: META PLATFORMS TECHNOLOGIES, LLC, Menlo Park, CA (US)

(72) Inventors: Robin Sharma, Redmond, WA (US); Andrew John Ouderkirk, Redmond, WA (US); Christopher Yuan Ting Liao, Seattle, WA (US); Qi Zhang, Kirkland, WA (US); Tanya Malhotra, Redmond, WA (US); Karol Constantine Hatzilias, Kenmore, WA (US); Maik Scheller, Redmond, WA (US); Sheng Ye, Redmond, WA (US); Gregory Olegovic Andreev, Kirkland, WA (US); Guohua Wei, Redmond, WA (US)

(73) Assignee: Meta Platforms Technologies, LLC, Menlo Park, CA (US)

(*) Notice: Subject to any disclaimer, the term of this patent is extended or adjusted under 35 U.S.C. 154(b) by 119 days.

(21) Appl. No.: 16/750,777

(22) Filed: Jan. 23, 2020

(65) Prior Publication Data
US 2020/0259307 A1    Aug. 13, 2020

Related U.S. Application Data

(60) Provisional application No. 62/802,995, filed on Feb. 8, 2019, provisional application No. 62/841,728, filed on May 1, 2019.

(51) Int. Cl.
*G02B 3/00* (2006.01)
*G02B 27/01* (2006.01)
(Continued)

(52) U.S. Cl.
CPC ......... *G02B 19/0047* (2013.01); *G02B 1/002* (2013.01); *G02B 3/00* (2013.01);
(Continued)

(58) Field of Classification Search
CPC ........ G02B 13/18; G02B 3/00; G02B 27/144; G02B 27/0172; G02B 27/0149;
(Continued)

(56) References Cited

U.S. PATENT DOCUMENTS 10,564,427 B2    2/2020  Ouderkirk et al.
2001/0050758 A1* 12/2001 Suzuki ............... G02B 13/18
                                                   348/E5.142
(Continued)

FOREIGN PATENT DOCUMENTS

| WO | 2006022162 A1 | 3/2006 |
| WO | 2007/146860 A1 | 12/2007 |
| WO | 2019/020395 A1 | 1/2019 |

OTHER PUBLICATIONS

Moench et al., "VCSEL arrays with integrated optics", Proceedings of the SPIE, vol. 8639, Article No. 86390M, Mar. 13, 2013, pp. 1-10.
(Continued)

*Primary Examiner* — Dawayne Pinkney
(74) *Attorney, Agent, or Firm* — Greenberg Traurig, LLP

(57) ABSTRACT

An example device may include a light source, an optical element, and, optionally, an encapsulant layer. A light beam generated by the light source may be received by the optical element and redirected towards an illumination target, such as an eye of a user. The optical element may include a material, for example, with a refractive index of at least approximately 2 at a wavelength of the light beam. The light source may be a semiconductor light source, such as a light-emitting diode or a laser. The optical element may be
(Continued)

supported by an emissive surface of the light source. Refraction at an exit surface of the optical element, and/or within a metamaterial layer, may advantageously modify the beam properties, for example, in relation to illuminating a target. In some examples, the light source and optical element may be integrated into a monolithic light source module.

20 Claims, 29 Drawing Sheets

(51) Int. Cl.
      *G02B 27/12*       (2006.01)
      *G02B 19/00*       (2006.01)
      *G02B 1/00*       (2006.01)
      *G02B 5/04*       (2006.01)
      *G02B 27/09*       (2006.01)
      *H01S 5/00*       (2006.01)
      *H01S 5/026*       (2006.01)
      *H01S 5/183*       (2006.01)
      *H01S 5/343*       (2006.01)

(52) U.S. Cl.
    CPC .......... *G02B 5/045* (2013.01); *G02B 27/0172* (2013.01); *G02B 27/0179* (2013.01); *G02B 27/0961* (2013.01); *G02B 27/0972* (2013.01); *H01S 5/005* (2013.01); *H01S 5/026* (2013.01); *H01S 5/183* (2013.01); *H01S 5/3432* (2013.01); *H01S 5/34353* (2013.01); *G02B 2003/0093* (2013.01); *G02B 2027/0178* (2013.01); *G02B 2027/0187* (2013.01)

(58) Field of Classification Search
    CPC ................ G02B 27/145; G02B 27/143; G02B 27/1013; G02B 27/126; G02B 27/0103; B43L 13/18
    USPC .. 359/708, 642, 629–636, 618, 638–640, 13
    See application file for complete search history.

(56) References Cited

U.S. PATENT DOCUMENTS

| | | | |
|---|---|---|---|
| 2005/0286596 | A1 | 12/2005 | Mukoyama et al. |
| 2008/0069168 | A1 | 3/2008 | Kim et al. |
| 2011/0227487 | A1* | 9/2011 | Nichol ................ G02B 6/0018 362/613 |
| 2014/0104572 | A1 | 4/2014 | Sharma et al. |
| 2015/0035744 | A1 | 2/2015 | Robbins et al. |
| 2015/0098216 | A1 | 4/2015 | Hatzilias et al. |
| 2018/0038944 | A1 | 2/2018 | Hellmig et al. |
| 2018/0172988 | A1 | 6/2018 | Ahmed et al. |
| 2018/0203247 | A1 | 7/2018 | Chen et al. |
| 2018/0348548 | A1 | 12/2018 | Visser et al. |
| 2019/0101767 | A1 | 4/2019 | Geng et al. |
| 2019/0265486 | A1* | 8/2019 | Hansotte .............. G02B 6/0056 |
| 2019/0305183 | A1* | 10/2019 | Lutgen .................... H01L 33/44 |
| 2019/0361523 | A1 | 11/2019 | Sharma et al. |
| 2020/0150408 | A1 | 5/2020 | Fard et al. |
| 2020/0153203 | A1 | 5/2020 | Hatzilias et al. |
| 2020/0153204 | A1 | 5/2020 | Hatzilias et al. |

OTHER PUBLICATIONS

Wang et al., "High power and good beam quality of two-dimensional VCSEL array with integrated GaAs microlens array", Optics Express, vol. 18, No. 23, Oct. 29, 2010, pp. 23900-23905.
Wang et al., "High-Power Large-Aperture Bottom-Emitting 980-nm VCSELs with Integrated GaAs Microlens", IEEE Photonics Technology Letters, vol. 21 No. 4, Feb. 15, 2009, pp. 239-241.
Gimkiewicz et al., "Wafer-scale replication and testing of micro-optical components for VCSELs", Proceedings of SPIE, vol. 5453, No. 2, Sep. 8, 2004, pp. 13-26.
Iga, Kenichi, "Parallel Photonics: Based on VCSEL and Microphotonics Array", IEEE/LEOS International Conference on Optical MEMS, Article No. 1233438, Aug. 18, 2003, pp. 3-4.
Liu et al., "Chip-scale Integration of VCSEL, Photodetector, and Microlens Arrays", Proceedings of SPIE, vol. 4652, Jun. 3, 2002, pp. 11-18.
Fu, Yongqi, "Integration of Microdiffractive Lens with Continuous Relief with Vertical-Cavity Surface-Emitting Lasers Using Focused Ion Beam Direct Milling", IEEE Photonics Technology Letters, vol. 13, No. 5, May 1, 2001, pp. 424-426.
Strzelecka et al., "Monolithic Integration of an Array of Multiple-Wavelength Vertical-Cavity Lasers with a Refractive Microlens for Optical Interconnections", IEEE Lasers and Electro-Optics Society, vol. 2, Nov. 18, 1996, pp. 271-272.
Raddatz et al., "Measurement of Guiding Effects in Vertical-Cavity Surface-Emitting Lasers", IEEE Photonics Technology Letters, vol. 8, No. 6, Jun. 1, 1996, pp. 743-745.
Invitation to Pay Additional Fees received for PCT Application Serial No. PCT/US2020/016943 dated Jun. 2, 2020, 10 pages.
International Search Report and Written Opinion for International Application No. PCT/US2020/016943, dated Jul. 27, 2020, 14 Pages.
European Search Report for European Application No. 21213915.8, dated Jun. 30, 2022, 5 pages.
Office Action dated Oct. 24, 2022 for Chinese Application No. 202080013363.2, filed Feb. 6, 2020, 15 pages.

* cited by examiner

OPTICAL ELEMENTS FOR BEAM-SHAPING AND ILLUMINATION

CROSS REFERENCE TO RELATED APPLICATION

This application claims the benefit of U.S. Provisional Application No. 62/802,995, filed 8 Feb. 2019, and U.S. Provisional Application No. 62/841,728, filed 1 May 2019, the disclosures of each of which are incorporated, in their entirety, by this reference.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
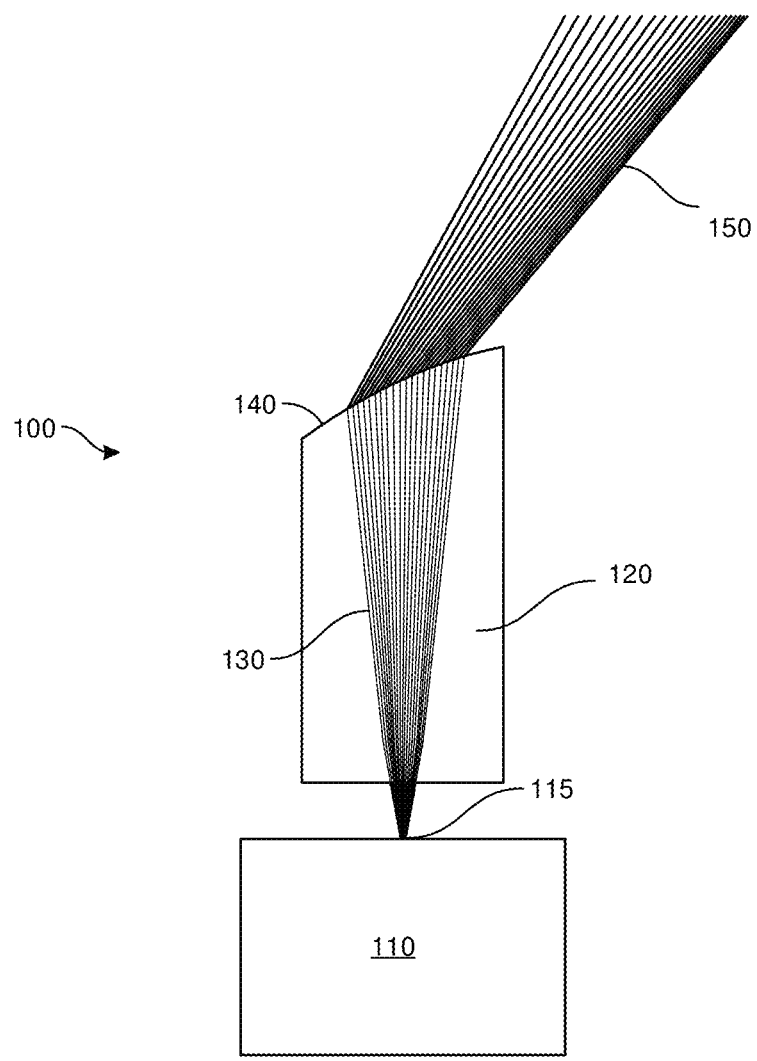
FIG. 1 is a schematic of a device including a light source and an optical element.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and are described in detail herein. However, the exemplary embodiments described herein are not intended to be limited to the particular forms disclosed. Rather, the present disclosure covers all modifications, equivalents, and alternatives falling within this disclosure.

DETAILED DESCRIPTION OF EXEMPLARY EMBODIMENTS

A light source, such as a laser, may emit a light beam having various properties, such as beam direction and beam profile. As is described in greater detail below, the present disclosure describes methods and apparatus for modifying light beam properties, for example, to improve the illumination uniformity of a target.

Examples of the present disclosure include optical devices, such as a device including an encapsulated optical element (e.g., an encapsulated lens), and devices and methods related to modifying the properties of a light beam emitted by a light source. In some examples, a device may include an optical element encapsulated by, adjacent to, or substantially adjacent to, an optical medium. The optical element may have a refractive index greater than that of the optical medium (or surrounding encapsulant layer including the optical medium). The example optical devices described herein may also include one or more light sources and/or optical elements, such as optical elements used for beam-shaping and illumination, and/or devices, systems, and methods including optical elements. In some examples, a device includes a light source, such as a laser, configured to emit a light beam. The light beam (which may more concisely be referred to as a beam) may have various beam properties, such as beam direction and beam profile. The examples described herein may include approaches to modifying one or more beam properties in a manner that may be useful for many applications, including eye-tracking.

Examples of the present disclosure may relate to example high refractive index optical elements that may be used for beam shaping and/or beam steering of light beams from light sources, such as those used in eye-tracking systems. In some examples, the optical element and (optionally) the light source are embedded in an encapsulant layer having an intermediate refractive index. The encapsulant layer (which may also be referred to simply as an "encapsulant" for conciseness) may, for example, include an optical medium such as a generally transparent polymer. In some examples, a high refractive index optical element may include an optical medium (such as a semiconductor, or dielectric material) having a refractive index greater than 1.5, in some examples, greater than 2, and in some examples, a refractive index of approximately 3 or greater. The encapsulant layer may include an optical medium, such as an optical polymer, having a refractive index that may be less than that of the high refractive index optical element. For example, the encapsulant layer may have a refractive index of between approximately 1.3 and approximately 1.8, such as approximately 1.5. The high refractive index optical element may include a complex surface form, such as an anamorphic aspheric surface. In some examples, modeling showed improved illumination uniformity of the eye, even for high projection angles, for optical elements having an aspheric curved exit surface. For example, a light beam from a light source may be directed towards the center of the eyebox from large lateral displacements, for example, from near the frame of augmented reality glasses, with improved illumination uniformity of the eyebox. In some examples, a high refractive index optical element may include gallium phosphide (GaP), though other materials may be used (e.g., other phosphides, arsenides, nitrides, oxides, and the like). In some applications, the light sources may be part of augmented or virtual reality headware, such as LEDs or lasers embedded in the lenses or frames of augmented reality glasses. In some examples, the optical configurations may help prevent total internal reflection (TIR) within optical system components, which can create unwanted stray glare. In some examples, the angular distribution of directed light may have a sharp cut-off before TIR effects occur.

Figure 5:
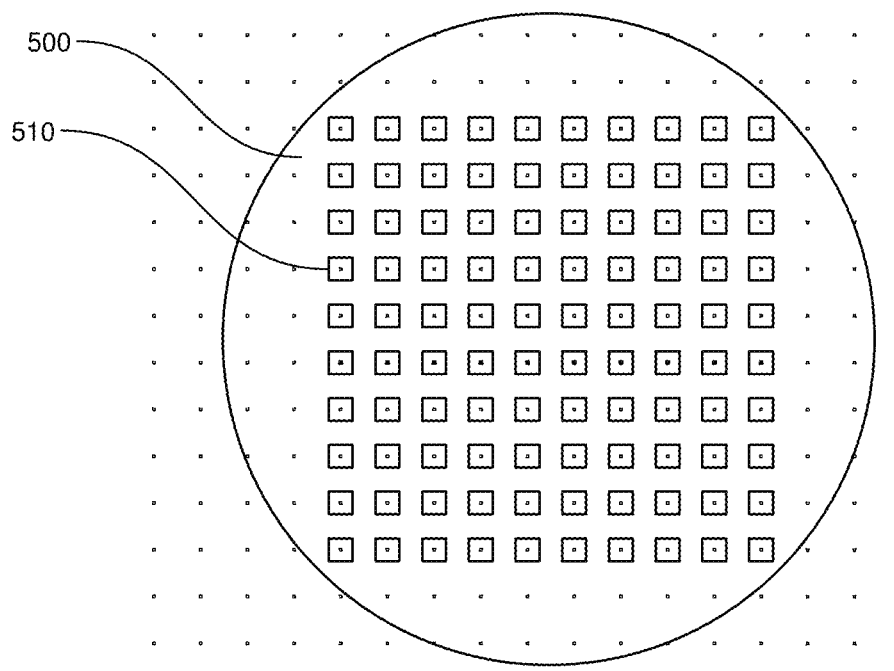
FIG. 5 shows an array-like arrangement of light sources and associated optical elements on a semiconductor wafer.
Figure 6:
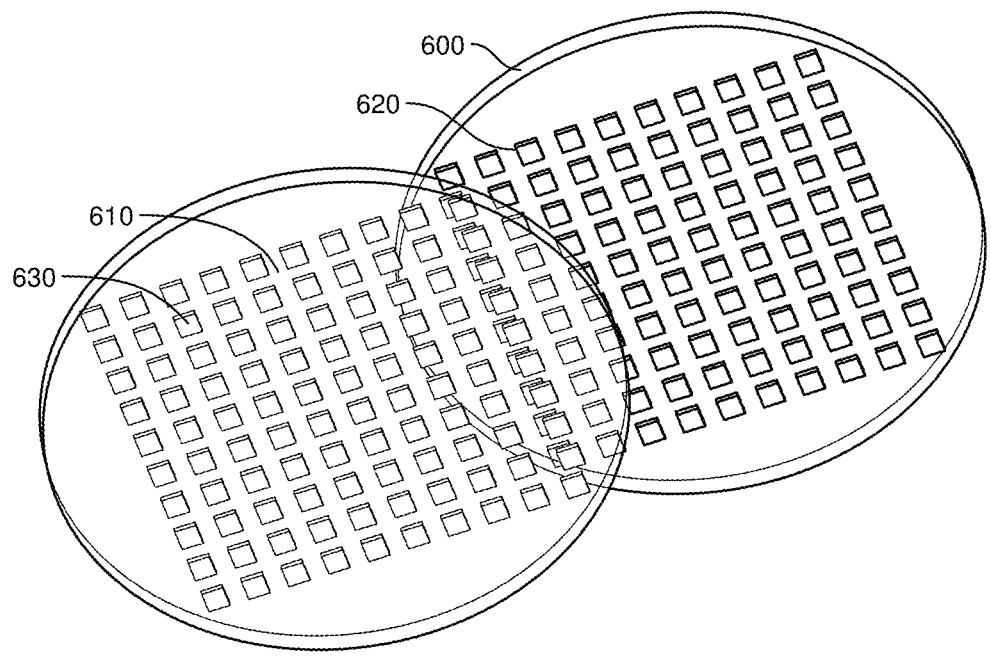
FIG. 6 illustrates fabrication of light sources and optical elements on separate semiconductor wafers.
Figure 22:
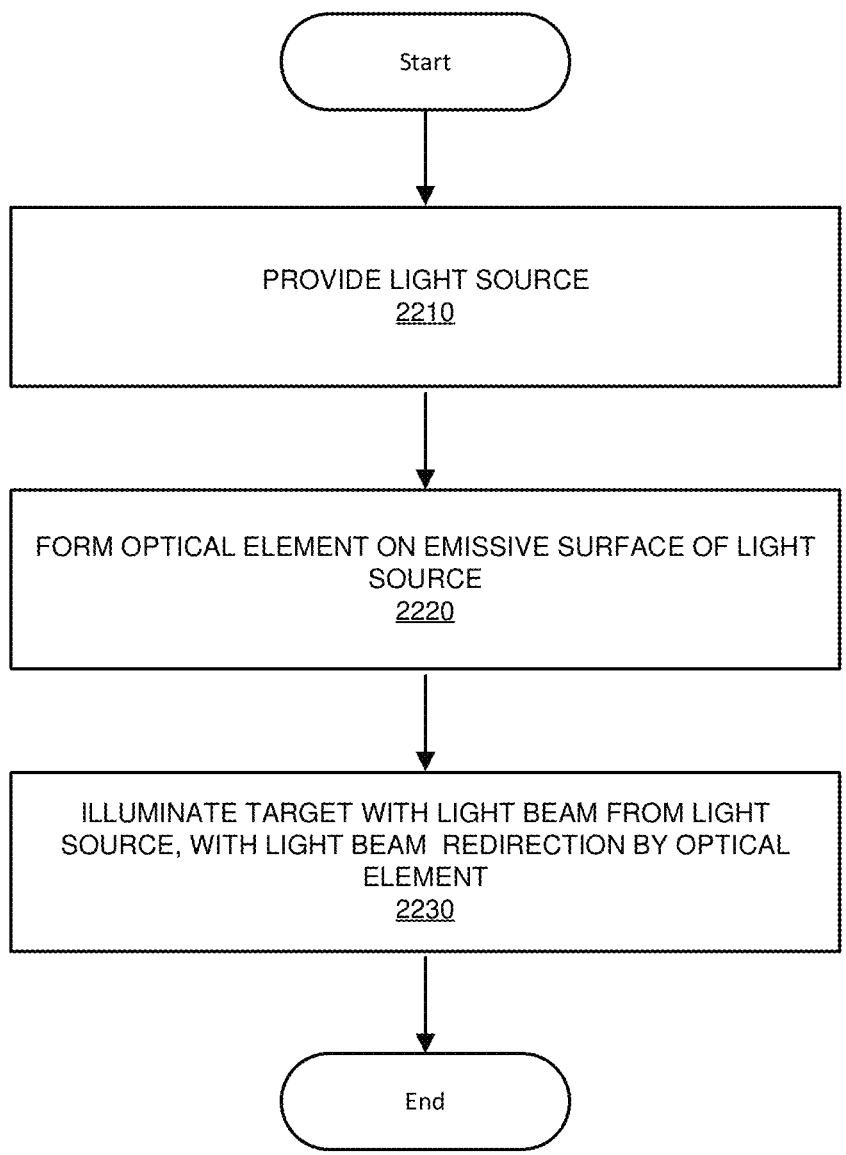
FIG. 22 shows an example method.
Figure 23:
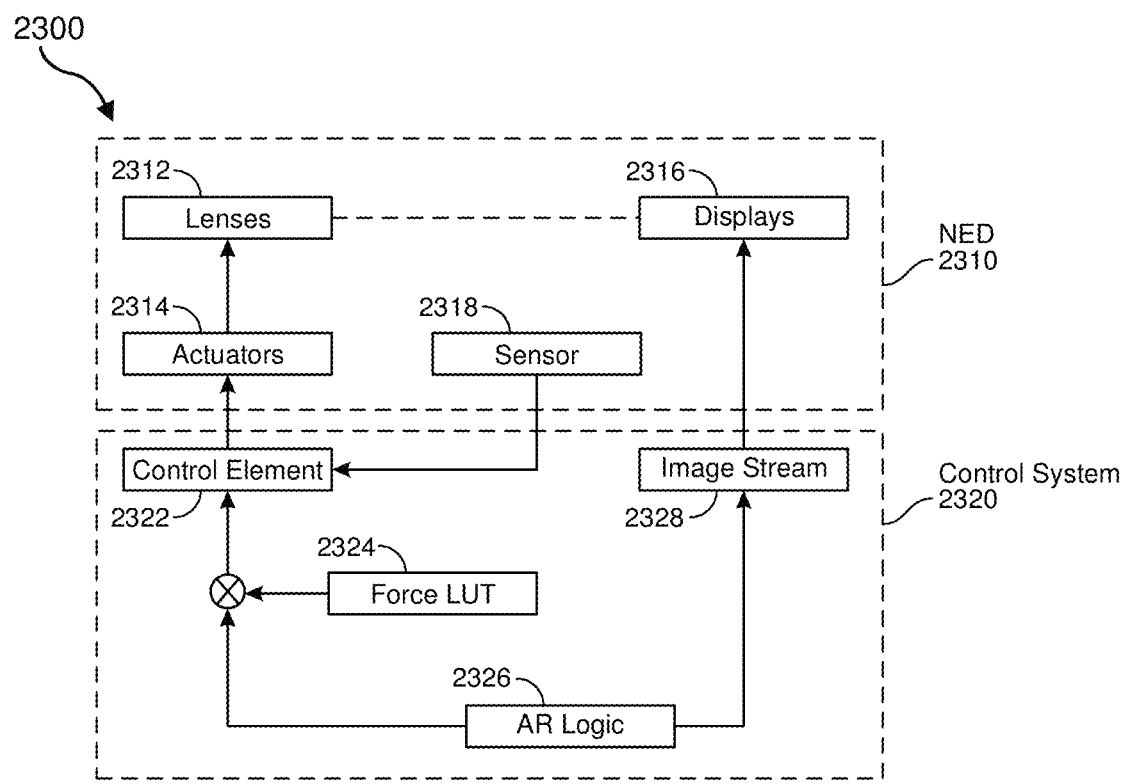
FIG. 23 shows an example control system that may be used in exemplary devices according to some embodiments.
Figure 24:
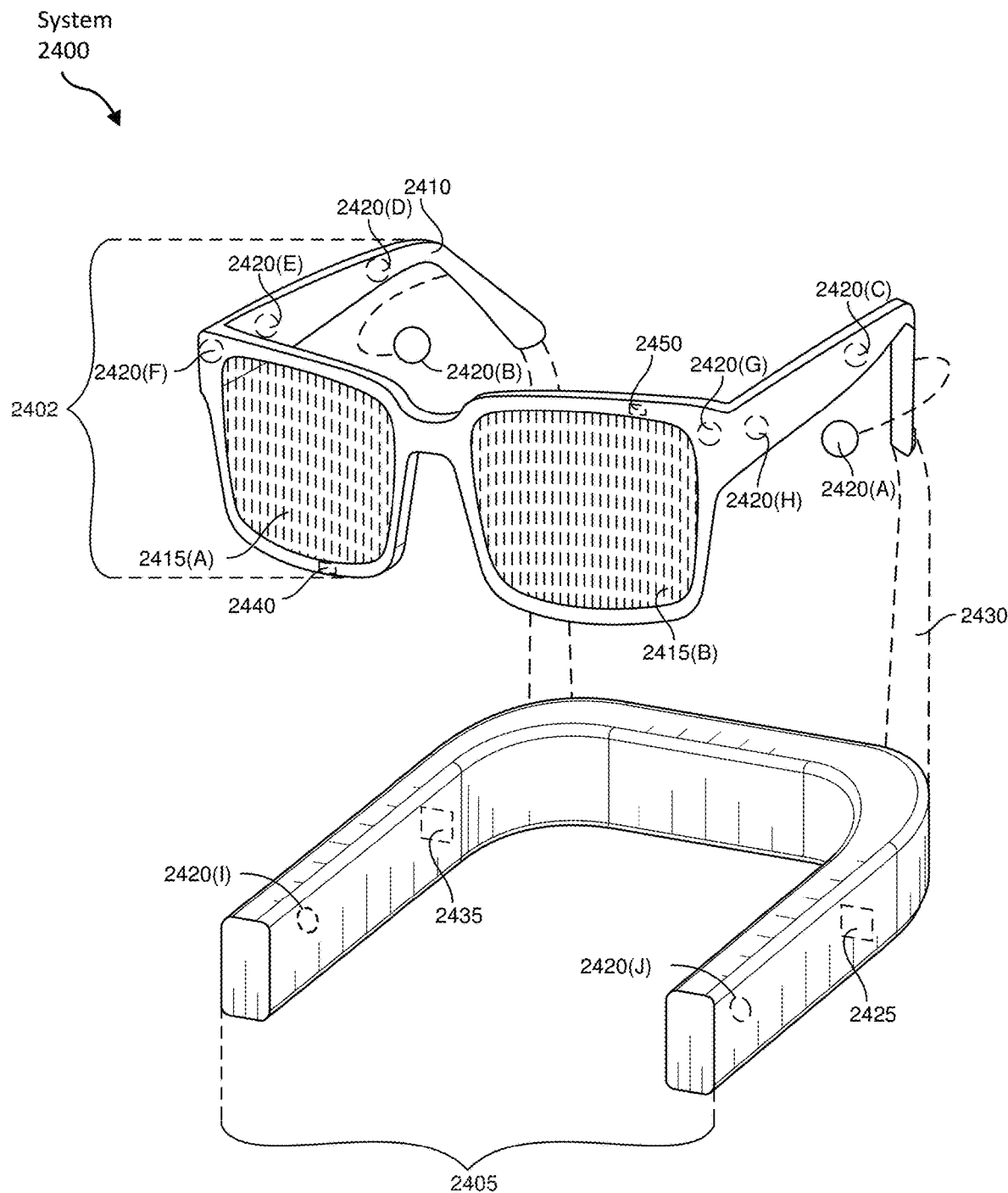
FIG. 24 is an illustration of exemplary augmented-reality glasses that may be used in connection with embodiments of this disclosure.
Figure 25:
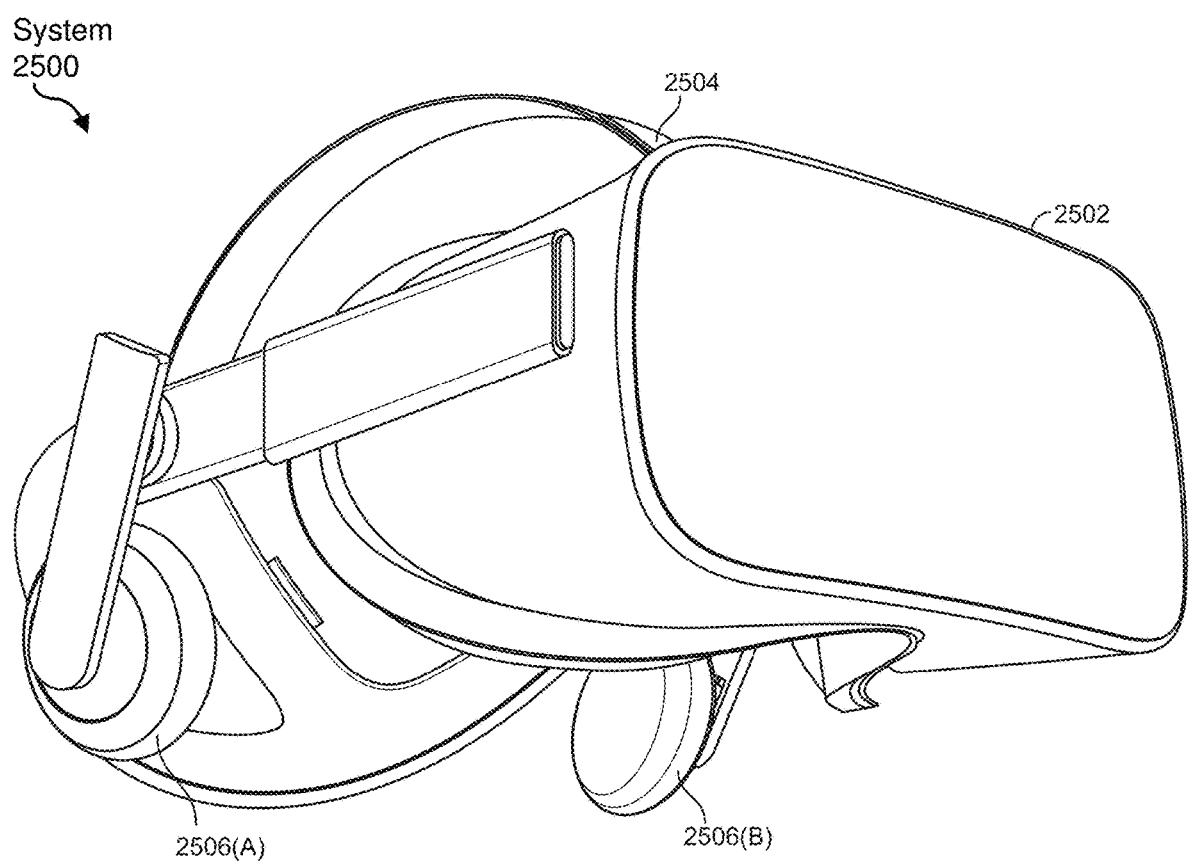
FIG. 25 is an illustration of an exemplary virtual-reality headset that may be used in connection with embodiments of this disclosure.
Figure 26:
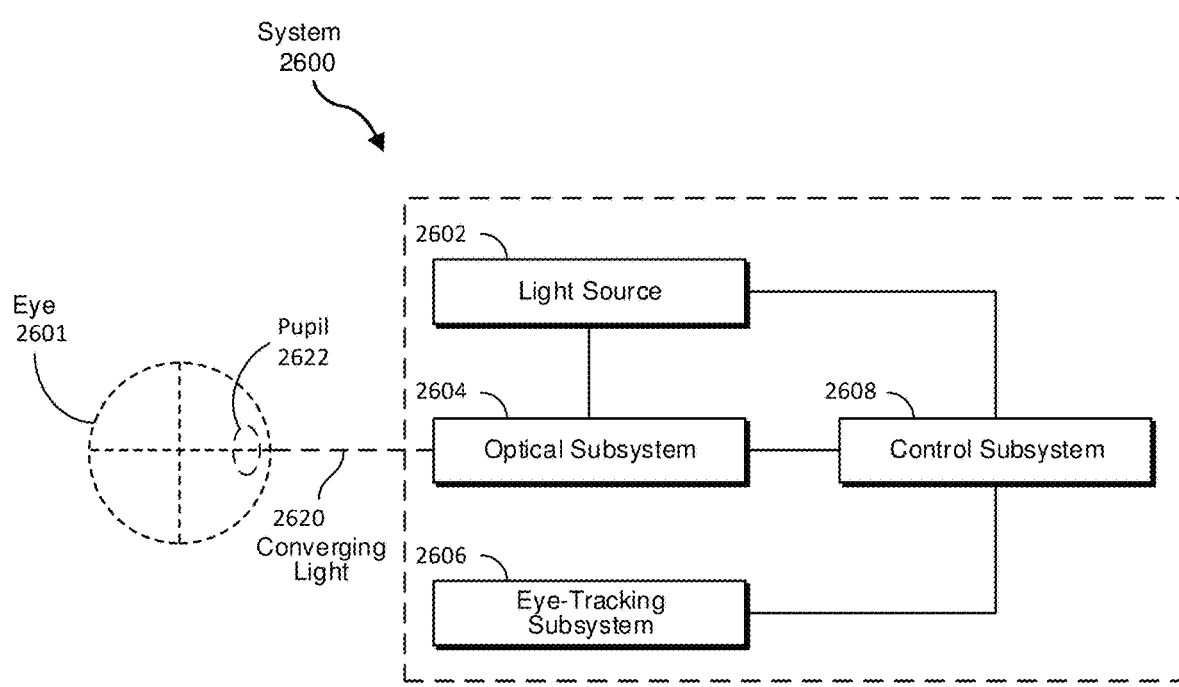
FIG. 26 an illustration of an exemplary device that incorporates an eye-tracking subsystem capable of tracking a user's eye(s).
Figure 27A:
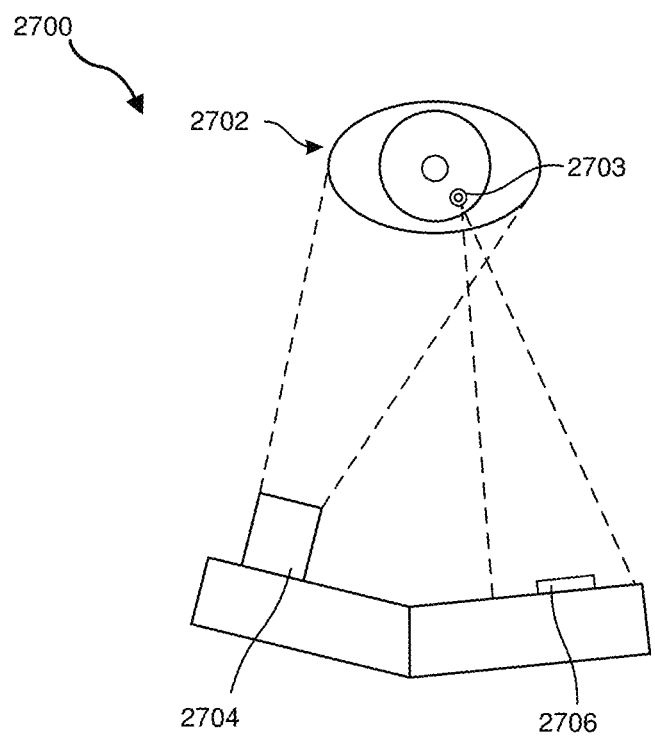
FIGS. 27A-27B show more detailed illustrations of various aspects of the eye-tracking subsystem illustrated in FIG. 26.
Figure 27B:
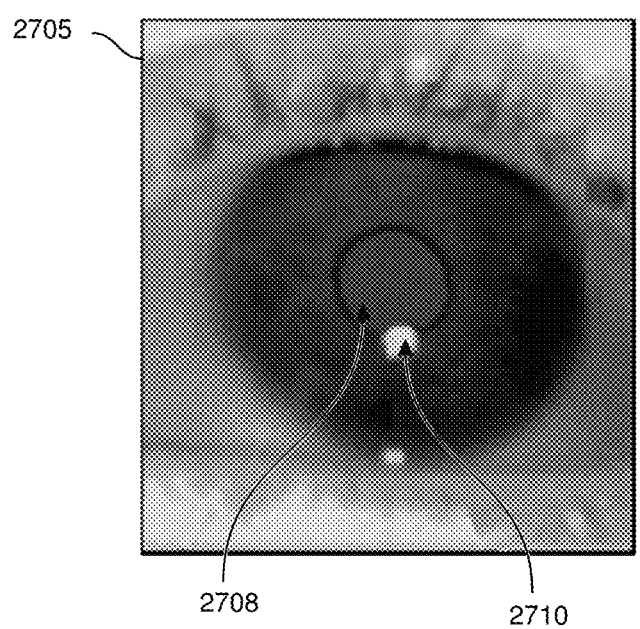

The following will provide, with reference to FIGS. 1-27B, detailed descriptions of example devices, methods, and the like. FIG. 1 is a schematic of a device including a light source and an optical element, and FIGS. 2A-2F illustrate optical elements with various exit surface configurations. FIGS. 3A-3B illustrate illumination uniformity of a target. FIGS. 4A-4G illustrate fabrication of a light source integrated with an optical element. FIG. 5 shows an arrangement of light sources and associated optical elements on a semiconductor wafer, and FIG. 6 illustrates the fabrication of light sources and optical elements using separate semiconductor wafers. FIGS. 7A-13C illustrate example devices including a light source, and an optical element, and illumination of a target using such as device. FIGS. 14-21 illustrate approaches to beam shaping (e.g., of a laser light source) using an optical element that includes a metamaterial layer. FIG. 22 shows an example method of fabricating a device. FIG. 23 shows an example control system that may be used in exemplary devices according to some embodiments. FIGS. 24 and 25 illustrate exemplary augmented-reality glasses and virtual-reality headsets that may be used in connection with embodiments of this disclosure. FIGS. 26 and 27A-27B illustrate an exemplary device that includes eye-tracking.

Features from any of the embodiments described herein may be used in combination with one another in accordance with the general principles described herein. These and other embodiments, features, and advantages will be more fully understood upon reading the following detailed description.

In some examples, a device may include one or more light sources, such as a light-emitting diode (LED) or laser, and may include one or more quantum wells, quantum dots, 2D materials, or any other material providing an optical transition. Example light sources may emit light having a wavelength within the wavelength range of 400 nm-1600 nm. An example light source may also emit light within an emission cone of less than 140 degrees.

In some examples, light is emitted through an aperture that is located on one of the surfaces of the light source. A light source may have one or more apertures.

In some examples, a light source may be fabricated using one or more semiconductor processes, and may be fabricated on a wafer. A wafer supporting one or more light sources may be termed an emitter wafer. An example light source may be fabricated on the emitter wafer using one or more of the following processes: doping, epitaxial growth, oxidation, etching, lithography, exfoliation, and/or any other semiconductor process.

Light emitted by the light source may propagate through an optical element. The optical element may be located on, adjacent, substantially adjacent, or proximate of the light source. For example, the optical element may have a surface that is less than 250 microns away from a surface of the light source, such as the emission surface. In some examples, the optical element may be located directly in contact with a light source surface.

In some examples, an optical element may include a material (e.g., a high-index material), such as a semiconductor or a dielectric material. In some examples, the optical element may include a material that has a refractive index (e.g., at an emission wavelength of the light source) that is at least approximately 2, and in some examples the refractive index may be at least approximately 3. An example material may have an energy bandgap that is larger than the photon energies of light emitted by the light source. Example materials include arsenide semiconductors (e.g., GaAs, AlAs, $Al_xGa_{1-x}As$), phosphide semiconductors (e.g., GaP, $In_xGa_{1-x}P$), nitride semiconductors (e.g., GaN, InN, AlN), oxides (e.g., a titanium oxide such as $TiO_2$), other III-V semiconductors, or other II-VI materials.

In some examples, the optical element may have a multi-faceted 3-dimensional structure. The size (exterior dimensions) of the optical element may be less than 1 mm×1 mm×1 mm, such as less than 300×300×300 microns, and in some examples may be less than 250×250×250 microns.

In some examples, light propagates through a minimum of two facets of the optical element. A facet may also be referred to as a surface. Light may be received by the optical element through a light entry surface, which may also be referred to as the entry surface. One of the facets of the optical element, such as the entry surface, may be generally flat and parallel to the emissive surface of the light source, for example, parallel to the plane of the aperture through which light is emitted by the light source. The light may exit the optical element through a light exit surface, which may also be referred to as an exit surface. One or more of the facets of the optical element, such as an exit surface, may have a surface profile that may include spherical, aspherical, freeform, anamorphic, generally convex, or generally concave surfaces, or some combination thereof.

In some examples, the refractive index of the optical element might vary as a function of position within the lens. For example, the optical element may include a gradient index (GRIN) portion. In some examples, one or more of the facets of the optical element have a surface structure that can be smooth. In some examples, one or more of the facets of the optical element have a surface structure that can be rough. For example, a surface may act as a diffuser. In some examples, the scale of the surface roughness may be less than the wavelength of light, for example, one or more (e.g., several) orders of magnitude smaller than the wavelength of light. In some examples, one or more of the facets of the optical element have a surface structure that has controlled amounts of periodic or aperiodic perturbations, for example, whose periodicity is of the scale of the wavelength of light or smaller. An optical element may have a surface structure that provides diffractive optics (e.g., a grating structure), or may include meta-structures, holographic optical elements, or polarization volume gratings or holograms.

In some examples, one or more of the surfaces (that may also be referred to as facets) of the optical element may have a surface structure, and the surface structure may include predetermined amounts of periodic or aperiodic perturbations. In some examples, a surface structure may include perturbations having a periodicity larger than the scale of the wavelength of light, and may include a surface structure such as a micro-lens array. In some examples, one or more of the surfaces of the optical element may support a dielectric or metallic coating, for example, a coating configured to reflect light towards another surface, such as an exit surface through which the light leaves the optical element. In some examples, one or more surfaces of the optical element may have a surface structure with periodic or aperiodic perturbations to reduce visible glints. A surface structure may be created either during fabrication, for example, as a result of patterned etching, or in a post-fabrication etching or deposition process.

In some examples, a surface (e.g., one or more surfaces) of the optical element may have an anti-reflective coating, for example, to reduce reflection at a particular facet. An example antireflective coating may have low reflectivity for the range of the source wavelengths, or for visible light, or for both.

In some examples, an example coating may also include scattering elements (e.g., microparticles, nanoparticle, or other particles). In some examples, one or more of the facets of the optical element may reflect light due to, for example, total internal reflection based on the angle of incidence of the beam or due to a reflective coating such as a metal film. In some examples, a surface may have a coating including one or more emissive components, such as one or more of quantum dots, phosphors, fluorophores, non-linear optical materials, lasing materials, or other photoluminescent materials. In some examples, a coating may change the color of the light, for example, by absorbing light at one wavelength and emitting light at a second wavelength, or by modifying the wavelength of a light beam using a nonlinear optical effect.

In some examples, a light source may be fabricated on an emitter wafer. The emitter wafer may include the substrate layer on which the light source is fabricated, and may include a semiconductor such as gallium nitride (GaN), gallium arsenide (GaAs), aluminum gallium arsenide (AlGaAs), other semiconductor, or other dielectric material (e.g., sapphire, or other oxide), or other suitable material. The term emitter wafer may, in some examples, refer to the light sources while still on a wafer, after fabrication. An emitter wafer may also include one or more of the following: passivation layers or other features (e.g., $SiO_2$), metallic bond pads (e.g., Au, Ag, Cu, other metals), quantum wells, distributed Bragg gratings, dielectric coatings, and/or a backplane such as glass, silicon, or metal.

In some examples, the optical element may be fabricated directly on the emitter wafer, for example, using one or more semiconductor processes, such as chemical vapor deposition (CVD), physical vapor deposition (PVD), lithography, or etching (e.g., dry or wet etching).

In some examples, the optical element may be fabricated on a different substrate (e.g., a semiconductor or glass carrier wafer) from the emitter wafer. The optical element may be fabricated using one or more process such as spatially modulated UV, optical, or e-beam lithographic exposure, with masks, using direct laser writing, etching (e.g., dry or wet etching), or another lithography process, or with a direct machine process such as diamond machining, focused ion beam milling, or laser ablation. In some examples, the size of a wafer may be less than 1 inch in diameter.

An optical element, substrate (including, e.g., a wafer), and/or a light source may include a semiconductor material. The semiconductor material (e.g., used for the optical element) may be an arsenide semiconductor (e.g., GaAs, AlGaAs, etc.), a phosphide semiconductor (e.g., GaP), or other III-V semiconductor, or a II-VI semiconductor (e.g., a selenide, sulfide, or other chalcogenide material).

Example optical elements fabricated on a semiconductor wafer may be diced using a laser dicer, dicing saw, or similar process, into individual units. The individual units can be deposited and positioned on top of the surface of an individual light source using a pick and place process. The individual units can be bonded to the light source surface using an organic adhesive, such as epoxy or UV curable resin. In some examples, the individual units can be bonded to the light source surface without adhesives, using an approach such as direct wafer bonding, surface activated bonding, or plasma activated bonding.

In some examples, the optical elements may be patterned on an optical element wafer with the same spacing and periodicity as the light sources on the emitter wafer. The optical element wafer may be picked and placed and positioned to some tolerance based on design on top of the emitter wafer, for example, through the use of fiducials. The optical element wafer may then be bonded to the emitter wafer, for example, using organic adhesives such as an epoxy or a UV curable resin. In some examples, the optical element wafer may be bonded to the emitter wafer without adhesives, for example, using an approach such as direct wafer bonding, surface activated bonding, or plasma activated bonding. After bonding the wafers together, the individual light source/optical element combination units may be diced, for example, using a laser dicer or dicing saw. In some examples, a sacrificial layer may be deposited on top of the emitter wafer, and may be planarized, for example, with a process such as chemical-mechanical polishing.

In some examples, the optical element may include a semiconductor material, such as a semiconductor layer or other semiconductor element, grown directly on the top surface of the emitter wafer. A semiconductor material may be deposited by any appropriate process, for example, by CVD, PVD, or another deposition technique.

In some examples, an optical element may be fabricated from a semiconductor layer using one or more semiconductor fabrication processes, such as lithography or etching (e.g., dry or wet etching). Similar approaches may be used for fabricating metamaterial layers, for example, as part of an optical element.

Examples include devices, systems, and processes related to optical elements. In some examples, a device includes a light source, such as LED or laser. The light source may have a cross-section that is smaller than 300×300×300 microns in size. Additional examples include a light source and an additional optical element, such as a beam-shaping optical element.

In some examples, an optical element is used to modify light emission from a light source, such as an LED or a laser.

An optical element may include a structured or unstructured material that is used to interact with light. An optical element may include, but is not limited to, refractive optics, reflective optics, dispersive optics, polarization optics, diffractive optics, and gradient index materials.

FIG. 1 shows an example device generally at 100, including a light source 110, configured to emit light from an emissive surface at 115 that is directed into an optical element 120 (e.g., a beam-shaping optic). The optical element 120 may be surrounded by air, or, in some examples, may be encapsulated in an optical medium, such as a glass, plastic, or other surrounding medium (not shown). The optical element 120 may have a freeform surface 140 configured to redirect (deflect) and shape the internal light beam 130 within the optical element to form the light beam 150. The light beam 150 may be used to illuminate a target (not shown), such as an eye.

FIGS. 2A-2F show example optical elements that may be used for beam-shaping and/or redirection of a light beam. The lines extending from light sources and entering respective optical elements represent light rays. Light rays within an optical element are shown as slightly thinner lines.

Figure 2A:
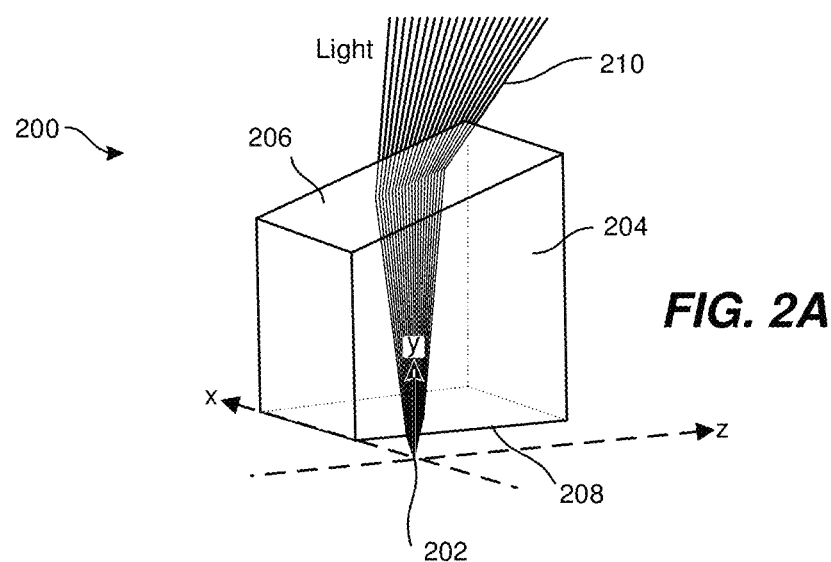
FIGS. 2A-2F illustrate optical elements with various exit surface configurations.
Figure 3A:
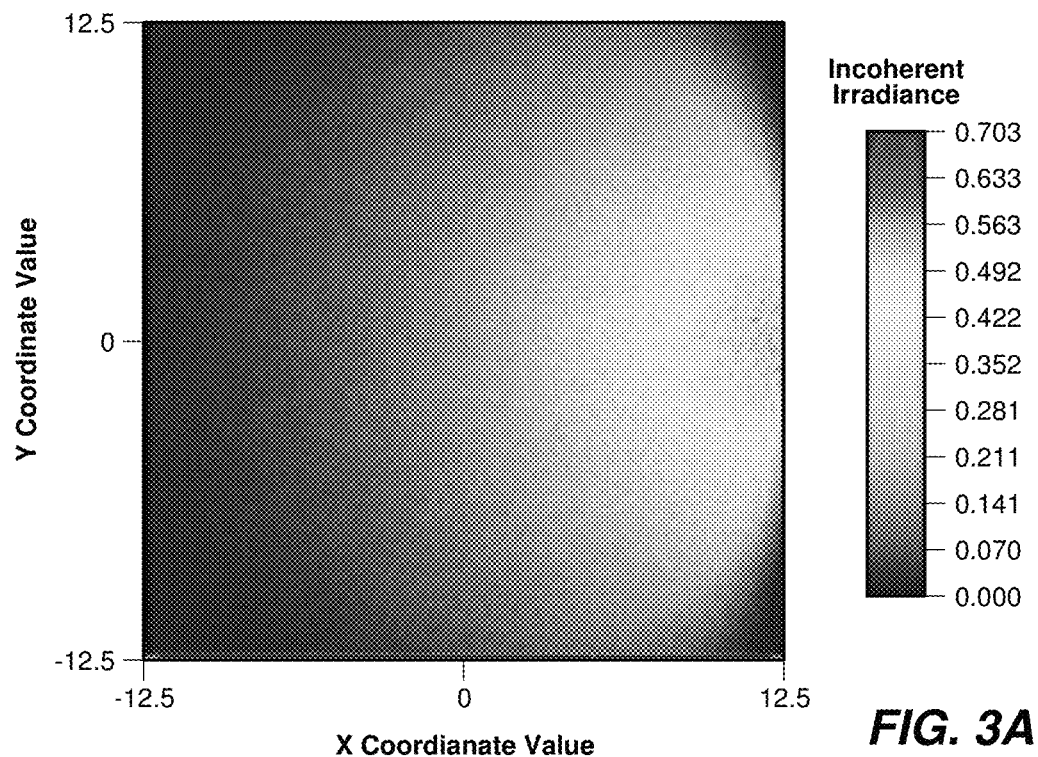
FIGS. 3A-3B qualitatively illustrate the illumination uniformity of a target.
Figure 3B:
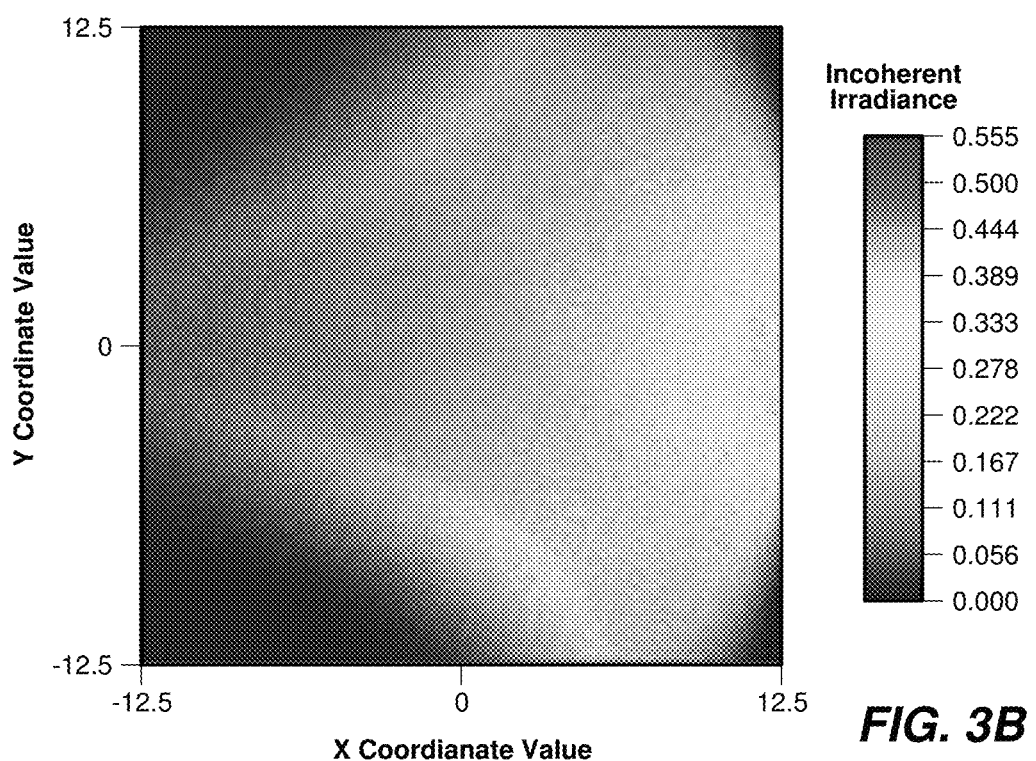

FIG. 2A shows a device 200 including a light source 202 and an optical element 204. The optical element 204 may have an planar entry surface 208, through which light enters the optical element, and an a tilted (or oblique, or "prismatic") exit surface 206, through which the light beam 210 exits the optical element. In this example, the optical element may be termed a prismatic optical element, or a refractive prism.

Figure 2B:
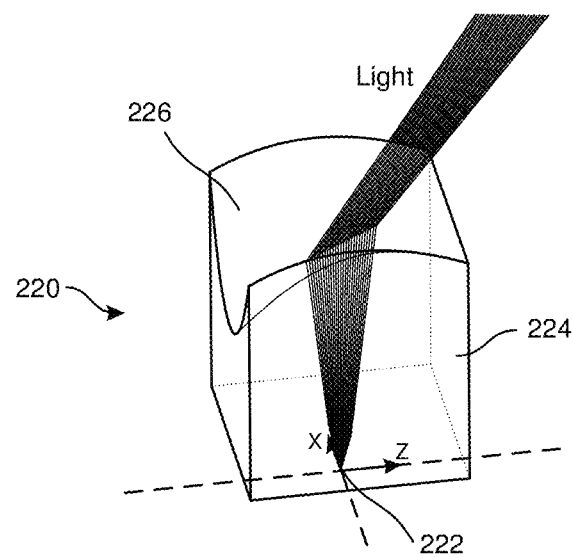

FIG. 2B shows an example device 220 including a light source 222 and an optical element 224. The optical element may have a planar entry surface through which light from the light source enters the optical element, similar to that shown in FIG. 2A. The optical element may have a freeform exit surface 226 through which the light beam (labeled "Light") leaves the optical element. The optical element may be referred to as a freeform optical element, or a freeform lens.

Figure 2C:
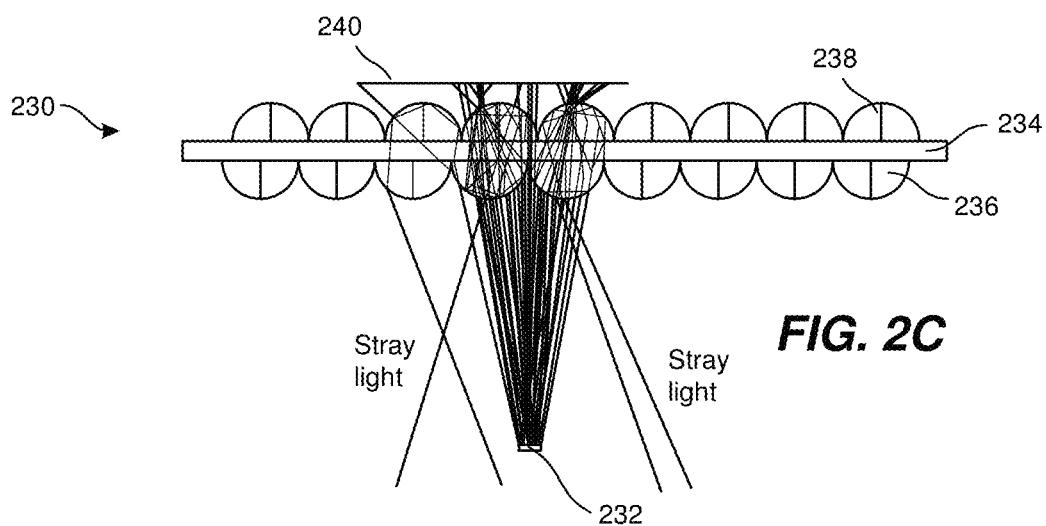

FIG. 2C shows an example device 230 including a light source 232 and an optical element 234. The optical element may include a microlens array pair-based Kohler diffuser. The optical element may include microlens elements, such as microlens element 236 within the entry surface, and the microlens element 238 on the exit surface. The microlens elements may be formed on opposite sides of a generally transparent sheet. Light exiting the optical element is shown incident on illuminated surface 240, but targets in other locations may be illuminated.

Figure 2D:
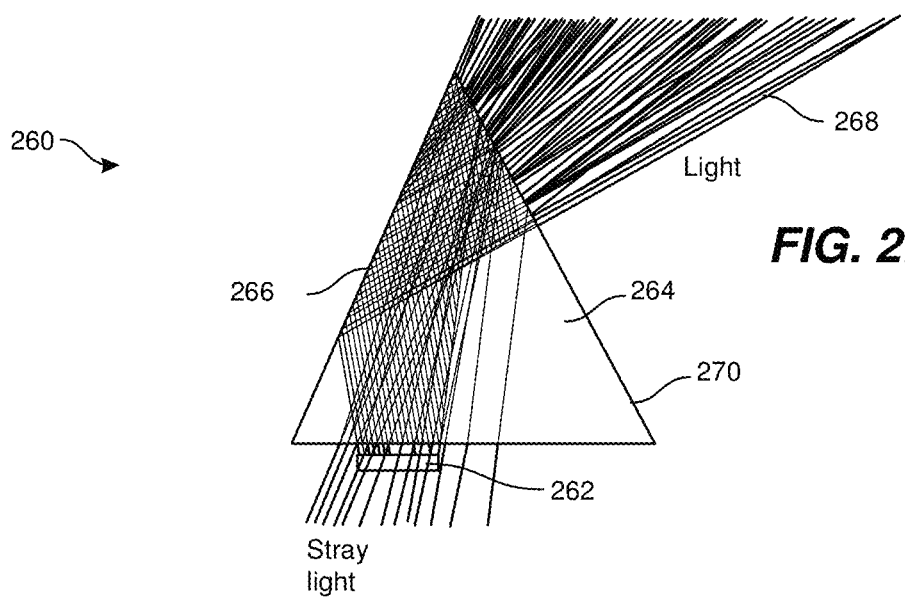

FIG. 2D shows an example device 260 including a light source 262 and an optical element 264. Light enters the optical element, is internally reflected from surface 266, and leaves the optical element through exit surface 270, forming beam 268. The optical element allows illumination of a target that is laterally displaced from the light source. However, internal reflection from exit surface 270 may lead to stray light rays.

Figure 2E:
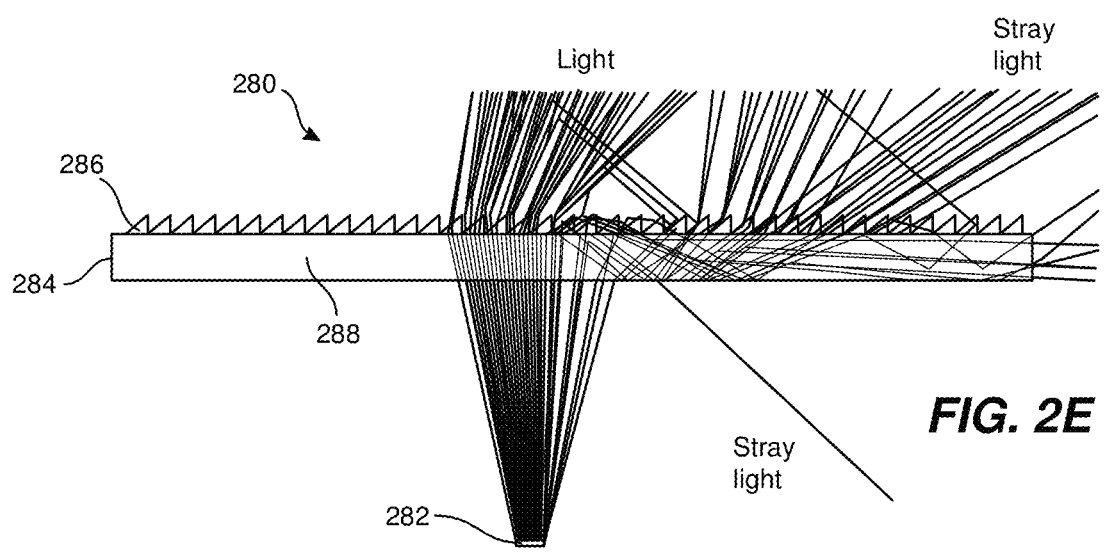

FIG. 2E shows an example device 280 including a light source 282 and an optical element 284. In this example, the optical element 284 includes a turning film, having a plurality of prism elements 286 located on a planar substrate 288. The planar substrate 288 provides a planar entry surface for light to enter the optical element, and the light may then be redirected by oblique surfaces of the prism elements 286. This configuration allows illumination of a laterally displaced target (not shown). However, stray light may illuminate regions outside of the desired target area, for example, due to multiple reflections of light rays (shown as solid lines) from interior surfaces of the prism elements 286.

Figure 2F:
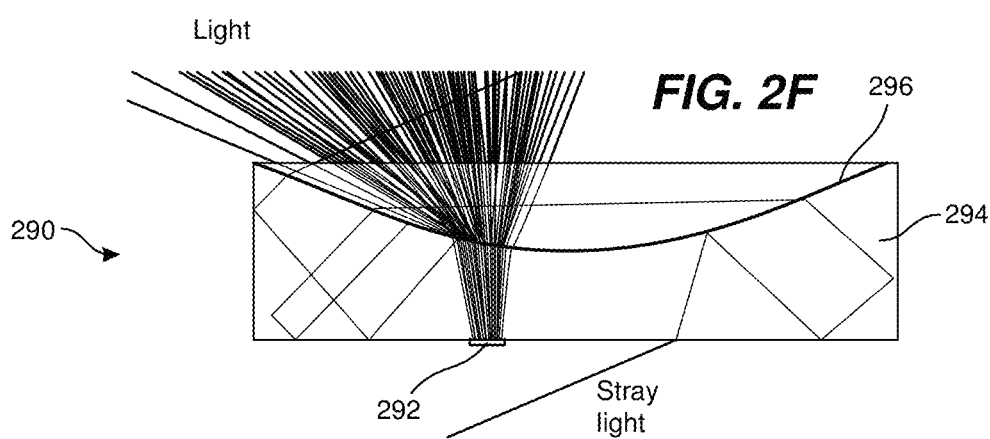

FIG. 2F shows an example device 290 including a light source 292 and an optical element 294. In this example, the optical element may include a decentered plano-concave lens. The generally concave surface 296 may be a generally spheric surface, or an aspheric surface (such as a freeform surface).

In some examples, an encapsulant layer (discussed further below, in which the optical element may be, at least in part, embedded) may include a decentered generally concave surface, such as that shown at 296. A decentered concave surface may have an optical center (or optical axis) laterally displaced from the light source.

In some examples, an optical element may be embedded in an encapsulant layer having a decentered concave surface, for example, similar to that shown in FIG. 2F. In this context, the term decentered may refer to a light source and/or optical element not located on the optic axis of the concave surface.

FIGS. 3A and 3B show example qualitative light distributions created in the far field by different types of beam-shaping optical elements. FIG. 3A may represent illumination intensity for a freeform surface configured to illuminate the eye from a lateral offset of 18 mm. FIG. 3B may represent illumination intensity for a freeform surface configured to illuminate the eye from a lateral offset of 18 mm. Freeform optical element configurations are discussed further below.

Figure 4A:
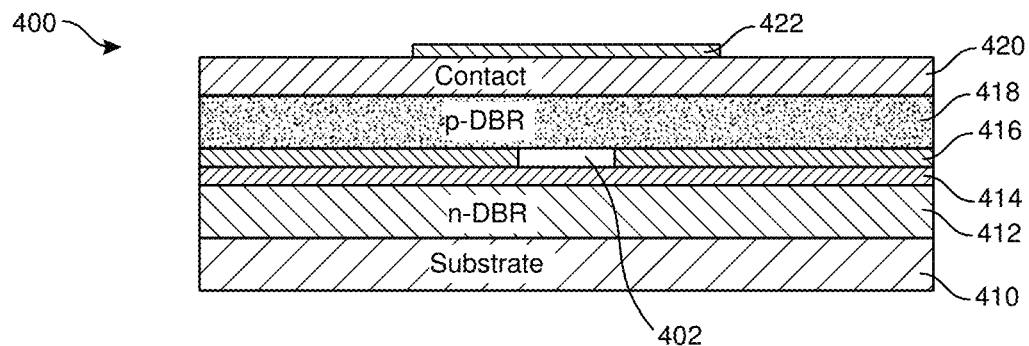
FIGS. 4A-4G illustrate fabrication of a light source integrated with an optical element.
Figure 4B:
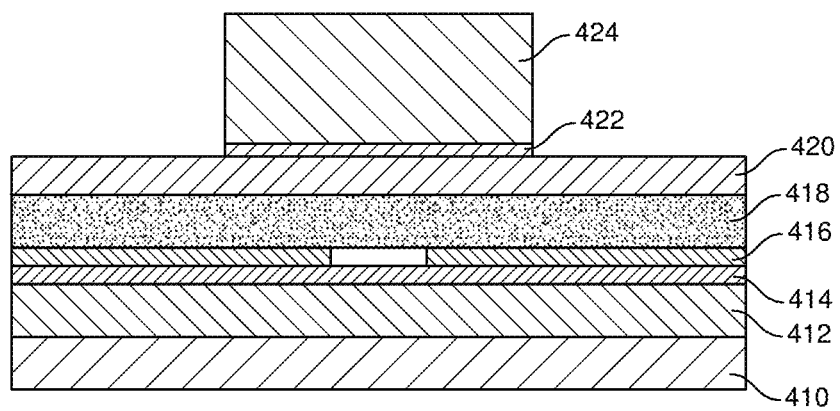
Figure 4C:
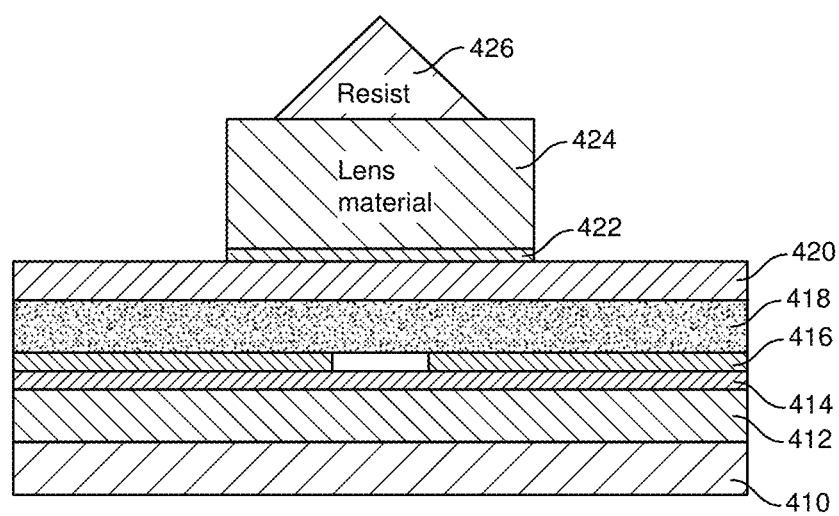
Figure 4D:
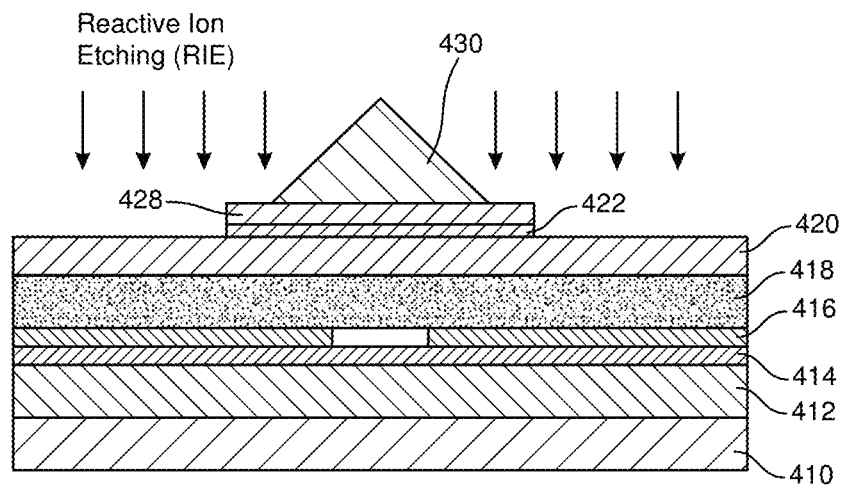
Figure 4E:
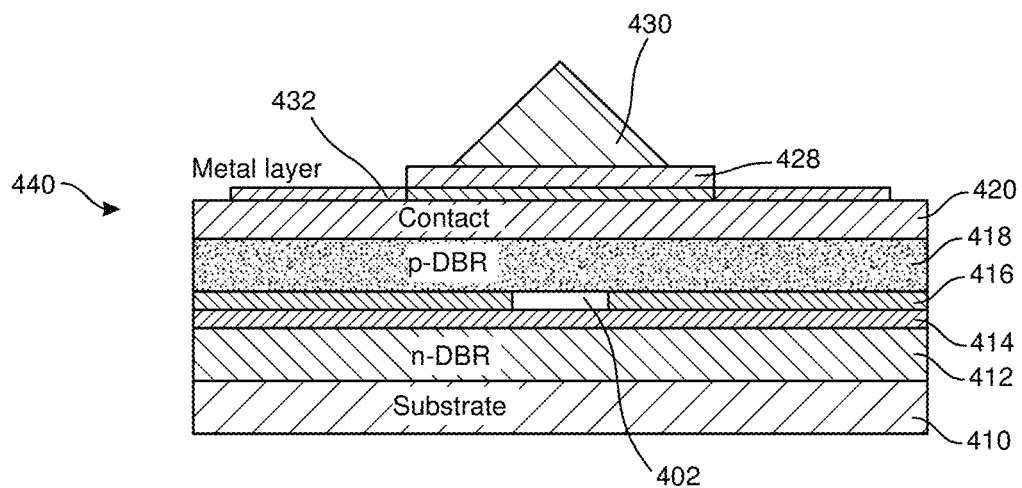
Figure 4F:
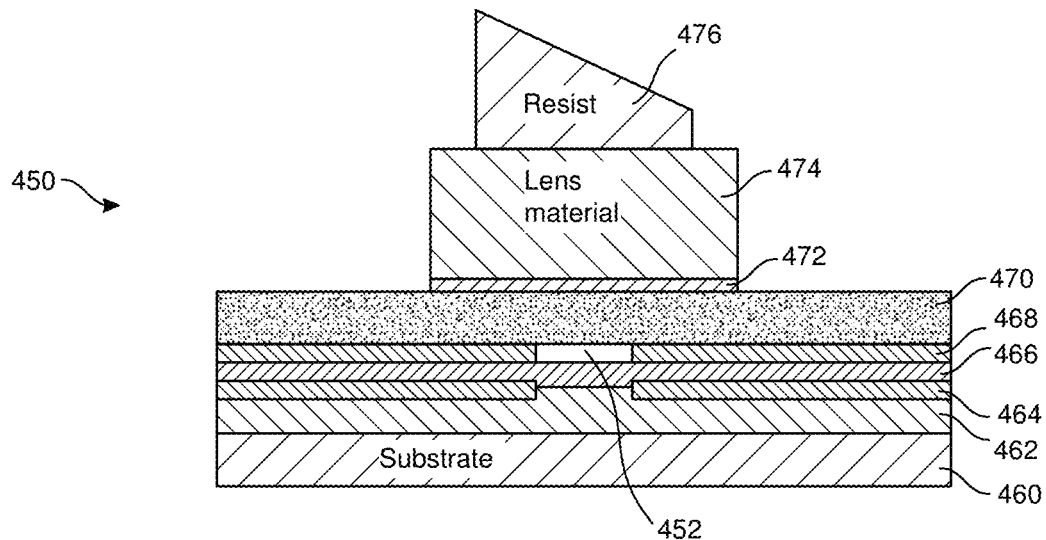
Figure 4G:
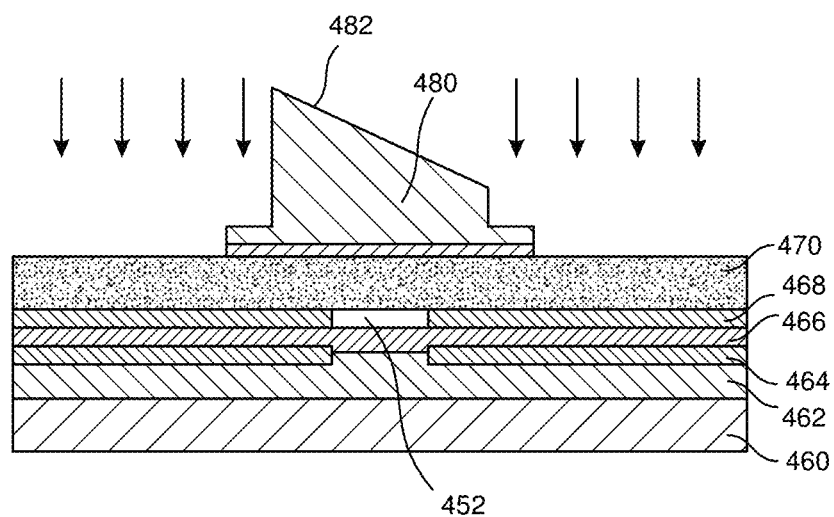

FIGS. 4A-4G illustrate example methods of fabricating an optical element, such as a prism structure, on top of light source. FIGS. 4A-4E illustrate fabrication of a prismatic optical element on top of a light source. In this example, the light source may be a vertical-cavity surface-emitting laser (VCSEL). The optical element may include a semiconductor, such as an arsenide semiconductor, such as aluminum gallium arsenide (AlGaAs). FIGS. 4F-4G illustrate fabrication of another example optical element.

FIG. 4A shows a light source at 400, including substrate 410, n-doped distributed Bragg reflector (n-DBR) 412, optional confinement layer 414, oxide layer 416, quantum well structure 402, p-doped distributed Bragg reflector (p-DBR) 418, and contact layer 420. A passivation layer 422 may be formed on the contact layer. There may optionally be confinement layers formed on each side of the quantum well structure. The quantum well structure may include a stack of alternating barrier layer and quantum well structures, and may include GaAs quantum wells and AlGaAs barrier layers. The oxide layer 416 may help define the lateral extent of the quantum well structure. The emissive surface of the light source may be located within the top surface (as illustrated) of the passivation layer 422.

After the distributed Bragg reflectors 412 and 418 (or other similar grating structures) are fabricated, and the passivation layer 422 is deposited, a layer (e.g., a layer including a high-index material such as GaAs, or AlGasAs) may be deposited on top of the passivation layer, for example, using epitaxy or another method.

FIG. 4B shows the light source 400 (as discussed above in relation to FIG. 4A) having a layer 424 (e.g., a high-index layer) formed on the passivation layer 422.

Subsequently, a resist layer (e.g., a photoresist layer) may be deposited on the layer 424, for example, using spin-coating or any other suitable method. Using a lithographic method, the resist layer may be shaped to a desired 3-dimensional profile, which may be termed the shape of the resist layer.

FIG. 4C shows a shaped resist layer 426 formed on the layer 424. In this example, the resist layer has a generally prismatic shape. However, other shapes may be provided, as desired. For example, an arrangement of resist droplets may be used to provide microlens elements.

The shape of the resist layer 426 may then be transferred into the layer (e.g., a high-index layer that may include a semiconductor), for example, by etching. Any appropriate etching method may be used.

FIG. 4D illustrates a reactive ion etching (RIE) process which transfers the shape of the resist layer (426 in FIG. 4C) into the layer (424 in FIG. 4C) to form an optical element 430, in the form of a shaped layer, associated with the light source 400 (of FIG. 4A). The optical element 430 includes an upper prismatic portion, having the shape of the resist layer before etching, and a planar un-etched portion, which may be termed an optical layer, shown at 428. The latter is optional, and the thickness of the optical element may be any suitable value. In some examples, the fabrication process may be modified to include a metamaterial layer between the light source and the optical element, or within the optical element (e.g., between an optical layer and a prismatic element).

The bond-pad contacts may then be metalized. FIG. 4E shows metal layers 432 formed on the contact layer 420. In this example, the optical element 430 is integrated with the light source into a monolithic device 440, which may be termed a light source module.

The process approach described above in relation to FIGS. 4A-4E may be modified to form other shapes of optical elements.

FIG. 4F shows an alternative configuration showing formation of a differently shaped optical element on the surface of a light source 450. Similar to the light source 400 shown in FIG. 4A, the light source 450 may be a vertical cavity surface-emissive laser including a quantum well structure 452, substrate 460, n-DBR layer 462, oxide layers 464 and 468, optional confinement layer 464, p-DBR layer 470, and passivation layer 472. A layer 474 (e.g., a high-index layer, or other lens material) may be formed on the passivation layer 472. A shaped resist layer 476 may then be formed on the layer 474.

FIG. 4G shows etching of the device described above, for example, using reactive ion etching (RIE). The etching transfers the shape of the resist layer 476 into the layer 474, to form an optical element 480. The optical element may include material from the layer 474, may have a shaped based on the shape of the resist layer 476, and/or may include a shaped high-index layer. The optical element 480 may be formed directly on the emissive surface of the light source 450, and has an exit surface 482 through which a light beam from the light source may leave the optical element. The combination of a light source, and an optical element formed directly on the light source, may be termed a "light source module" or more concisely as a "module".

In this example, the optical element 480 has an tilted exit surface, that may also be termed an oblique exit surface or a prismatic exit surface. The optical element may be referred to as a prismatic optical element. In some examples, the optical element may have a curved exit surface, such as an aspheric or freeform surface. Curvature of the exit surface may be achieved using a variety of suitable resist patterns and etching processes. For example, the resist element may be formed with a curved surface that may then be transferred by an etching process into a surface of an optical element. In some examples, a prismatic exit surface, configured to provide beam redirections, may be combined with a metamaterial layer configured to provide additional beam shaping.

In some examples, a metamaterial layer may be included within the optical element 480. In some examples, a metamaterial layer may be formed on the surface of the light source, and the optical element may be formed on the metamaterial layer. In some examples, an optical layer (such as a high-index layer) may be formed on an emissive surface of the light source, a metamaterial layer may be formed on the optical layer, and a prismatic element (such as a wedged element, e.g., similar to element 480) may be formed on the metamaterial layer. Metamaterial layers are discussed in more detail below. In some examples, a structure (such as described below in relation to FIG. 18) may be formed on the light source.

FIG. 5 shows a schematic representation of an arrangement of light source modules 510, with each light source module including an optical element formed on a light source (e.g., formed directly onto an emissive surface of a light source), arranged as an array of light source modules 510 on a semiconductor wafer 500. After processing, individual light source modules, or arrays of light source modules, can be created, as desired, by dicing. The individual modules may include an optical element located on or proximate the emissive surface of a light source. The dot pattern represents an array of possible light source module locations, where the dots fall within the extent of the wafer 500.

FIG. 6 shows another example approach. In this example, light sources 620 may be processed on wafer 600, and optical elements 630 may be processed on a different (second) wafer 610. Both wafers can be aligned and bonded to each other such that each optical element is positioned at an appropriate location with respect to the emissive surface of a respective light source. For example, an optical element may be located so that the optical element receives light through an entry surface from a substantially adjacent light source, and so that light leaves the optical element through an exit surface. In some examples, an optical element may be bonded to a light source (or an associated structure) using an adhesive, such as a polymer or photopolymerizable adhesive, or other adhesive resin that may be cured with UV and/or heat. Alignment between light sources and respective optical elements may be facilitated using fiducial marks on one or both wafers. Appropriate lateral positioning tolerances may be determined by the photomasks used. Positional alignment normal to a wafer surface may be controlled using suitable spacers, as needed.

Figure 7A:
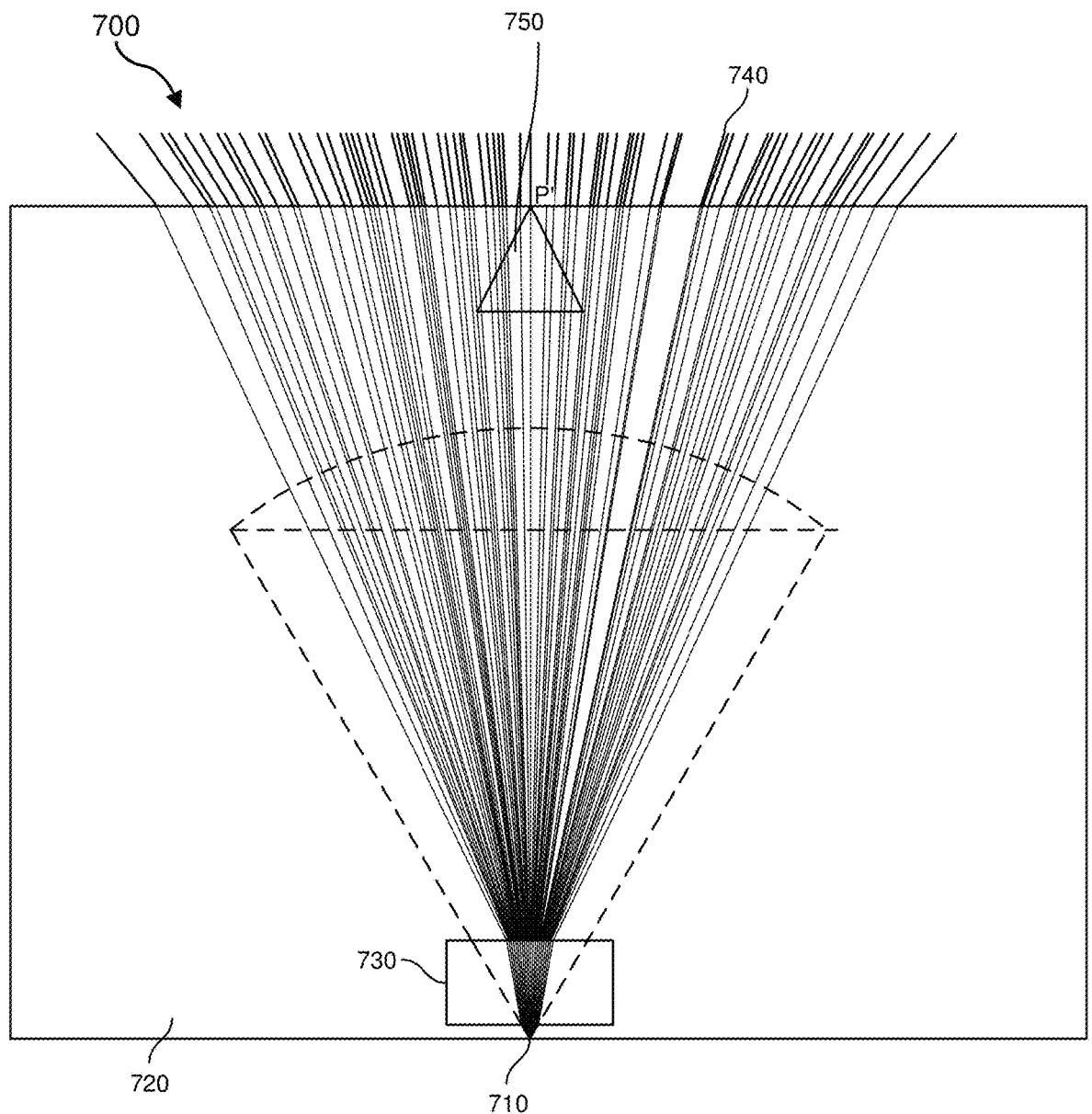
FIG. 7A shows a device including a light source, an optical element, and an encapsulant layer, and FIG. 7B qualitatively illustrates beam uniformity.

FIG. 7A is a schematic of a device 700 including a light source 710 (e.g., a light-emitting diode or a laser) that may be supported on a transparent substrate (not shown). Light from the light source 710 enters an optical element 730, which may include a high-index material, that is encapsulated in encapsulant layer 720. The light may pass through the encapsulant layer 720, forming a distribution of light rays 740 that are emitted into the environment outside of the encapsulant layer. An optional external element, such as prismatic structure 750, may be included to further modify the beam profile, for example, to reduce hot spots. The dashed lines may represent a cone within which light rays are emitted by the combination of the light source and the optical element.

In some examples, an encapsulant layer may include an optical medium in which the optical element is embedded. The encapsulant layer may have a curved exit surface, for example, a generally concave exit surface, from which light generated by one or more light sources exits the encapsulant layer to illuminate a target, such as the eye of a user of a wearable device (such as a head-mounted device, e.g., when the user is wearing the device).

Figure 7B:
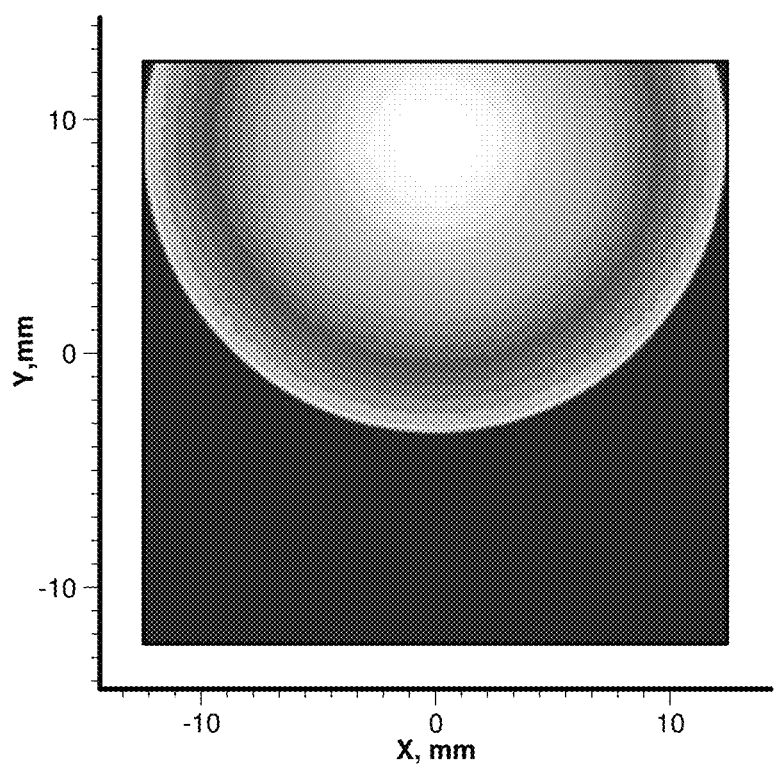

FIG. 7B shows an example beam profile for a light source embedded in an encapsulant layer (e.g., an intermediate refractive index medium), such as the light source discussed above in relation to FIG. 7A. In some examples, the light beam may leave the optical element through an exit surface and into the encapsulant layer. In some examples, the light beam may pass through the exit surface of the optical element, and into air.

Figure 8A:
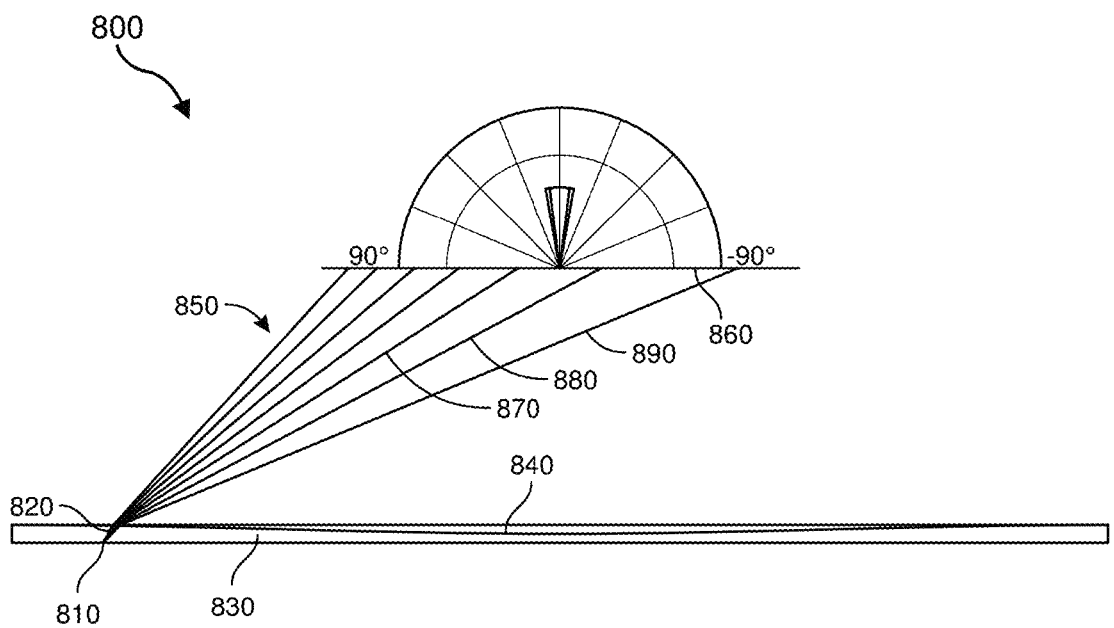
FIGS. 8A-8C and FIGS. 9A-9B show example devices including a light source and an optical element with a curved exit surface, and illumination of a target.
Figure 8B:
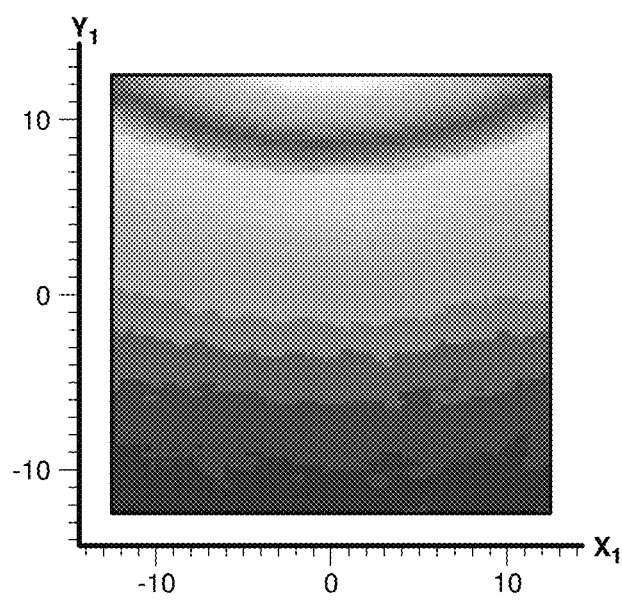
Figure 8C:
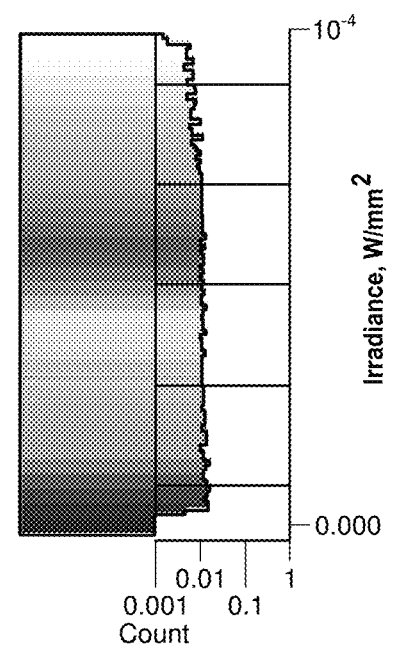

FIGS. 8A-8C show the illumination of a target using a light source in combination with an optical element having a planar lower surface and an oblique top surface (e.g., not parallel to the planar lower surface). The exit surface of the optical element may be termed a prismatic exit surface, and may resemble the optical element discussed above in relation to FIG. 2A. The lower surface of the optical element may be a beam entry surface through which a beam enters the optical element. The oblique exit surface may provide beam deviation, in which the direction of the beam may be changed by refraction, for example, at an interface between an optical element material and a relatively low index material of the encapsulant (or air). The optical element may have prism-like properties.

FIG. 8A shows a device 800 including a light source module 810 (e.g., a combination of a light source and an optical element). The light source may be configured to emit a light beam along the vertical direction (relative to the figure), and the optical element may be configured to redirect the light beam along an oblique direction. The light source module provides light beam 820 that passes along an oblique direction through the encapsulant layer 830. A ray bundle 850, emerging from the encapsulant layer 830, may illuminate a target 860. The ray bundle 850 may also be referred to as a light beam illuminating the target. The target may include an eye box of a user. The encapsulant layer may have a generally concave surface 840, and the device may form projected light rays 870, 880, and 890 within ray bundle 850, for example, to illuminate the target 860.

In some examples, using an optical element having a prismatic exit surface, the projected ray density of the three rays 870, 880, and 890 on the target 860 may show reduced illumination density with increasing angles. In some examples, the illumination intensity may be improved using an optical element having a freeform exit surface, or by modifying the exit surface curvature of the encapsulant layer.

FIG. 8B qualitatively illustrates an example illumination uniformity, for example, for light illuminating the target 860 using the device discussed above in relation to FIG. 8A. The Y-axis and X-axis of the graph represent the vertical and horizontal directions, respectively. However, axis labels for this representation, and for other examples, may be arbitrary. Example devices, such as described above in relation to FIG. 8A, may provide reasonably uniform illumination over the target region 860. In some examples, uniformity along an orthogonal direction (that may be denoted z) may also be improved.

FIG. 8C further illustrates illumination uniformity, in terms of irradiance level along a spatial axis. The figure illustrates (qualitatively) the relative illumination intensity along the Y-axis.

Figure 9A:
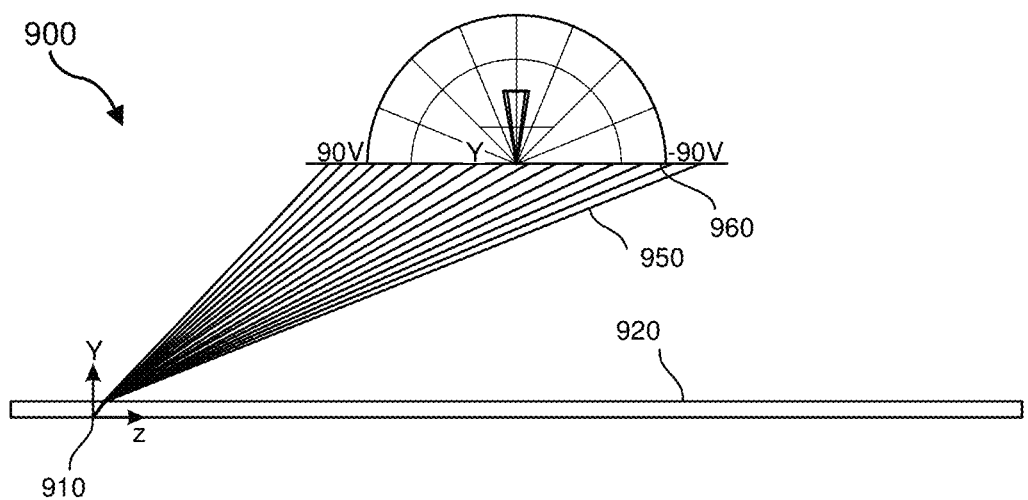
Figure 9B:
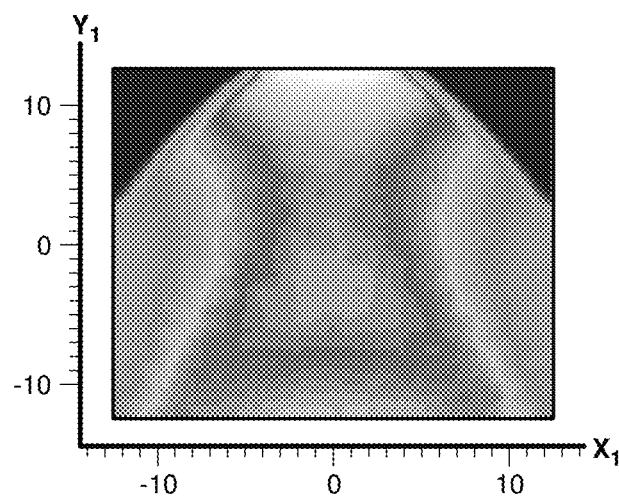

FIGS. 9A-9B show the illumination of a target using a light source in combination with an optical element having a planar lower surface and a freeform top surface (e.g., an aspheric surface lacking rotational symmetry). The optical element may provide both beam redirection and also improve the illumination uniformity of a remote object, which may be referred to as a target. This is illustrated by the relatively uniform spacing between the beams as they illuminate the target.

FIG. 9A shows a device 900 including a light source module (e.g., a combination of a light source and an optical element) located at 910, at least partially embedded in encapsulant layer 920, and configured to produce a ray bundle 950 (or light beam) that illuminates the target 960. In this example, the encapsulant layer has a planar exit surface. In some examples, the optical element may have a freeform exit surface that improves the illumination uniformity of the target.

FIG. 9B shows a qualitative representation of the illumination uniformity using a device such as that described above in relation to FIG. 9A.

FIGS. 10A-10D further show the illumination of a target using a device including a light source and an optical element with a curved exit surface.

Figure 10A:
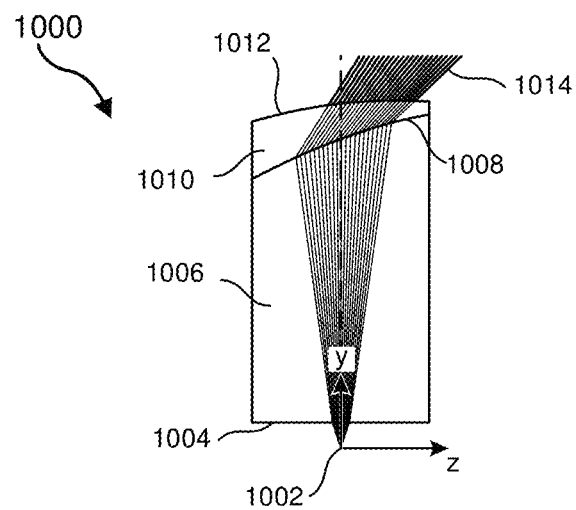
FIGS. 10A-10D further show illumination of a target using a device including a light source and an optical element with a curved exit surface.

FIG. 10A shows, in a cross-sectional schematic, a device 1000 including a light source 1002 and an optical element 1006. Light from the light source 1002 enters the optical element through entry surface 1004 (here, a planar entry surface), passes through the optical element 1006, and leaves the optical element through the exit surface 1008. In this example, the exit surface is a freeform surface. The exit surface 1008 curves in the plane of the cross-section, and also includes a portion 1010 curving backwards (as illustrated) towards an upper portion 1012. A ray bundle (or light beam) 1014 emerges out of the optical element 1006, through the exit surface 1008, and is directed to illuminate a target (not shown).

Figure 10B:
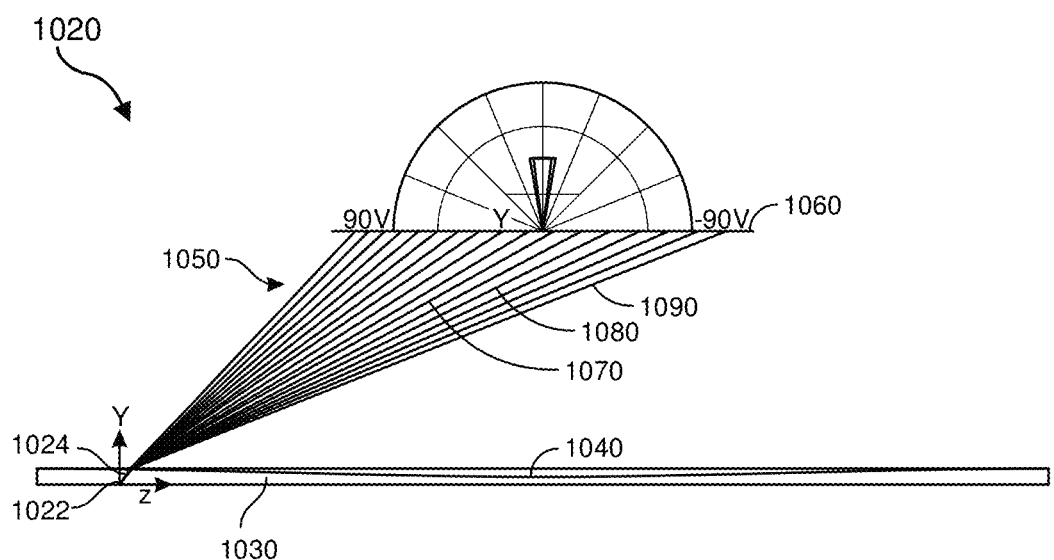

FIG. 10B shows a device similar to that discussed above in relation to FIG. 9A, though in this example the encapsulant layer has a generally concave exit surface. The example device 1020 includes a light source module 1022 (including a light source and optical element), and an encapsulant layer 1030 having a generally concave exit surface 1040. A light beam 1024 passes through the encapsulant layer 1030, and emerges at an oblique angle from the light source module. A ray bundle 1050 (or target-illuminating light beam) emerges from the encapsulant layer 1030, including rays such as 1070, 1080, and 1090 that illuminate the target 1060.

Figure 10C:
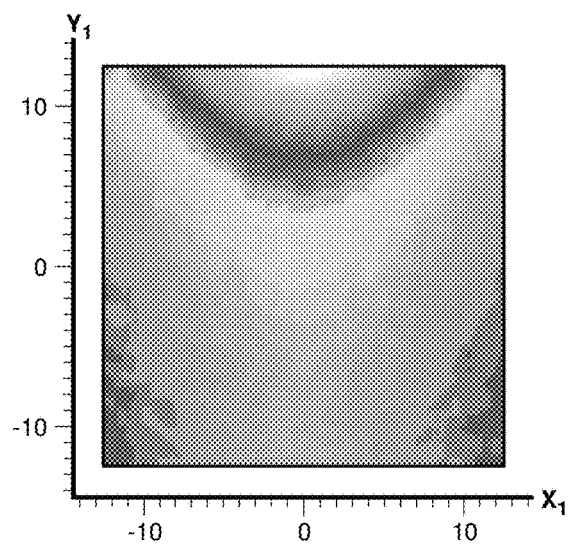

FIG. 10C qualitatively illustrates an example illumination uniformity, for example, for light illuminating the target 1060 in FIG. 10B. Axis labels for this illustration, and for other examples, may be arbitrary. An example device, such as described above in relation to FIGS. 10A-10B, may provide reasonably uniform illumination over a target.

Figure 10D:
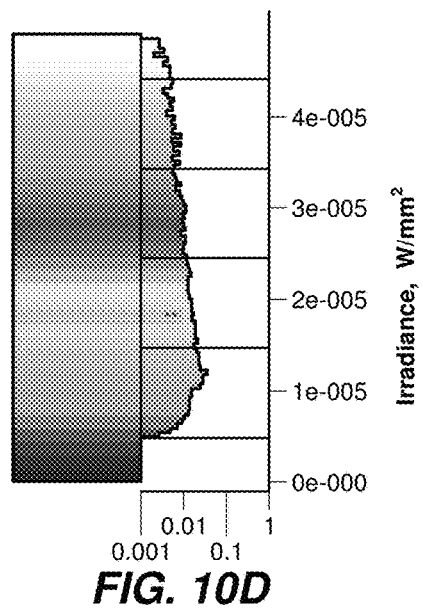

FIG. 10D further illustrates illumination uniformity in terms of irradiance level along a spatial axis. The figure illustrates (qualitatively) the relative illumination intensity along a particular direction, labeled as the Y-axis.

Figure 11:
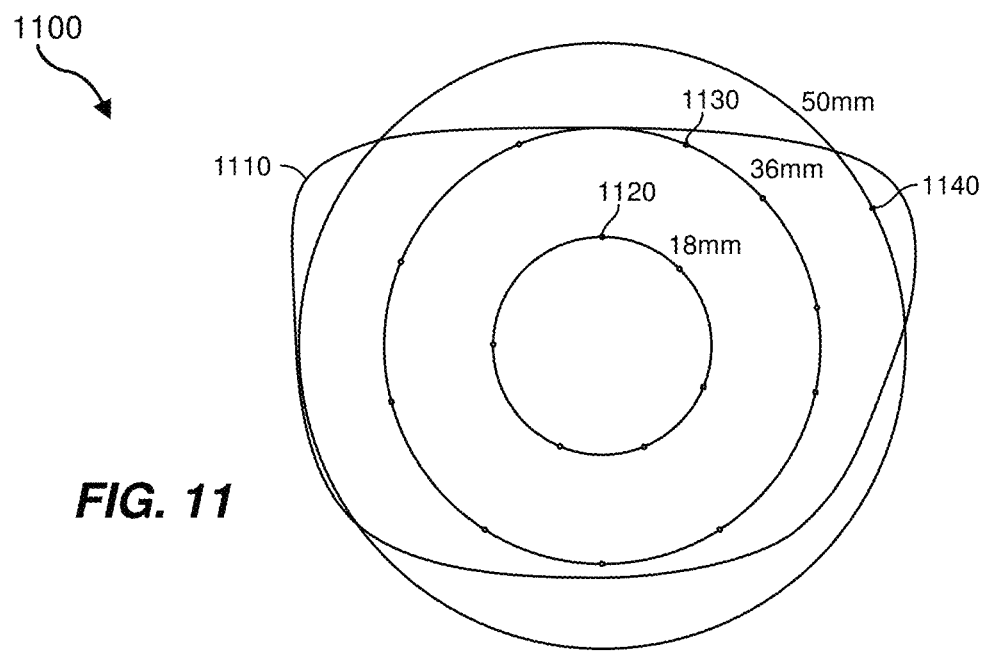
FIG. 11 illustrates a substrate supporting an arrangement of light sources and associated optical elements.

FIG. 11 shows an example device 1100 having a substrate 1110 (which may have the shape and dimensions of an eyeglass lens, and may include a transparent substrate) having an arrangement of light source modules such as 1120, 1130, and 1140. A light source module may include a light source combined with an associated optical element (e.g., a high refractive index microscale optical element). The light source module locations may be distributed over the substrate 1110 in a pre-determined arrangement, relative to the shape of the transparent substrate. The concentric circles illustrate radial distances of 18 mm, 36 mm, and 50 mm, that may be, for example, approximate radial distances from the optical center of a lens, and/or from the optical center of the eye of a user. The light source modules 1120, 1130, and 1140 are shown at example locations, and other locations may be used, for example, arranged around one or more predetermined radial distances. A frame, such as a portion of an eyeglass frame, may extend around the substrate, and may be configured to support the device on the head of a user.

In some examples, a device may include a frame, for example, the frame of augmented reality glasses. The frame may include one or more lenses. A lens may include a prescription lens or a plane window. Light sources may be distributed around the lens, for example, at various radii from the optical center. Light sources may have a cross-sectional area less than 300×300 microns, and may not be easily perceptible within a user's field of view. The optical elements may be arranged to direct light beams from the light sources towards the eyebox; i.e., a region around the center of the eye that may include the pupil. Example optical elements may improve the illumination of the eyebox, for example, to provide more uniform illumination. Light may be reflected from the eye, detected using an arrangement of optical sensors, and used for eye tracking. Example devices and systems may allow determination of the pupil periphery, gaze direction, and the like.

Figure 12:
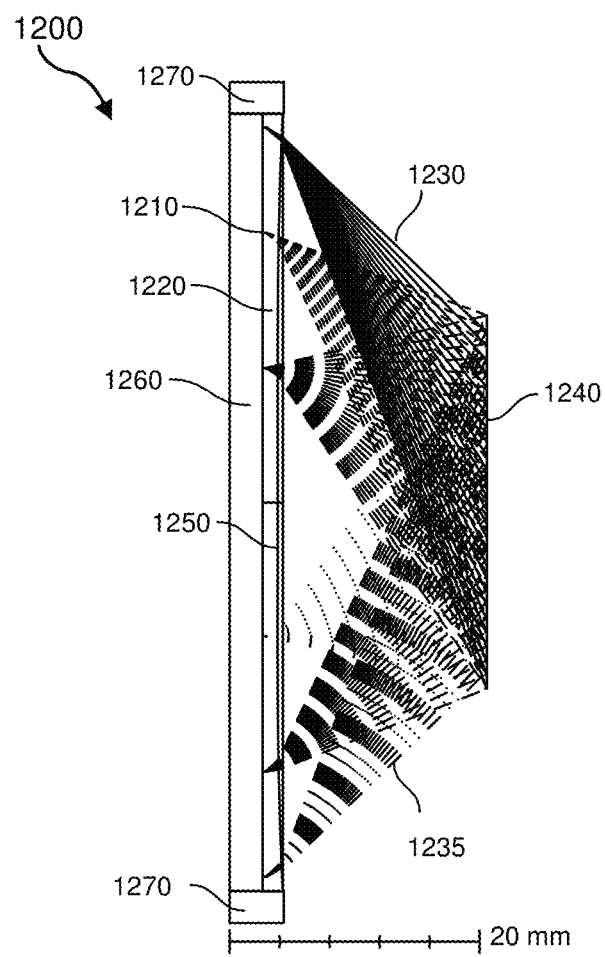
FIG. 12 illustrates illumination of an eyebox using a plurality of light source/optical element combinations arranged at different radial distances from the optical center of the lens.

FIG. 12 shows a schematic of a cross-section of an example device showing the illumination from an eye-tracking device 1200 on a target 1240 that may represent a user's eye. The eye-tracking device may be, for example, similar to the device discussed above in relation to FIG. 11. The figure shows light source modules, for example, at 1210. A light source module may include a combination of a light source and an optical elements, which may be at least in part embedded within encapsulant layer 1220. In this example, the exit surface 1250 of the encapsulant layer, facing the eye, has a generally concave shape. The light source modules may provide light beams such as 1230 and 1235. Different patterned lines are used to show illumination patterns of different light source modules. The encapsulant layer, and the light source modules, are supported on a substrate 1260. In some examples, the substrate may be a transparent substrate, and may provide a lens or window of a device, such as a device also including a near-eye display, and may have curved and/or planar surfaces. The substrate, encapsulant layer, and other components, such as those described above, may be supported in a frame 1270. In some examples, light sources and/or an encapsulant layer may be supported by the frame, and the substrate may be omitted. The substrate may be transparent for augmented reality applications, and may be provided by a window or a lens supported by a frame in an eyeglass-based device. In some examples, a substrate may not be transparent, for example, as part of a virtual reality device. In some examples, the frame 1270 may extend around the periphery of the lens, and may be part of an eyeglass shape. The shape of the frame may be similar to that of the periphery of the shape shown in FIG. 11. In some examples, may have two planar surfaces, which may be generally parallel as shown in the figure, but in some examples at least one surface of the substrate may be curved. In some examples, the substrate may be a transparent substrate. The substrate may be configured to allow one or more of the following to pass through the device and reach the eye of a user: light from the ambient environment (the "real world"), augmented reality image light, and/or virtual reality image light. Example optical elements may be configured to provide different deviation angles based on the locations of the optical element and associated light source. For example, combinations of light source and optical elements may be configured so that the optical element provides a larger deviation angle for larger lateral offsets from the eyebox. In some examples, a light source may be configured to produce a beam at least partially directed towards the eyebox.

A light beam generated by a light source may have an initial direction, that may, for example, be generally normal to a proximate substrate surface, and/or normal to the entrance surface of the optical element. The beam direction may be considered as the mean or average beam direction, though an example light source may provide a light beam within an emission cone. In some examples, light sources and associated optical elements may be distributed over a device, such as wearable augmented reality device or a virtual reality device.

Figure 13A:
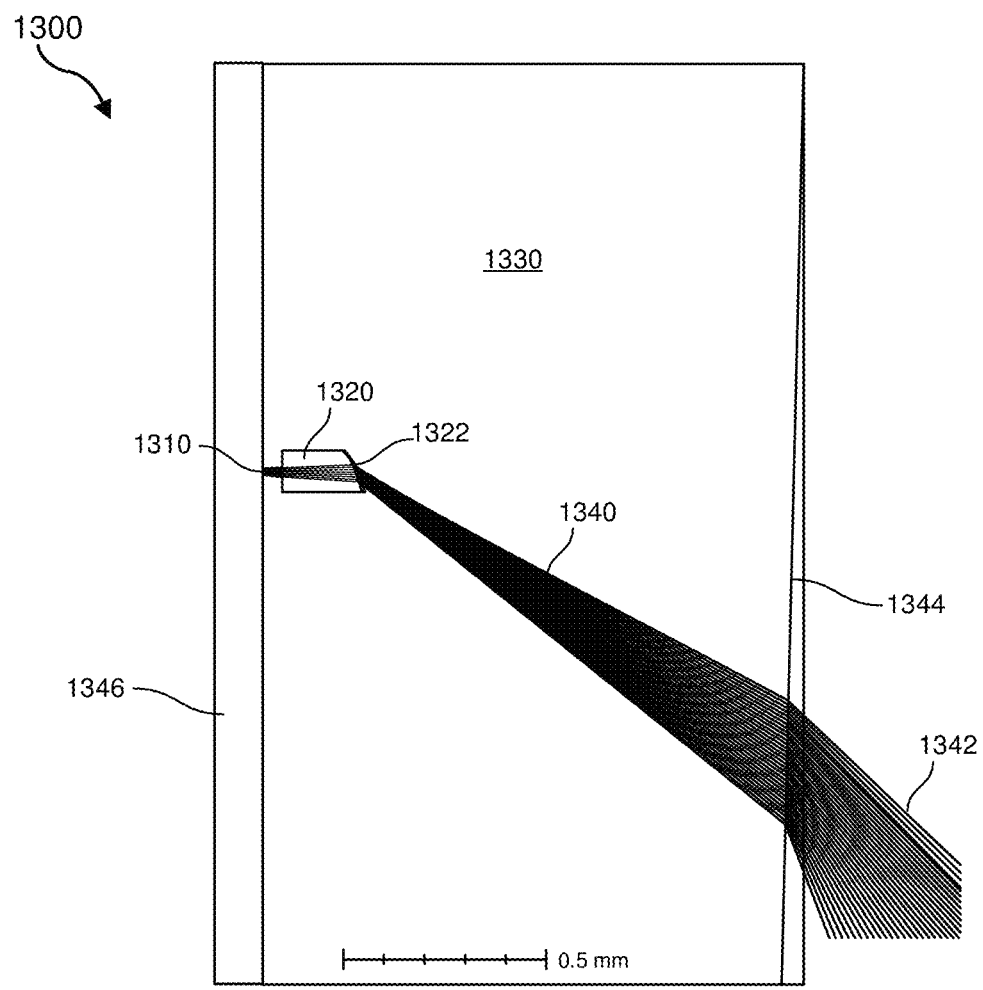
FIGS. 13A-13B show an example device that includes a light source, optical element, and an encapsulant layer.
Figure 13B:
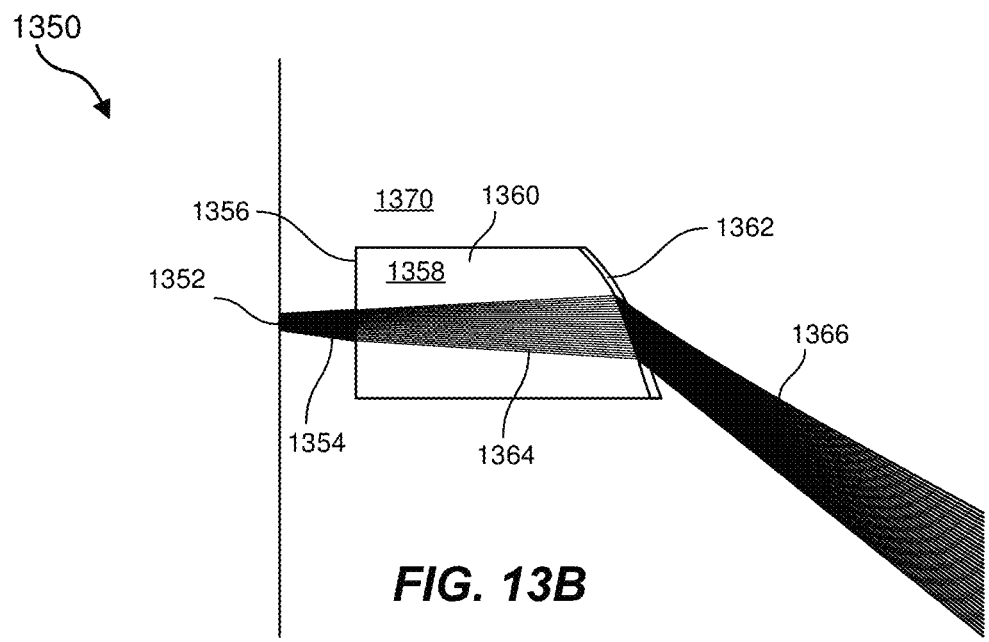
Figure 13C:
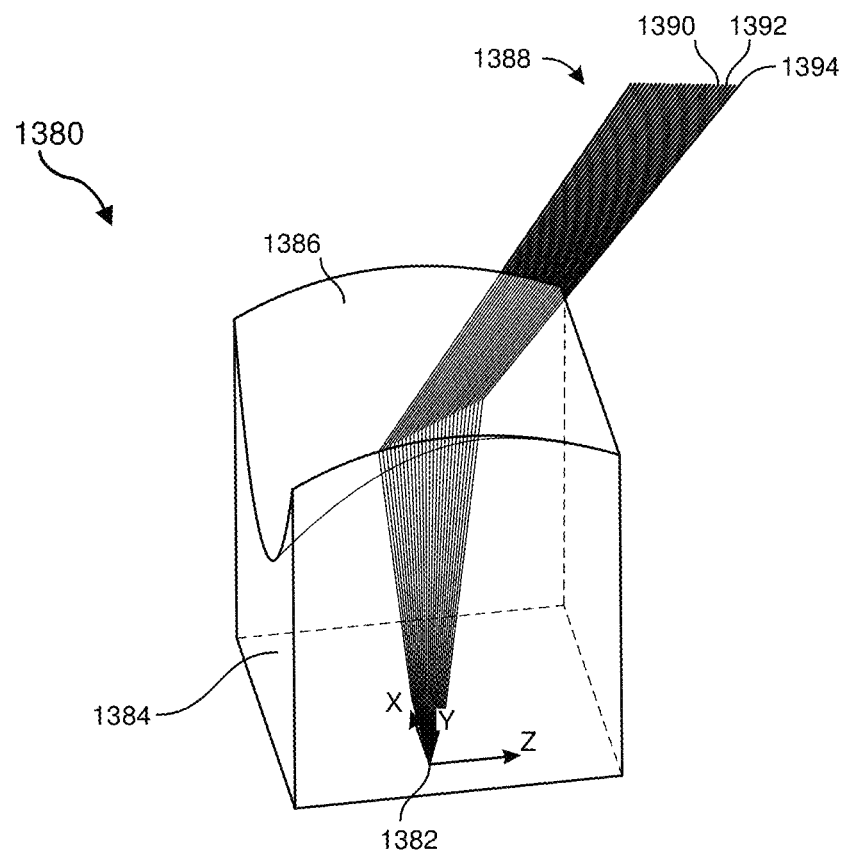
FIG. 13C shows a freeform exit surface of an optical element having properties that may, in some examples, be at least approximately replicated by a metamaterial layer and a wedge element.

FIGS. 13A-13C show example devices including a combination of a light source and an associated optical element. The optical element may include a high-index material, for example, a material having a refractive index greater than approximately 2, such as a material having a refractive index of at least approximately 3. The optical element may include a semiconductor, such as gallium arsenide (GaAs, refractive index, n=3.5), aluminum gallium arsenide, other arsenide semiconductor, other semiconductor material, or other material such as a high-index material.

FIG. 13A shows a portion of a device 1300, including light source 1310, optical element 1320, having exit surface 1322, and encapsulant layer 1330. The combination of light source 1310 and optical element 1320 produce light ray bundle 1340, which is refracted at the exit surface 1344 of the encapsulant layer, to provide target-illuminating ray bundle 1342. In some examples, the exit surface 1344 of the encapsulant layer may have a generally concave profile. The figure also shows a transparent substrate 1346 that may support the light source and may be adjacent the encapsulant layer. A frame (not shown) may be used to support the device, for example, on the head of a user, the target may include an eye of the user, and the device may be an eye-tracking device or a device having an eye-tracking function. In some examples, the thickness of the encapsulant layer may be between approximately 0.5 mm and approximately 5 mm.

FIG. 13B shows an example device 1350. The device may include a light source 1352 providing a light beam 1354 that enters the optical element 1360 through entry surface 1356. The light beam 1364 propagates through the optical element 1360, which may include a high-index material (that may be a generally transparent material) 1358, and is refracted at the exit surface 1362 of the optical element 1360 into the encapsulant layer 1370 as light beam 1366. The exit surface of the encapsulant layer is not shown in this figure, but the light beam 1366 may exit the encapsulant layer 1370 and may illuminate a target such as an eye (not shown in this figure). In this example, the optical element 1360 has an entry surface 1356 that may be a planar surface and an exit surface 1362 that may be a freeform surface.

FIG. 13C shows a device 1380 including a light source 1382 and an optical element 1384, both of which may be (at least in part) encapsulated in an encapsulant layer (not shown). The optical element 1384 may have an aspheric exit surface, such as a freeform surface 1386, through which a light beam may leave the optical element that both changes the chief ray angle for light emitted by light source 1382 and modifies the relative ray angles within the ray bundle 1388, for example, for light rays 1390, 1392, and 1394. This curved exit surface configuration may provide improved uniformity of illumination of a target, particularly when the target is laterally offset from the light source and the illumination is from oblique angles.

For example, a light source may be offset laterally relative to the center of the illumination target region (e.g., the light source may have a radial offset from the center of the eye, for example, as discussed in relation to FIG. 11). The curved output surface of the optical element may be a freeform surface and may lack rotational symmetry (e.g., around the optic axis and/or chief ray of input or output light beams). In some examples, the exit surface may be an anamorphic aspheric surface. In some examples, the exit surface may include a curved interface between the optical element and a substantially adjacent encapsulant layer.

However, in some examples, similar properties and advantages as those provided by a freeform optical surface may be obtained using a combination of an oblique exit surface (such as that obtained using a wedge element) and a metamaterial layer. An oblique exit surface may modify the chief ray angle, for example, imparting a deviation of between 10 degrees and 80 degrees, such as between 20 degrees and 60 degrees. A metamaterial layer may modify the relative ray angles within the ray bundle to improve illumination uniformity of a target (such as an eye). Optical elements including a metamaterial layer are discussed further below.

In some examples, a device may include a light source (e.g., supported on augmented reality and/or virtual reality headwear, such as a headset, glasses, or the like) providing a light beam to an optical element. In some examples, the beam may be redirected towards the eyebox by the optical element. The optical element may be embedded in a medium, such as an optical polymer, having an intermediate refractive index. The optical element may have a planar surface through which the beam enters the optical element, and an exit surface (such as an oblique planar surface, or a freeform curved exit surface) through which the beam leaves the optical element. Refraction at the interface between the optical element and the surrounding medium (e.g., air, polymer or other medium) may deviate the path of the beam towards a laterally offset target. The high-index material may include a semiconductor, such as GaAs (refractive index, n=3.5), AlGaAs, or one or more other arsenide semiconductors.

In some examples, the optical element may include a semiconductor such as a phosphide semiconductor, for example, gallium phosphide (GaP), that may have a refractive index of approximately 3.1. An example optical element may include one or more semiconductors, such as one or more of the following semiconductors: arsenides, phosphides, nitrides, antimonides, selenides, sulfides, or other semiconductors.

In some examples, metamaterial layers (which may, in some examples, also be termed metalayers or metasurfaces) may be used for beam shaping, for example, in eye-tracking beam shaping applications.

Example eye-tracking devices may include a VCSEL (vertical-cavity surface-emissive laser). A beam-shaping element may be used to enable uniform and distributed illumination to eyeboxes. In some examples, beam shaping may be achieved through wavefront manipulation using a metamaterial layer. In some examples, an eye-tracker may include one or more optical detectors, such as a photodetector or an imaging sensor, and a control module configured to determine an orientation of the eye from detected radiation returned from the eye.

An example device may include one or more light sources, with each light source used in combination with an optical element. Example light sources, such as an LED or laser, may have a light source emitting area having a size smaller than 1 mm×1 mm, such as less than 300×300 microns. Control of the emitting area may be achieved using one or more of etching, electrical confinement, or optical confinement. In some examples, a light source package size may be smaller than 1 mm×1 mm×1 mm, such as smaller than 300 microns×300 microns×300 microns in dimension.

In some examples, an optical element may include a metamaterial layer. Unlike a freeform refractive element, a metamaterial layer may be flat, and generally uniform in thickness, that may allow for fabrication using conventional semiconductor processing. An example metamaterial layer is considered, which includes a distribution of nanopillars (having either a cylinder, square, or other cross-sectional shape) with a pillar spacing less than the operating wavelength of the light source. The size (such as the diameter) of the nanopillars may be adjusted to accommodate the phase variation required for a desired wave-front manipulation. The phase retardation for nanopillars can be calculated as a function of nanopillar diameter using simulation tools such as finite-different time-domain (FDTD) methods, rigorous coupled-wave analysis (RCWA), and the like. The metamaterial layer may thus direct and/or diverge the beam as appropriate for the device application, such as an eye-tracking application.

In some examples, a device includes a laser, such as a VCSEL. In some examples, a laser may operate in the near-IR. In some examples, the light source may include a GaAs VCSEL, though this and other examples are non-limiting. In some examples, the metamaterial layer may be located within the substrate material of the laser, such as a VCSEL, that may be based on GaAs. In some examples, a metamaterial layer may be located on (or otherwise supported by) a surface of the substrate.

Figure 14:
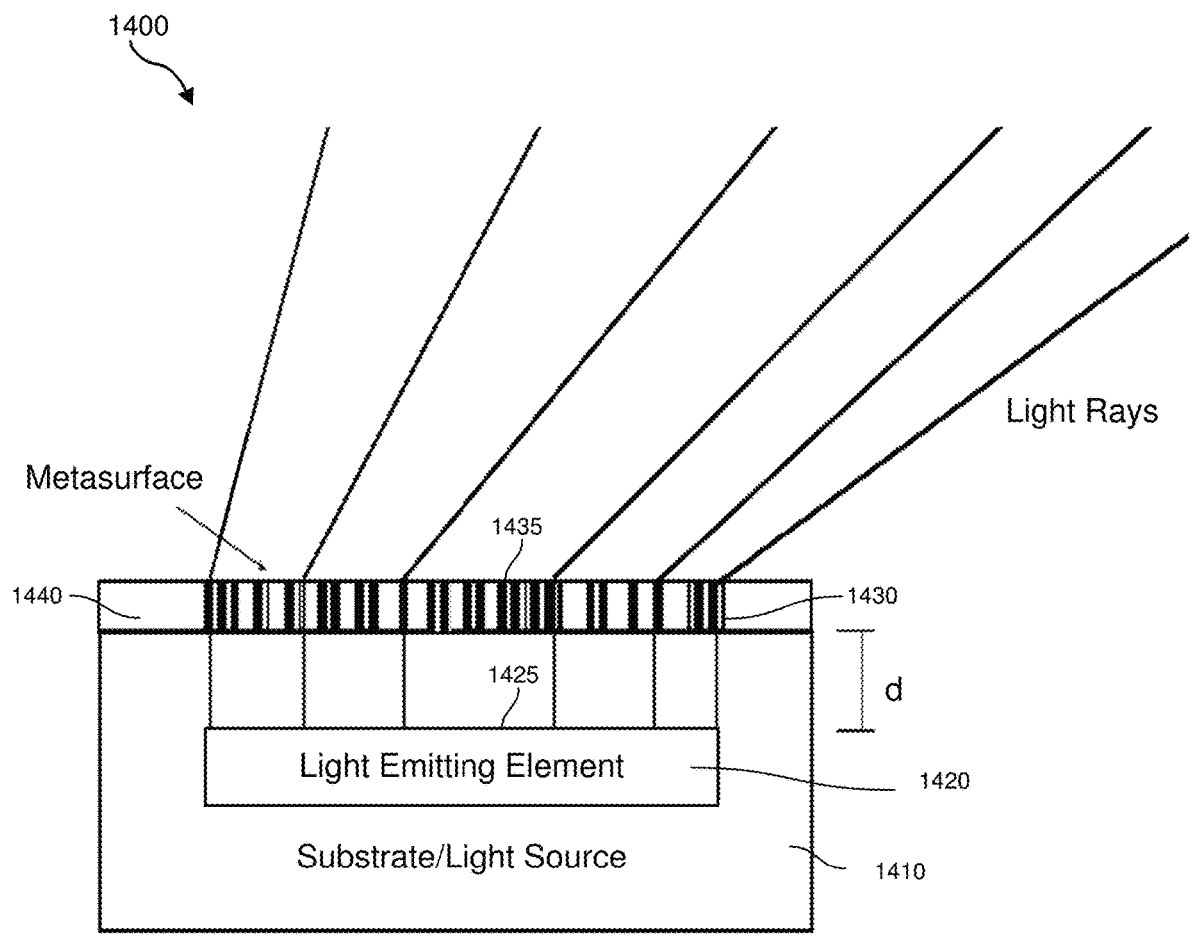
FIG. 14 shows beam shaping of a laser light source using an optical element that includes a metamaterial layer.

FIG. 14 shows beam shaping of an example light source (e.g., a VCSEL) using a device including an optical element, where the optical element includes a metamaterial layer. FIG. 14 shows a device (or a portion of a device) 1400, including a light source (or light-emitting element) 1420, such as a VCSEL, having a light-emitting surface 1425, located within a substrate 1410. The device includes a metamaterial layer 1430, which may be an external layer on top of the substrate, or a component of the substrate. In some examples, the metamaterial layer 1430 may be surrounded by a generally uniform layer 1440. The metamaterial layer may extend over the light emitting surface 1425, so that most or substantially all light from the light source passes through the metamaterial layer. The metamaterial layer may be formed in situ, or a metamaterial layer may be formed elsewhere by any process and then positioned on or within the substrate. The metamaterial layer 1430 and the light-emitting surface 1425 may be separated by a separation distance, labeled "d" in the figure. The separation distance may be in the range 0-1 mm, such as 10 nm-500 microns, such as 10 nm-10 microns. These ranges, and others, are exemplary and not limiting, may be approximate ranges, and/or may be inclusive ranges. In some examples, the substrate itself may be the light-emitting element.

In FIG. 14, example light rays are shown as solid lines emerging from the light source 1420, and passing through the metamaterial layer 1430. In this example, the optical element includes a metamaterial layer configured to obtain a desired beam profile, such as a beam profile that provides improved illumination uniformity. The light source 1420 provides a light beam that may illuminate an optical element including the metamaterial layer 1430. The metamaterial layer 1430 may include an arrangement of microstructures or nanostructures, such as an arrangement of pillars or other structures.

In some examples, the metamaterial layer may be located within the substrate. In some examples, the metamaterial and the light source may be adjacent or substantially adjacent. An example metamaterial layer may be generally planar, and the exit surface of the metamaterial layer, through which light exits after passing through the metamaterial layer, may be generally planar. In some examples, an optical element may include one or more metamaterial layers, and optionally one or more additional optical layers and/or additional optical components (such as a wedge element, grating, filter, aperture, lens, or other optical component). In some examples, an optical element may include a metamaterial layer combined with a wedge element. For example, a wedge element may be located on a metamaterial layer, or a metamaterial layer formed on a wedge element.

In some examples, a light source may provide a light beam that illuminates an optical element, such as an optical element including one or more metamaterial layers. Example metamaterial layers may include an arrangement of microstructures or nanostructures, such as an arrangement of pillars or other structures. The microstructures or nanostructures may include one or more of many possible structure geometries or shapes. A metamaterial layer may have one or more function, such as beam redirection, beam shaping, phase modification, and/or may have polarization dependent properties. Example metamaterial layers may include polarization-sensitive structures (such as polarization-sensitive nanostructures) which may include rectangular structures, oval cross-section structures, coupled structures, or other anisotropic structures (e.g., nanopillars with an anisotropic cross-section), and/or may include polarization-insensitive structures, such as nanoposts (e.g., nanopillars), square cross section posts, and other structures that possess lateral (x-y) symmetry. The diameter (or equivalent cross-sectional dimension), spacing, and/or length of the structures (e.g., pillars or other structures) may have a spatial variation configured to impart a desired beam modification. In some examples, the exit surface of a metamaterial layer may have an oblique (tilted) exit surface, for example, arising from a spatial distribution of structure height, such as pillar height. In some examples, the metamaterial layer may have a generally uniform thickness. Refraction of light at the exit surface, and/or spatial variations in phase properties arising from metamaterial property variations, may be used to modify the beam profile and the beam direction.

Figure 15:
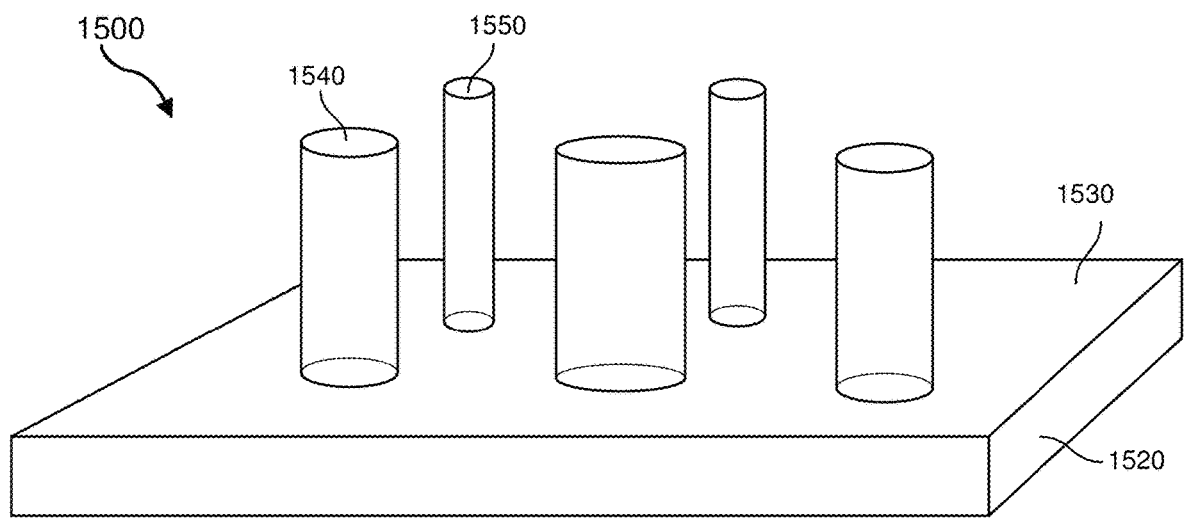
FIG. 15 shows an example arrangement of nanopillars on the surface of a substrate.

FIG. 15 shows a view of an example arrangement 1500 of nanopillars (such as 1540, and 1550) on the surface 1530 of a substrate 1520. In this example, the device includes cylindrical nanopillars having a spatially varying nanopillar diameter. For example, nanopillar 1540 has a larger diameter than nanopillar 1550. In some examples, the arrangement of nanopillars may be configured as a metamaterial layer. A metamaterial may include other microstructures or nanostructures. A nanostructure, such as a nanopillar may have a dimension (such as a diameter or other analogous cross-section dimension, or other dimension) of less than 1 micron. A microstructure may have one or more dimensions less than 1 mm, and in some examples less than 500 microns.

Figure 16:
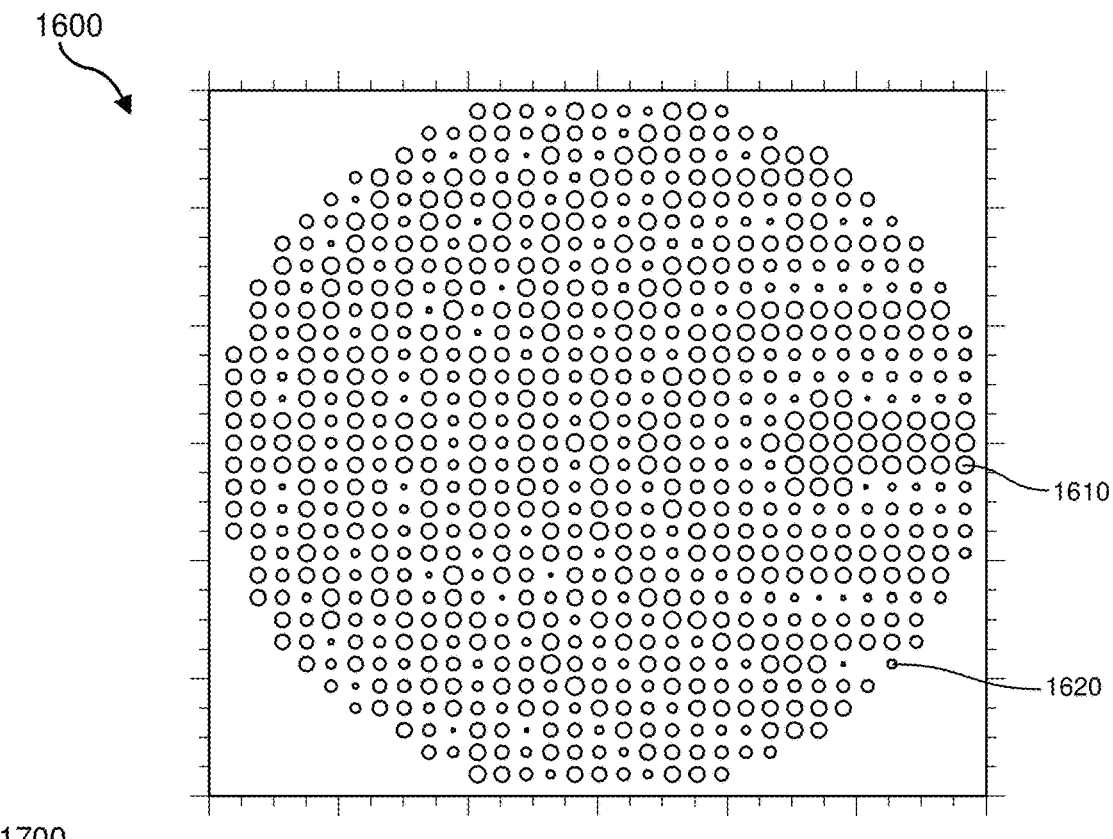
FIG. 16 shows an array of nanopillars configured as a metamaterial layer.

FIG. 16 shows a top view of an arrangement of nanopillars 1600, including nanopillars such as 1610 and 1620. The nanopillars may be configured as a metamaterial layer, and may be configured for use with a light source, such as laser diode, such as a GaAs VCSEL.

In some examples, the nanopillars may be arranged in a generally regular array, such as illustrated in FIG. 16, and metamaterial properties may have a spatial variation arising from a spatial variation in nanopillar diameter (or a variation in some other cross-sectional dimension). For example, nanopillar 1610 has a greater cross-sectional diameter than nanopillar 1620.

In some examples, a metamaterial layer may have an arrangement of nanostructures (such as nanopillars), for example, based on an regular arrangement (which may be termed an array or a lattice) with some degree of symmetry (such as a square lattice, a face-centered square lattice, a hexagonal lattice, etc.). For a high-index substrate, the metamaterial layer may cause some unwanted diffraction. The diffraction may be suppressed using a metamaterial layer having a randomized distribution of nanopillars. The exact position of each metamaterial unit (e.g., a nanostructure) may be randomized while keeping the distance between neighboring units larger than a minimum value (which may be a sub-wavelength distance). A nanostructure parameter (such as a size parameter, e.g., a diameter, of each nanostructure, such as a nanopillar) may be determined by the phase retardation desired at the nanostructure location.

In some examples, a metamaterial layer may include a randomized distribution of metastructures, such as a randomized arrangement of nanostructures. A metastructure may include microstructures and/or nanostructures, such as nanopillars, other protrusions, or other features such as holes.

Figure 17:
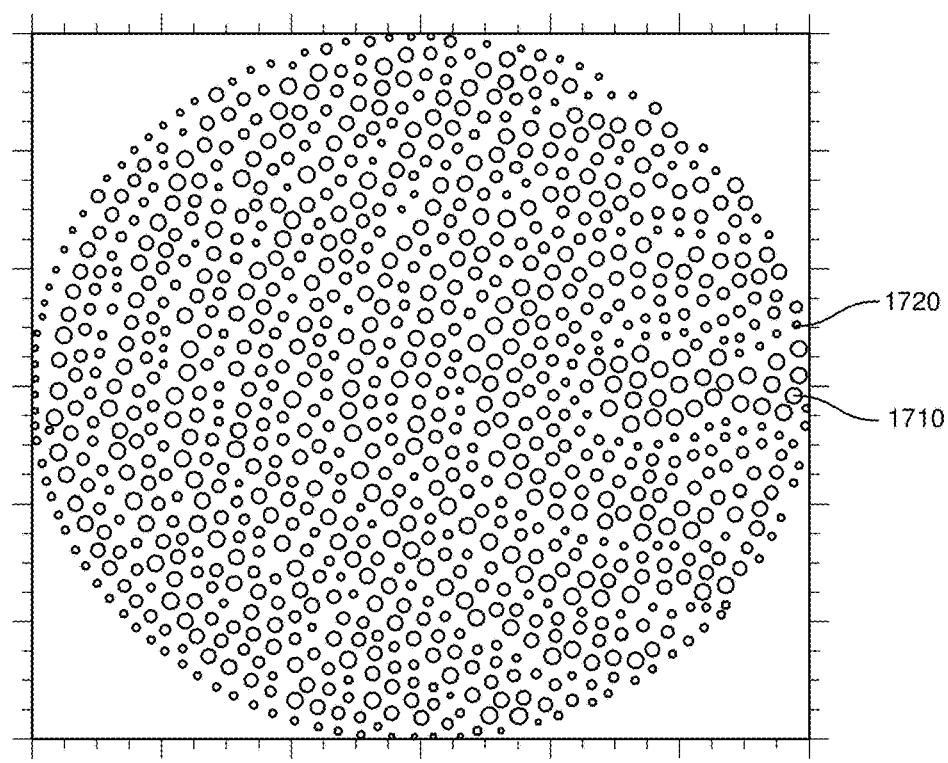
FIG. 17 shows a randomized arrangement of nanopillars configured as a metamaterial layer.

FIG. 17 shows a randomized arrangement 1700 of nanopillars (such as nanopillars 1710 and 1720, having different diameters) configured as a metamaterial layer. In some examples, the location of a nanostructure may be offset by a randomly selected distance, for example, along a randomly selected orientation, from the location corresponding to a regular array.

In some examples, a metamaterial layer may be combined with one or more other optical components, such as a wedge element. In beam-shaping applications where large angles of beam bending (e.g., large refraction angles or beam redirection angles) are required, a wedge element may be added, for example, on top of the metamaterial layer. The wedge element may function as a refractive element that may redirect the beam according to the first order of phase retardation. Any higher order phase retardation may then be achieved using the metamaterial layer. Example configurations may allow the spatial variation in phase retardation to be lower for the metamaterial layer, potentially enabling more precise wavefront manipulation.

In some examples, the metamaterial layer may be formed on an oblique upper surface of the wedge element, or other location, such as on an emissive surface of a light source, or on an exit surface of an encapsulant layer. In some examples, the wedge element may be omitted and beam shaping achieved using a metamaterial layer.

Figure 18:
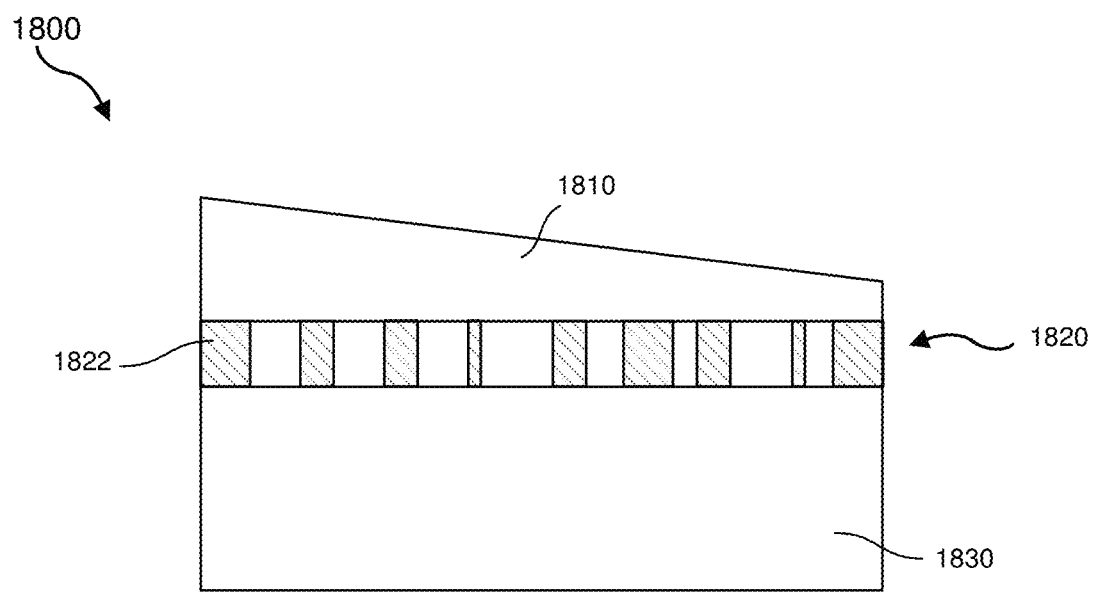
FIG. 18 shows an example device including a metamaterial layer and an optical element.

FIG. 18 shows an example device 1800, such as an optical element, including a metamaterial layer 1820, having an arrangement of pillars 1822 (such as nanopillars) on a substrate 1830. The device also includes a wedge element 1810. In this example, an optical element may include the wedge element 1810 (such as a prism or portion thereof), which may provide beam redirection. In some examples, the wedge element may provide appreciable beam redirection by, for example, redirecting the beam through an angle between approximately 10 degrees and approximately 80 degrees. In some examples, the metamaterial layer 1820 has a spatial variation in one or more metamaterial parameters (such as pillar diameter and/or pillar spacing), and the spatial variation in metamaterial layer properties may be used for beam shaping. Beam shaping using a metamaterial layer may be used, for example, to improve illumination intensity uniformity for a target illuminated by a light source located at a laterally offset location, relative to the target. For example, illumination uniformity of an eye using an eye tracker may be improved using a metamaterial layer in combination with a wedge element or other beam redirection element. In this context, a lateral offset location may be located an appreciable distance from a normal to the target area, as measured along a direction perpendicular to the surface normal. Oblique illumination may include illumination using a light beam having an angle between approximately 10 degrees and approximately 20 degrees to the normal to the target area (e.g., at the center of the target area.)

In some examples, the optical element may include the wedge element 1810 and the metamaterial layer 1820, and the substrate 1830 may include a light source on which the optical element may be formed. In some examples, the optical element may include the wedge element 1810, the metamaterial layer 1820, and the substrate 1830. For example, the substrate 1830 may include an optical layer, which may include a high-index material, or other optical layer, which may be formed on an emissive surface of a light source.

In some examples, a method may include: providing (e.g., fabricating) a light source (such as a laser or a light-emitting diode) having an emissive surface; forming an optical layer (that may include a high-index material) on the emissive surface; forming a metamaterial layer on the optical layer; forming a layer on the metamaterial layer; forming a resist layer on the layer, with the resist layer having a shape determined by a spatially non-uniform thickness of the resist layer; and etching the shape of the resist layer into the layer to form an optical element (which may include material from the layer) having a shaped exit surface. The shaped exit surface may be based on the shape of the resist layer. The optical element may be supported by the emissive surface of the surface-emissive laser, receive light from the surface-emissive laser, and may be configured to redirect the light by refraction through the shaped exit surface to illuminate a remote target. In some examples, the optical layer may be omitted. An additional example method may include forming a metamaterial layer on the emissive surface of the light source, forming a layer on the metamaterial layer, formation of a shaped resist layer on the layer, and etching to form an optical element, which may include material from the layer and may have a shaped exit surface determined by a shape of the shaped resist layer.

In some examples, the metamaterial layer may include an arrangement of nanopillars having sub-wavelength spacings. The spacings and/or diameters of the nanopillars may have a spatial variation configured to obtain a desired phase profile. The gaps between pillars may include air, an inert gas such as nitrogen, or a medium having a significantly different refractive index (e.g., at least 0.5 higher or lower). In some examples, the metamaterial layer may include elements, such as nanopillars, formed from a material (e.g., a high-index material) such as a semiconductor. In some examples, gaps between elements may be open (e.g., air filled), or in some examples the gaps may be filled with a material, such as an oxide or polymer material.

In some examples, a metamaterial layer may be located on the upper surface of an optical element, for example, on an exit surface of an optical element (such as a wedge element).

In some examples, a metamaterial layer may be located on (or near) an exit surface of the light source, or a light source housing, or near the entrance or exit surface of another optical component, such as a wedge element. The light source or its housing may have an oblique exit surface that may help redirect the light beam (e.g., towards the eyebox in an eye-tracking application). An oblique exit surface may provide a similar function to a wedge element. In some examples, a wedge element may be incorporated into a light source or a light source housing.

In some examples, a reflective surface may be used to direct a light beam towards the target, such as the eye, or light box. A metamaterial layer may be located on or near the reflective surface, or located elsewhere within the light beam path.

In some examples, a metamaterial layer may be located at any appropriate location within the light beam path (e.g., the light beam path from the light source to the eyebox in an eye-tracking application). A metamaterial layer may be used in combination with one or more other optical components to achieve a desired beam modification of, for example, one or more of a lens, mirror, phase plate, diffraction grating, window, optical filter, holographic element, beam shaping optical element, surrounding medium, or other optical element.

Figure 19:
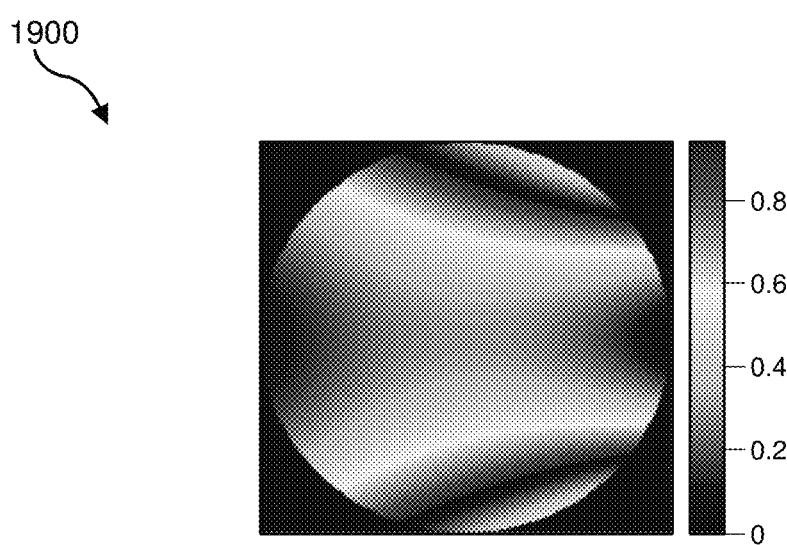
FIG. 19 shows an example phase profile for an example metamaterial layer combined with a wedge element.

FIG. 19 shows an example phase profile 1900 determined for an example metamaterial layer combined with a wedge element, such as the device shown in FIG. 18.

Figure 20A:
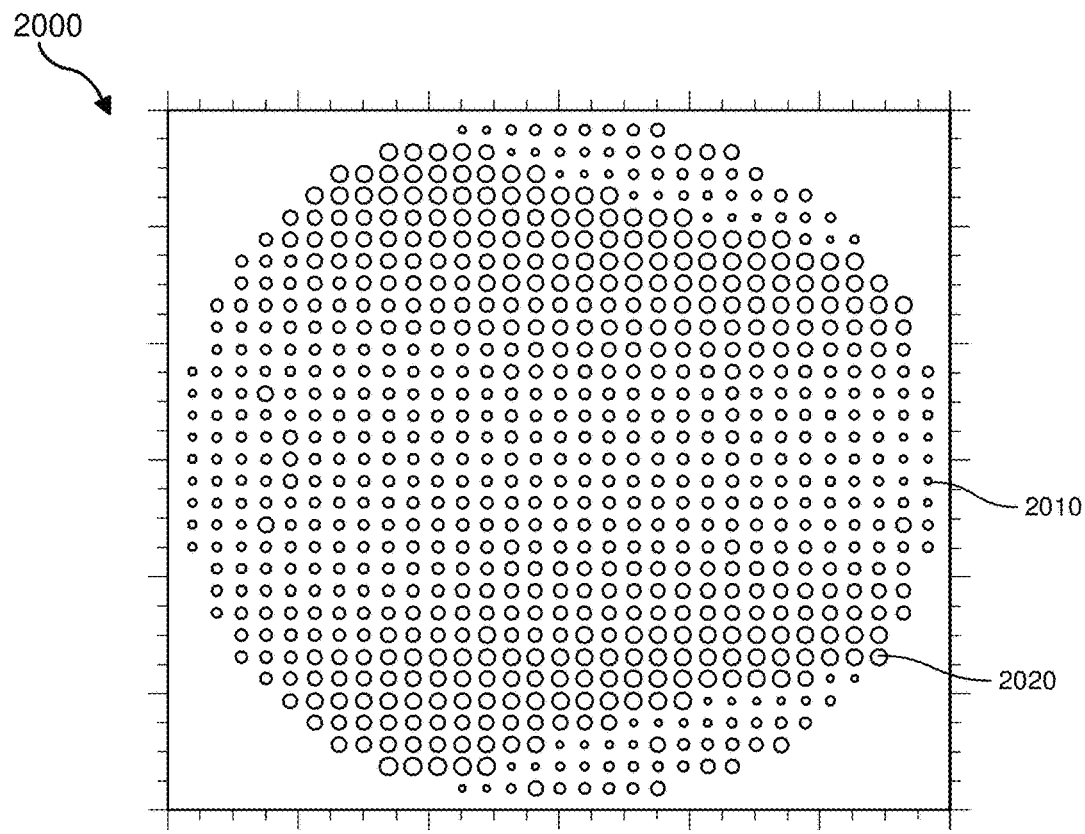
FIGS. 20A and 20B show a generally periodic and randomized arrangements of nanopillars, respectively, configured as metamaterial layers.

FIG. 20A shows a generally periodic arrangement of nanopillars, configured as a metamaterial layer providing the phase variation shown in FIG. 19. The metamaterial layer, shown generally at 2000, includes nanopillars such as 2010 and 2020. In some examples, the nanopillars may be arranged in a generally regular array.

Figure 20B:
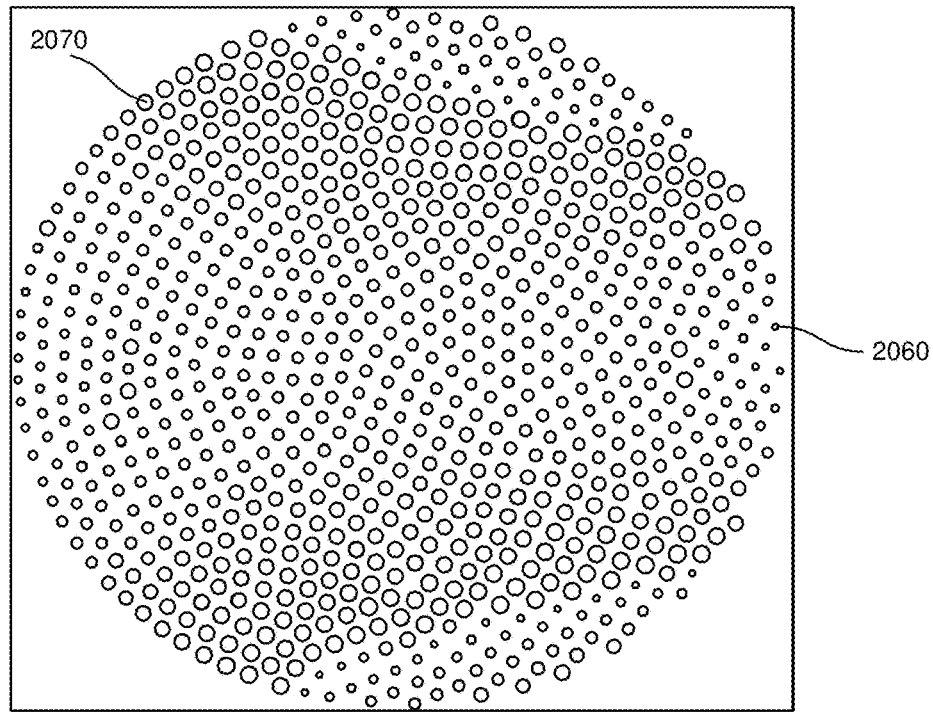

FIG. 20B shows an example of a randomized distribution of nanostructures within a metamaterial layer, also configured to obtain the phase variation shown in FIG. 18. The arrangement of nanopillars 2050 includes nanopillars such as 2060 and 2070, that are not positionally arranged on a regular array. A metamaterial layer may include a randomized distribution of microstructures and/or nanostructures, such as a randomized distribution of nanopillars.

Figure 21A:
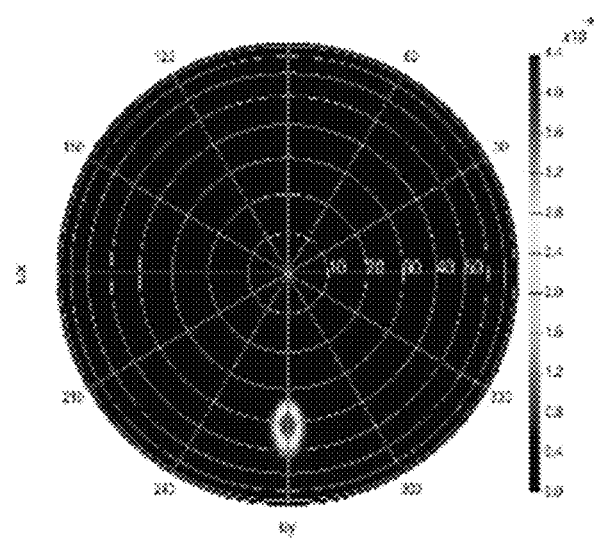
FIGS. 21A and 21B show light beam profiles for a wedge element alone, and for a wedge element combined with a metamaterial layer, respectively.
Figure 21B:
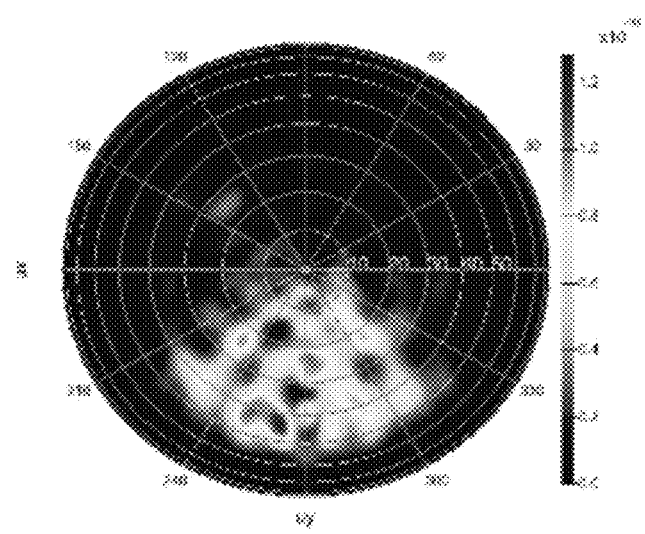

FIG. 21A shows the illumination at far-field using a light source and an optical element that includes only a wedge element. In this example, the optical element bends the light beam from the light source to an angle of approximately 40 degrees. FIG. 21B illustrates far-field illumination using an optical element that includes a wedge element located on top of a metamaterial layer. This configuration provides reasonably uniform illumination with a desired wide angular range, in this example over approximately 0-60 degrees in one direction, and over 100 degrees in another (orthogonal direction). Hence the use of a metamaterial layer, such as a combination of a metamaterial layer and another optical component such as a wedge element, may be used to obtain improved illumination uniformity.

In some examples, a metamaterial layer according to the principles described herein may include an arrangement of nanostructures, such as nanopillars. The nanostructures may be arranged in a square array or other arrangement. The nanostructure spacing (e.g., the center-to-center spacing of adjacent nanopillars, that may also be termed a lattice constant) may be a sub-wavelength distance, for example, in the range $0.1\lambda$ to $0.9\lambda$ (where $\lambda$ is the center emission wavelength of the light source), and in some examples may be in the range $0.1\lambda$ to $0.8\lambda$, and may be approximately half the emission wavelength. The emission wavelength may be a near-IR wavelength (e.g., in the range 750 nm-2500 nm, such as 750 nm-1000 nm), or a visible light wavelength (e.g., in the range 400 nm-750 nm), for example, a red-orange wavelength (e.g., in the range 590 nm-750 nm). In some examples, a nanostructure dimension (such as thickness, diameter, or other lateral dimension) may be in the range 200 nm-1000 nm, such as between 300 nm and 800 nm, subject to the maximum practical dimension(s) imposed by the choice of lattice constant. In this context, a lateral dimension may be a dimension measured in a direction orthogonal to a direction of elongation (e.g., for a nanopillar), and/or measured parallel to a substrate supporting the nanostructure.

In some examples, a device includes an optical element (e.g., including a lens or prism and/or a metamaterial layer, that may include a high-index material) with a light source (such as a semiconductor light source, such as a light-emitting diode, or a laser diode such as a VCSEL). A device may be configured for near-eye operation, for example, as an eye-tracker having a light source located proximate an eye of a user. The emission wavelength of the light source may be a near-IR emission wavelength. In some examples, a device may be configured so that, when worn by a user (e.g., in a manner suggested by the product labeling or by convention) the light source is located at a near-eye location. The light source may be configured to be located at a distance between 5 mm and 50 mm from the eye, for example, at a distance between 10 mm and 40 mm from the eye, such as between 15 and 30 mm from the eye, when the device is worn. In some examples, the device may be configured so that the light source is located less than approximately 25 mm from the eye when the device is worn. In this context, a device may be worn, for example, as a self-supporting item (such as glasses, goggles, a headset, hat, or other item) or as an accessory or a component of such an item. In some examples, a lens used as (or part of) an optical element may have a focal length of between 5 mm and 50 mm, for example, between 10 mm and 40 mm, such as between 15 and 30 mm, and in some examples the focal length may be less than approximately 25 mm. In some examples, the device may be configured to be inconspicuous to a user. In some examples, the light source may have external dimensions less than 2 mm×2 mm×2 mm, such as less than 1 mm×1 mm×1 mm, such as less than 500×500× 500 microns, such as less than 300×300×300 microns. When combined with the near-eye proximity, such dimensions may make the light sources (and, e.g., any associated optical device components) inconspicuous.

In some examples, nanostructures may include one or more materials (e.g., one or more high-index materials), such as one or more semiconductors. In some examples, nanostructures may include a high-index material, such as a semiconductor or a dielectric material. In some examples, the high-index material has a refractive index (at the emission wavelength of the light source) that is greater than 2, and in some examples the refractive index may be approximately 3 or greater. In some examples, a nanostructure or other metamaterial component may include a material may having an energy bandgap that is larger than the light source emission photon energy. In some examples, a nanostructure or other metamaterial component may include one or more materials, such as arsenide semiconductors (e.g., GaAs, AlAs, $Al_xGa_{1-x}As$), phosphide semiconductors (e.g., GaP, $In_xGa_{1-x}P$), nitride semiconductors (e.g., GaN, InN, AlN), oxides (e.g., a titanium oxide such as $TiO_2$, alumina (sapphire), and the like), other III-V semiconductors, or other II-VI materials.

In some examples, a device component (such as a nanostructure or other metamaterial component (such a matrix material used as a surrounding medium), a microlens, an optical element, a light source, an optical layer, a lens, or other device component) may include a semiconductor (such as an arsenide, phosphide, or nitride semiconductor), dielectric material (such as an inorganic oxide, nitride, carbide, or the like), ceramic, glass (such as silicate glass or a fluoride glass), semi-metal, or metal. In some examples, a device component (such as a nanostructure, optical element, or other device component) may have a generally uniform composition. In some examples, a device may include a gradient-index component, such as a gradient-index lens.

In some examples, a nanostructure composition may vary within a metamaterial layer. In some examples, a metamaterial or other nanostructure composition may have a non-uniform composition, for example, including one or more component materials in a layered, ring, hollow, or otherwise non-uniform composition. In some examples, nanostructures may have a composite structure, for example, including one or more semiconductors and/or one or more metals or other components.

In some examples, nanostructures may be (in whole or in part) embedded in a matrix material. For example, an arrangement of semiconductor nanostructures may be embedded in a matrix layer, such as a layer of semiconductor, glass, inorganic material, polymer, or other material. For example, a metamaterial layer may include an arrangement of nanostructures embedded in layer of matrix material. Nanostructures may include rods (such as nanopillars), particles (such as semiconductor quantum dots, metal nanoparticles, and the like), or other nanostructures. In some examples, a matrix material parameter may vary across the metamaterial layer. A matrix material parameter may include one or more parameters such as layer thickness, composition, optical properties (such as refractive index, that may be a function of composition), additive fraction, polymerization, molecular conformation (such as isomerism, such as photoisomerism), color, and the like. Nanostructures may be attached (e.g., deposited on) an underlying substrate, or dispersed through the matrix material. The matrix material may also be used as a surrounding medium to embed and/or encapsulate the light source.

In some examples, nanostructures may be formed on a substrate layer or otherwise be located proximate a substrate layer. The substrate layer may have a spatially varying parameter, such as an optical parameter such as refractive index, thickness (e.g., the example of a wedge element), or other variable parameter.

FIG. 22 shows an example method 2200 of fabricating an optical device. The method includes providing a light source (such as a laser or light-emitting diode) 2210 and forming an optical element on an emissive surface of the light source (2220), where the optical element is supported by the emissive surface, receives light from the surface-emissive laser, and is configured to redirect the light to illuminate a remote target. The method may further include illuminating a target, such as an eye, using a light beam from the light source, with beam redirection provided by the optical element (2230).

In some examples, a method of illuminating an object, such as an eye, includes providing a light beam by a light source, with the light beam exiting the light source along a first direction, receiving the light beam by an optical element, and directing, by the optical element, the light beam along a second direction towards the object. The second direction may be at an appreciable angle to the first direction, for example, being at a beam redirection angle of between 5 and 70 degrees. The optical element may have an exit surface configured to improve the illumination uniformity of the target.

In some examples, a device may include a light source configured to emit a light beam, an optical element configured to receive the light beam along a first direction and redirect the light beam along a second direction, and an encapsulant layer, where the light beam exits the optical element through an exit surface of the optical element into the encapsulant layer. The optical element may include a high-index material, and the high-index material may have a refractive index of at least approximately 1.5 at a wavelength of the light beam, such as a refractive index of at least approximately 2, for example, a refractive index of at least approximately 3. The light source may include a light-emitting diode or a laser, such as a surface-emitting laser. The optical element may be, at least in part, embedded in the encapsulant layer. The exit surface of the optical element may have an aspheric curved surface, such as a curved freeform surface having no rotational symmetry. The curvature of the exit surface of the optical element may be configured to reduce an illumination uniformity of a target, for example, to below 1 standard deviation. An optical element may include a material (e.g., a high-index material), such as at least one of a semiconductor or a dielectric material. An example optical element may include at least one of an arsenide semiconductor, a phosphide semiconductor, or a nitride semiconductor, and/or may include an oxide. An example optical element may include a material that has a refractive index of at least approximately 2 at a wavelength of the light beam, and, for example, at a typical device ambient temperature. In some examples, an encapsulant layer may have an encapsulant refractive index of between approximately 1.3 and approximately 1.8 at the wavelength of the light beam, and may include a polymer, such as an optical polymer. An encapsulant layer may have an approximately concave exit surface through which the light beam leaves the encapsulant layer, for example, to illuminate a target. An example device may be an augmented reality device and/or a virtual reality device. An example device may be configured so that the light beam is positioned to illuminate an eye of an intended user of a device. In some examples, an example device may include a plurality of light sources configured to illuminate the eye of the intended user, and each light source may have an associated optical element. An optical element, and/or a light source, may be at least in part embedded within an encapsulant layer.

In some examples, a method includes: generating a light beam using a light source; receiving, by an optical element, the light beam; receiving, by an encapsulant layer, the light beam from the optical element, with the light beam being refracted by a shaped surface (e.g., an oblique surface, or an aspheric curved surface such as a freeform surface) of the optical element; and illuminating a target (such as an eye of a user) using the light beam received from the encapsulant layer. The target may be illuminated by a plurality of light beams, with each light beam being generated by a respective light source of a plurality of light sources. The example method may further include detecting a reflected light beam from the target, such as a glint, and may further include tracking the eye of a user using the detected reflected beam. These example methods may be performed, for example, by an augmented reality device and/or a virtual reality device.

In some examples, a device includes a light source configured to emit a light beam and an optical element configured to receive the light beam along a first direction and redirect the light beam along a second direction. The optical element may include a high-index material, such as a semiconductor. The device may be, or include, an eye-tracking device. In some examples, the optical element includes a metamaterial layer. The metamaterial layer may include an arrangement of nanostructures. The nanostructures may have a nanostructure parameter, and the nanostructure parameter may have a spatial variation as a function of position within the metamaterial layer. This spatial variation may convey the desired spatial variation in phase retardation, or other optical property. The nanostructure parameter may include one or more of: a lateral dimension, a cross-sectional area, a length dimension, a composition, a nanostructure spacing, a cross-sectional shape, a cross-sectional shape anisotropy, a cross-sectional uniformity, a taper, a refractive index, a refractive index anisotropy, a coating thickness, a hollow core thickness, a volume fraction of one or more components, an orientation, or a surrounding medium parameter. In some examples, the nanostructures may include nanopillars, where the nanopillars have a diameter or other equivalent lateral dimension (such as an edge length for a polygonal cross-section, such as a square, triangular, pentagonal, or other polygonal cross-section), and the nanostructure parameter may include the nanopillar diameter (or other equivalent dimension).

Examples include high refractive index, and metamaterial based, optical elements, for example, including nanostructures, micro-lenses, prisms, and/or diffractive elements. Applications include beam shaping and/or beam steering of light beams from a light source, for example, in eye-tracking applications. The light source may be a light-emitting diode or a laser (e.g., a vertical cavity surface-emissive laser or VCSEL). Example high refractive index materials may include one or more of various semiconductors. Optical elements may be fabricated directly on the light source, for example, as a metamaterial layer that may include an arrangement of nanostructures having a spatially varying nanostructure parameter. For example, a metamaterial layer having a spatially varying refractive index may include an arrangement of nanopillars having a spatially varying cross-sectional diameter. In some applications, the light sources may be part of augmented or virtual reality headware. For eye-tracking applications, one or more optical elements may be used to direct a light beam towards the center of the eyebox, for example, with an improved beam shape, improved illumination properties such as illumination uniformity, improved glint capture, and/or improved algorithmic pupil edge detection. A device may further include a wedge optical element to direct the light beam towards the eyebox. In some examples, the optical element may have additional components, such as an optical coating to modify reflection or diffraction properties.

In some examples, light sources, such as VCSELs or LEDs, may be located at one or more predetermined radii from the center of the eye. In some examples, light sources may be arranged in one or more rings around the center of the eye. Optical elements at each radius (e.g., the lateral distance between the light source and the eye center) may have a different freeform surface design. The freeform exit surface configuration of an optical element may be modified as a function of ring radius. The optical elements for each light source (e.g., each VCSEL or LED) on the same ring may be oriented so that the light beam is directed towards the eyebox.

Examples of the present disclosure include various exemplary high refractive index optical elements (such as micro-lenses, prisms, and/or diffractive elements) for beam shaping and/or beam steering of light beams used, for example, for eye tracking. In some examples, an optical element is fabricated directly on the emissive surface of a light source. The light source may be, for example, a light-emitting diode or a laser (e.g., a vertical cavity surface-emissive laser or VCSEL). Example high refractive index materials include semiconductors, such as arsenide semiconductors (e.g., GaAs, AlAs, AlGaAs), phosphide semiconductors (e.g., GaP, InP, InGaP), nitride semiconductors (e.g., InN, GaN, AlN, GaAlN, GaInN, etc.), other III-V or II-VI semiconductors, or inorganic dielectric materials such as oxides (e.g., titanium dioxide). In some examples, the refractive index of the high-index material may be at least approximately 2, or at least approximately 3 (e.g., at the light source emission wavelength and a typical operating temperature). In some examples, an optical element may include a semiconductor having a bandgap greater than the photon energy of light from the light source. In some examples, an optical element may be fabricated directly on the light source, for example, using semiconductor processing techniques. In some examples, an optical element may be fabricated on a separate substrate and placed on the light source, for example, bonded with or without an adhesive. In some examples, light sources and optical elements may be fabricated on separate wafers, and the wafers then aligned and bonded. In some applications, the light sources may be part of augmented or virtual reality headware, for example, LEDs embedded in the lenses of augmented reality glasses. The optical elements may be used to direct a light beam towards the center of the eyebox, for example, with an improved beam shape, improved illumination properties such as illumination uniformity, improved glint capture, and/or improved algorithmic pupil edge detection. An optical element may have a complex surface shape, such as a freeform surface. In some examples, the optical element may have an optical coating, for example, to modify reflection or diffraction properties.

In some examples, an optical element may be a lens having a freeform curved surface. The freeform surface may be represented by Equation 1, as follows:

$$z = \frac{cr^2}{1 + \sqrt{1 - (1+k)c^2r^2}} + \sum_{i=1}^{N} A_i E_i(x, y). \quad \text{(Equation 1)}$$

In Equation 1 above, z represents the surface coordinate (e.g., relative to a value representative of a planar surface, for example, relative to a plane at z=0, and this term may also be referred to as the sag), c is a constant (in some examples, c may be referred to as the curvature), r is a radial distance from the optic axis (e.g., a radial distance from a center of the lens), and k is a constant (e.g., sometimes referred to as a conic constant). For the second term (on the right of the equality symbol), N may represent the order of the numerical representation (discussed further below), and $A_i$ and $E_i$ may represent coefficients, such as additional coefficients describing the surface form in powers of x and/or y.

In some examples, the surface coordinate z, along a particular direction, may be a function of a radial distance (r) from the optic axis, and the second term in Equation 1 may be replaced by aspheric coefficients associated with powers of the radial distance, for example, aspheric coefficients of the form $A_i r^i$, where i may have one or more values, such as 1, 2, 3, 4, 5, 6, etc., A may be termed an aspheric parameter, and r is a radial distance. However, the aspheric coefficients may also vary with a function of the direction along which the radial distance is measured.

In some examples, an aspheric surface may have rotational symmetry about the optic axis. However, in some examples, an optical element may have an aspheric surface that lacks such rotational symmetry, that may be termed a freeform surface. A freeform surface may lack any rotational symmetry about the optic axis, and may lack any symmetry. In some examples, a freeform surface may be described by one or more coefficients (that may be termed freeform coefficients) related to powers of a distance (e.g., along a particular direction, such as along orthogonal x or y directions) that may be different along the different directions. For example, a freeform surface may be represented by an equation having the form of Equation 1, and the coefficients $A_i$ and $E_i$ may be termed freeform coefficients.

A freeform surface may have coefficients representing surface variations along the x direction (e.g., associated with different powers of distance along the x direction), along the y direction (e.g., associated with different powers of distance along the y direction), and may include coefficients that may be termed cross-terms, having both x and y dependencies (e.g., coefficients of terms in xy, $xy^2$, etc.). In some examples, a surface of an optical element may be spherical or aspheric along a particular direction, and spherical or aspheric (e.g., with a different radius of curvature and/or different aspheric coefficients) along another direction (such as along an orthogonal direction). In some examples, a device includes an optical element including an aspheric surface, such as a freeform surface, having at least one non-zero (e.g., appreciable) value of one or more aspheric or freeform coefficients, for example, along one or more directions orthogonal to the optic axis. In some examples, a surface may be a freeform surface, having numerical freeform coefficients associated with the dependency of the surface coordinate (e.g., z of Equation 1) on one or more powers of a distance from a reference point, for example, powers of distance measured along orthogonal x and y directions. In some examples, a freeform surface may be considered to be a type of aspheric surface, for example, an aspheric surface lacking symmetry. A freeform surface may lack any rotational symmetry around the optic axis, unlike a spherical surface.

In some examples, the freeform surface may be configured so that the efficiency of the eyebox illumination is at least 80%, and in some examples, at least 90%. In some examples, the illumination is generally uniform, for example, uniform within one standard deviation.

In some examples, the optical properties of a freeform surface may be obtained using a combination of a prismatic optical element, and a metamaterial layer. The oblique exit surface of the prismatic optical element may redirect the beam. Spatially-variable properties of a metamaterial layer may be used for beam shaping, and to obtain improved illumination uniformity, compared with, for example, a prismatic optical element without a metamaterial layer.

In some examples, a control system may be used to provide one or more of the following functions: to control an image displayed by a head-mounted device, receive and analyze sensor data (e.g., receive and analyze reflected light detected by an optical sensor, such as eye glint, and determine eye track data), to adjust one or more adjustable lenses, or to control light sources (such as lasers and/or light-emitting diodes). In some examples, a control system may include a display system, and may be used to adjust an image shown on a display. In some examples, a control system may be used to adjust the optical properties of one or more optical elements, such as the focal length of a lens, the orientation of an optical element, the deformation of a film (such as an electroactive film), or to adjust any other optical component or light source. In some examples, a control system may be used to adjust the light output power of a light source, for example, in response to ambient brightness, eye-tracking requirements of a particular application, the importance of an augmented reality or virtual reality image element, or to achieve a user-controlled setting such as contrast ratio or brightness.

FIG. 23 shows a schematic of an example control system for a near-eye display system, such as an augmented reality system. The display system 2300 may include a near-eye display (NED) 2310 and a control system 2320, that may be communicatively coupled to each other. The near-eye display 2310 may include lenses 2312, electroactive devices (such as actuators) 2314, displays 2316, and one or more sensors 2318. Sensors may include at least one light sensor. Control system 2320 may include a control element 2322, a force lookup table 2324, and augmented reality logic 2326 generating image stream 2328.

Augmented reality logic 2326 may determine what virtual objects are to be displayed and real-world positions onto which the virtual objects are to be projected. Augmented reality logic 2326 may generate an image stream 2328 that is displayed by displays 2316 in such a way that alignment of right- and left-side images displayed in displays 2316 results in ocular vergence toward a desired real-world position.

The control element 2322 may be configured to control one or more adjustable lenses, for example, a fluid lens located within a near-eye display. Lens adjustment may be based on the desired perceived distance to a virtual object (this may, for example, include augmented reality image elements).

Control element 2322 may use the same positioning information determined by augmented reality logic 2326, in combination with force lookup table (LUT) 2324, to determine an amount of force to be applied by electroactive devices 2314 (e.g., actuators), as described herein, to lenses 2312. Electroactive devices 2314 may, responsive to control element 2322, apply appropriate forces to lenses 2312 to adjust the apparent accommodation distance of virtual images displayed in displays 2316 to match the apparent vergence distance of the virtual images, thereby reducing or eliminating vergence-accommodation conflict. Control element 2322 may be in communication with sensor 2318, that may measure a state of the adjustable lens. Based on data received from sensor 2318, the control element 2322 may adjust electroactive devices 2314 (e.g., as a closed-loop control system).

In some embodiments, display system 2300 may display multiple virtual objects at once and may determine which virtual object a user is viewing (or is likely to be viewing) to identify a virtual object for which to correct the apparent accommodation distance. For example, the system may include an eye-tracking system (not shown) that provides information to control element 2322, to enable control element 2322 to select the position of the relevant virtual object.

Additionally or alternatively, augmented reality logic 2326 may provide information about which virtual object is the most important and/or most likely to draw the attention of the user (e.g., based on spatial or temporal proximity, movement, and/or a semantic importance metric attached to the virtual object). In some embodiments, the augmented reality logic 2326 may identify multiple potentially important virtual objects and select an apparent accommodation distance that approximates the virtual distance of a group of the potentially important virtual objects.

Control system 2320 may represent any suitable hardware, software, or combination thereof for managing adjustments to lenses (e.g., adjustable lenses) 2312. In some embodiments, control system 2320 may represent a system on a chip (SOC). As such, one or more portions of control system 2320 may include one or more hardware modules. Additionally or alternatively, one or more portions of control system 2320 may include one or more software modules that perform one or more of the tasks described herein when stored in the memory of a computing device and executed by a hardware processor of the computing device.

Control system 2320 may generally represent any suitable system for providing display data, augmented reality data, and/or augmented reality logic for a head-mounted display. In some embodiments, a control system 2320 may include a graphics processing unit (GPU) and/or any other type of hardware accelerator designed to optimize graphics processing.

Control system 2320 may be implemented in various types of systems, such as augmented reality glasses. A control system may be used to control operation of one or more of a display, a light source, an adjustable lens, image rendering, sensor analysis, and the like. In some embodiments, a control system may be integrated into a frame of an eyewear device. Alternatively, all or a portion of control system may be in a system remote from the eyewear, and, for example, configured to control electroactive devices (e.g., actuators), display components, or other optical components in the eyewear via wired or wireless communication.

The control system, which in some examples may also be referred to as a controller, may control the operations of the light source and, in some cases, the optics system, that may include control of one or more lenses. In some embodiments, the controller may be the graphics processing unit (GPU) of a display device. In some embodiments, the controller may include one or more different or additional processors. The operations performed by the controller may include taking content for display and dividing the content into discrete sections. The controller may instruct the light source to sequentially present the discrete sections using light emitters corresponding to a respective row in an image ultimately displayed to the user. The controller may instruct the optics system to adjust the light. For example, the controller may control the optics system to scan the presented discrete sections to different areas of a coupling element of the light output. Each discrete portion may be presented in a different location at the exit pupil. While each discrete section is presented at different times, the presentation and scanning of the discrete sections may occur fast enough such that a user's eye integrates the different sections into a single image or series of images. The controller may also provide scanning instructions to the light source that include an address corresponding to an individual source element of the light source and/or an electrical bias applied to an individual source or display element.

An example control system (that may also be termed a controller) may include an image processing unit. The controller, or component image processing unit, may include a general-purpose processor and/or one or more application-specific circuits that are dedicated to performing the features described herein. In one embodiment, a general-purpose processor may be coupled to a memory device to execute software instructions that cause the processor to perform certain processes described herein. In some embodiments, the image processing unit may include one or more circuits that are dedicated to performing certain features. The image processing unit may be a stand-alone unit that is separate from the controller and the driver circuit, but in some embodiments the image processing unit may be a sub-unit of the controller or the driver circuit. In other words, in those embodiments, the controller or the driver circuit performs various image processing procedures of the image processing unit. The image processing unit may also be referred to as an image processing circuit.

Ophthalmic applications of the devices described herein may include spectacles with a flat front (or other curved) substrate and an adjustable eye-side concave or convex membrane surface. Applications include optics, augmented reality, or virtual reality headsets. Example devices may include head-mounted-display devices such as augmented reality and/or virtual reality devices.

Embodiments of the present disclosure may include or be implemented in conjunction with various types of artificial reality systems. Artificial reality is a form of reality that has been adjusted in some manner before presentation to a user, that may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of that may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial reality systems may be designed to work without near-eye displays (NEDs). Other artificial reality systems may include an NED that also provides visibility into the real world (such as, e.g., augmented-reality system 2400 in FIG. 24) or that visually immerses a user in an artificial reality (such as, e.g., virtual-reality system 2500 in FIG. 25). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Turning to FIG. 24, augmented-reality system 2400 may include an eyewear device 2402 with a frame 2410 configured to hold a left display device 2415(A) and a right display device 2415(B) in front of a user's eyes. Display devices 2415(A) and 2415(B) may act together or independently to present an image or series of images to a user. While augmented-reality system 2400 includes two displays, embodiments of this disclosure may be implemented in augmented-reality systems with a single NED or more than two NEDs.

In some embodiments, augmented-reality system 2400 may include one or more sensors, such as sensor 2440. Sensor 2440 may generate measurement signals in response to motion of augmented-reality system 2400 and may be located on substantially any portion of frame 2410. Sensor 2440 may represent one or more of a variety of different sensing mechanisms, such as a position sensor, an inertial measurement unit (IMU), a depth camera assembly, a structured light emitter and/or detector, a light sensor, or any combination thereof. In some examples, a light sensor may be configured to detect light reflected by the eye, such as light provided by a light source of an eye-tracking system. In some embodiments, augmented-reality system 2400 may or may not include sensor 2440 or may include more than one sensor. In embodiments in which sensor 2440 includes an IMU, the IMU may generate calibration data based on measurement signals from sensor 2440. Examples of sensor 2440 may include, without limitation, accelerometers, gyroscopes, magnetometers, light sensors, other suitable types of sensors that detect motion, sensors used for error correction of the IMU, or some combination thereof.

In some examples, augmented-reality system 2400 may also include a microphone array with a plurality of acoustic transducers 2420(A)-2420(J), referred to collectively as acoustic transducers 2420. Acoustic transducers 2420 may represent transducers that detect air pressure variations induced by sound waves. Each acoustic transducer 2420 may be configured to detect sound and convert the detected sound into an electronic format (e.g., an analog or digital format). The microphone array in FIG. 25 may include, for example, ten acoustic transducers: 2420(A) and 2420(B), that may be designed to be placed inside a corresponding ear of the user, acoustic transducers 2420(C), 2420(D), 2420(E), 2420(F), 2420(G), and 2420(H), that may be positioned at various locations on frame 2410, and/or acoustic transducers 2420(I) and 2420(J), that may be positioned on a corresponding neckband 2405.

In some embodiments, one or more of acoustic transducers 2420(A)-(F) may be used as output transducers (e.g., speakers). For example, acoustic transducers 2420(A) and/or 2420(B) may be earbuds or any other suitable type of headphone or speaker.

The configuration of acoustic transducers 2420 of the microphone array may vary. While augmented-reality system 2400 is shown in FIG. 24 as having ten acoustic transducers 2420, the number of acoustic transducers 2420 may be greater or less than ten. In some embodiments, using higher numbers of acoustic transducers 2420 may increase the amount of audio information collected and/or the sensitivity and accuracy of the audio information. In contrast, using a lower number of acoustic transducers 2420 may decrease the computing power required by an associated controller 2450 to process the collected audio information. In addition, the position of each acoustic transducer 2420 of the microphone array may vary. For example, the position of an acoustic transducer 2420 may include a defined position on the user, a defined coordinate on frame 2410, an orientation associated with each acoustic transducer 2420, or some combination thereof.

Acoustic transducers 2420(A) and 2420(B) may be positioned on different parts of the user's ear, such as behind the pinna, behind the tragus, and/or within the auricle or fossa. Or, there may be additional acoustic transducers 2420 on or surrounding the ear in addition to acoustic transducers 2420 inside the ear canal. Having an acoustic transducer 2420 positioned next to an ear canal of a user may enable the microphone array to collect information on how sounds arrive at the ear canal. By positioning at least two of acoustic transducers 2420 on either side of a user's head (e.g., as binaural microphones), augmented-reality device 2400 may simulate binaural hearing and capture a 3D stereo sound field around about a user's head. In some embodiments, acoustic transducers 2420(A) and 2420(B) may be connected to augmented-reality system 2400 via a wired connection 2430, and in other embodiments acoustic transducers 2420(A) and 2420(B) may be connected to augmented-reality system 2400 via a wireless connection (e.g., a Bluetooth connection). In still other embodiments, acoustic transducers 2420(A) and 2420(B) may not be used at all in conjunction with augmented-reality system 2400.

Acoustic transducers 2420 on frame 2410 may be positioned in a variety of different ways, including along the length of the temples, across the bridge, above or below display devices 2415(A) and 2415(B), or some combination thereof. Acoustic transducers 2420 may also be oriented such that the microphone array is able to detect sounds in a wide range of directions surrounding the user wearing the augmented-reality system 2400. In some embodiments, an optimization process may be performed during manufacturing of augmented-reality system 2400 to determine relative positioning of each acoustic transducer 2420 in the microphone array.

In some examples, augmented-reality system 2400 may include or be connected to an external device (e.g., a paired device), such as neckband 2405. Neckband 2405 generally represents any type or form of paired device. Thus, the following discussion of neckband 2405 may also apply to various other paired devices, such as charging cases, smart watches, smart phones, wrist bands, other wearable devices, hand-held controllers, tablet computers, laptop computers, other external compute devices, etc.

As shown, neckband 2405 may be coupled to eyewear device 2402 via one or more connectors. The connectors may be wired or wireless and may include electrical and/or non-electrical (e.g., structural) components. In some cases, eyewear device 2402 and neckband 2405 may operate independently without any wired or wireless connection between them. While FIG. 24 illustrates the components of eyewear device 2402 and neckband 2405 in example locations on eyewear device 2402 and neckband 2405, the components may be located elsewhere and/or distributed differently on eyewear device 2402 and/or neckband 2405. In some embodiments, the components of eyewear device 2402 and neckband 2405 may be located on one or more additional peripheral devices paired with eyewear device 2402, neckband 2405, or some combination thereof.

Pairing external devices, such as neckband 2405, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 2400 may be provided by a paired device or shared between a paired device and an eyewear device, thus reducing the weight, heat profile, and form factor of the eyewear device overall while still retaining desired functionality. For example, neckband 2405 may allow components that would otherwise be included on an eyewear device to be included in neckband 2405 since users may tolerate a heavier weight load on their shoulders than they would tolerate on their heads. Neckband 2405 may also have a larger surface area over which to diffuse and disperse heat to the ambient environment. Thus, neckband 2405 may allow for greater battery and computation capacity than might otherwise have been possible on a stand-alone eyewear device. Since weight carried in neckband 2405 may be less invasive to a user than weight carried in eyewear device 2402, a user may tolerate wearing a lighter eyewear device and carrying or wearing the paired device for greater lengths of time than a user would tolerate wearing a heavy stand-alone eyewear device, thereby enabling users to more fully incorporate artificial reality environments into their day-to-day activities.

Neckband 2405 may be communicatively coupled with eyewear device 2402 and/or to other devices. These other devices may provide certain functions (e.g., tracking, localizing, depth mapping, processing, storage, etc.) to augmented-reality system 2400. In the embodiment of FIG. 24, neckband 2405 may include two acoustic transducers (e.g., 2420(I) and 2420(J)) that are part of the microphone array (or potentially form their own microphone subarray). Neckband 2405 may also include a controller 2425 and a power source 2435.

Acoustic transducers 2420(I) and 2420(J) of neckband 2405 may be configured to detect sound and convert the detected sound into an electronic format (analog or digital). In the embodiment of FIG. 24, acoustic transducers 2420(I) and 2420(J) may be positioned on neckband 2405, thereby increasing the distance between the neckband acoustic transducers 2420(I) and 2420(J) and other acoustic transducers 2420 positioned on eyewear device 2402. In some cases, increasing the distance between acoustic transducers 2420 of the microphone array may improve the accuracy of beamforming performed via the microphone array. For example, if a sound is detected by acoustic transducers 2420(C) and 2420(D) and the distance between acoustic transducers 2420(C) and 2420(D) is greater than, for example, the distance between acoustic transducers 2420(D) and 2420(E), the determined source location of the detected sound may be more accurate than if the sound had been detected by acoustic transducers 2420(D) and 2420(E).

Controller 2425 of neckband 2405 may process information generated by the sensors on neckband 2405 and/or augmented-reality system 2400. For example, controller 2425 may process information from the microphone array that describes sounds detected by the microphone array. For each detected sound, controller 2425 may perform a direction-of-arrival (DOA) estimation to estimate a direction from which the detected sound arrived at the microphone array. As the microphone array detects sounds, controller 2425 may populate an audio data set with the information. In embodiments in which augmented-reality system 2400 includes an inertial measurement unit, controller 2425 may compute all inertial and spatial calculations from the IMU located on eyewear device 2402. A connector may convey information between augmented-reality system 2400 and neckband 2405 and between augmented-reality system 2400 and controller 2425. The information may be in the form of optical data, electrical data, wireless data, or any other transmittable data form. Moving the processing of information generated by augmented-reality system 2400 to neckband 2405 may reduce weight and heat in eyewear device 2402, making it more comfortable to the user.

Power source 2435 in neckband 2405 may provide power to eyewear device 2402 and/or to neckband 2405. Power source 2435 may include, without limitation, lithium ion batteries, lithium-polymer batteries, primary lithium batteries, alkaline batteries, or any other form of power storage. In some cases, power source 2435 may be a wired power source. Including power source 2435 on neckband 2405 instead of on eyewear device 2402 may help better distribute the weight and heat generated by power source 2435.

As noted, some artificial reality systems may, instead of blending an artificial reality with actual reality, substantially replace one or more of a user's sensory perceptions of the real world with a virtual experience. One example of this type of system is a head-worn display system, such as virtual-reality system 2500 in FIG. 25, that mostly or completely covers a user's field of view. Virtual-reality system 2500 may include a front rigid body 2502 and a band 2504 shaped to fit around a user's head. Virtual-reality system 2500 may also include output audio transducers 2506(A) and 2506(B). Furthermore, while not shown in FIG. 25, front rigid body 2502 may include one or more electronic elements, including one or more electronic displays, one or more inertial measurement units (IMUs), one or more tracking emitters or detectors, and/or any other suitable device or system for creating an artificial-reality experience.

Artificial reality systems may include a variety of types of visual feedback mechanisms. For example, display devices in augmented-reality system 2400 and/or virtual-reality system 2500 may include one or more liquid crystal displays (LCDs), light-emitting diode (LED) displays, organic LED (OLED) displays, digital light project (DLP) micro-displays, liquid crystal on silicon (LCoS) micro-displays, and/or any other suitable type of display screen. These artificial reality systems may include a single display screen for both eyes or may provide a display screen for each eye, that may allow for additional flexibility for varifocal adjustments or for correcting a user's refractive error. Some of these artificial reality systems may also include optical subsystems having one or more lenses (e.g., conventional concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some the artificial reality systems described herein may include one or more projection systems. For example, display devices in augmented-reality system 2400 and/or virtual-reality system 2500 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial reality systems may also be configured with any other suitable type or form of image projection system, such as retinal projectors used in virtual retina displays.

The artificial reality systems described herein may also include various types of computer vision components and subsystems. For example, augmented-reality system 2400 and/or virtual-reality system 2500 may include one or more optical sensors (which may also be termed light sensors), such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial reality system may process data from one or more of these sensors to identify a location of a user, to map the real world, to provide a user with context about real-world surroundings, and/or to perform a variety of other functions.

The artificial reality systems described herein may also include one or more input and/or output audio transducers. Output audio transducers may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

In some embodiments, the artificial reality systems described herein may also include tactile (i.e., haptic) feedback systems, that may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial reality devices, within other artificial reality devices, and/or in conjunction with other artificial reality devices.

By providing haptic sensations, audible content, and/or visual content, artificial reality systems may create an entire virtual experience or enhance a user's real-world experience in a variety of contexts and environments. For instance, artificial reality systems may assist or extend a user's perception, memory, or cognition within a particular environment. Some systems may enhance a user's interactions with other people in the real world or may enable more immersive interactions with other people in a virtual world. Artificial reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial reality experience in one or more of these contexts and environments and/or in other contexts and environments.

In some embodiments, the systems described herein may also include an eye-tracking subsystem designed to identify and track various characteristics of a user's eye(s), such as the user's gaze direction. The phrase "eye tracking" may, in some examples, refer to a process by which the position, orientation, and/or motion of an eye is measured, detected, sensed, determined, and/or monitored. The disclosed systems may measure the position, orientation, and/or motion of an eye in a variety of different ways, including through the use of various optical-based eye-tracking techniques, ultra-sound-based eye-tracking techniques, etc. An eye-tracking subsystem may be configured in a number of different ways and may include a variety of different eye-tracking hardware components or other computer-vision components. For example, an eye-tracking subsystem may include a variety of different optical sensors, such as two-dimensional (2D) or 3D cameras, time-of-flight depth sensors, single-beam or sweeping laser rangefinders, 3D LiDAR sensors, and/or any other suitable type or form of optical sensor. In this example, a processing subsystem may process data from one or more of these sensors to measure, detect, determine, and/or otherwise monitor the position, orientation, and/or motion of the user's eye(s). Optical sensors may also be referred to as light sensors.

FIG. 26 is an illustration of an exemplary system 2600 that incorporates an eye-tracking subsystem capable of tracking a user's eye(s). As depicted in FIG. 26, system 2600 may include a light source 2602, an optical subsystem 2604, an eye-tracking subsystem 2606, and/or a control subsystem 2608. In some examples, light source 2602 may generate light for an image (e.g., to be presented to an eye 2601 of the viewer). Light source 2602 may represent any of a variety of suitable devices. For example, light source 2602 can include a two-dimensional projector (e.g., a LCoS display), a scanning source (e.g., a scanning laser), or other device (e.g., an LCD, an LED display, an OLED display, an active-matrix OLED display (AMOLED), a transparent OLED display (TOLED), a waveguide, or some other display capable of generating light for presenting an image to the viewer). In some examples, the image may represent a virtual image, that may refer to an optical image formed from the apparent divergence of light rays from a point in space, as opposed to an image formed from the light ray's actual divergence.

In some embodiments, optical subsystem 2604 may receive the light generated by light source 2602 and generate, based on the received light, converging light 2620 that includes the image. In some examples, optical subsystem 2604 may include any number of lenses (e.g., Fresnel lenses, convex lenses, concave lenses), apertures, filters, mirrors, prisms, and/or other optical components, possibly in combination with actuators and/or other devices. In particular, the actuators and/or other devices may translate and/or rotate one or more of the optical components to alter one or more aspects of converging light 2620. Further, various mechanical couplings may serve to maintain the relative spacing and/or the orientation of the optical components in any suitable combination.

In one embodiment, eye-tracking subsystem 2606 may generate tracking information indicating a gaze angle of an eye 2601 of the viewer. In this embodiment, control subsystem 2608 may control aspects of optical subsystem 2604 (e.g., the angle of incidence of converging light 2620) based at least in part on this tracking information. Additionally, in some examples, control subsystem 2608 may store and utilize historical tracking information (e.g., a history of the tracking information over a given duration, such as the previous second or fraction thereof) to anticipate the gaze angle of eye 2601 (e.g., an angle between the visual axis and the anatomical axis of eye 2601). In some embodiments, eye-tracking subsystem 2606 may detect radiation emanating from some portion of eye 2601 (e.g., the cornea, the iris, the pupil, or the like) to determine the current gaze angle of eye 2601. In other examples, eye-tracking subsystem 2606 may employ a wavefront sensor to track the current location of the pupil.

Any number of techniques can be used to track eye 2601. Some techniques may involve illuminating eye 2601 with infrared light and measuring reflections with at least one optical sensor that is tuned to be sensitive to the infrared light. Information about how the infrared light is reflected from eye 2601 may be analyzed to determine the position(s), orientation(s), and/or motion(s) of one or more eye feature(s), such as the cornea, pupil, iris, and/or retinal blood vessels.

In some examples, the radiation captured by a light sensor of eye-tracking subsystem 2606 may be digitized (i.e., converted to an electronic signal). Further, the sensor may transmit a digital representation of this electronic signal to one or more processors (e.g., processors associated with a device including eye-tracking subsystem 2606). Eye-tracking subsystem 2606 may include any of a variety of sensors in a variety of different configurations. For example, eye-tracking subsystem 2606 may include an infrared detector that reacts to infrared radiation. The infrared detector may be a thermal detector, a photonic detector, and/or any other suitable type of detector. Thermal detectors may include detectors that react to thermal effects of the incident infrared radiation.

In some examples, one or more processors may process the digital representation generated by the sensor(s) of eye-tracking subsystem 2606 to track the movement of eye 2601. In another example, these processors may track the movements of eye 2601 by executing algorithms represented by computer-executable instructions stored on non-transitory memory. In some examples, on-chip logic (e.g., an application-specific integrated circuit or ASIC) may be used to perform at least portions of such algorithms. As noted, eye-tracking subsystem 2606 may be programmed to use an output of the sensor(s) to track movement of eye 2601. In some embodiments, eye-tracking subsystem 2606 may analyze the digital representation generated by the sensors to extract eye rotation information from changes in reflections. In one embodiment, eye-tracking subsystem 2606 may use corneal reflections or glints (also known as Purkinje images) and/or the center of the eye's pupil 2622 as features to track over time.

In some embodiments, eye-tracking subsystem 2606 may use the center of the eye's pupil 2622 and infrared or near-infrared, non-collimated light to create corneal reflections. In these embodiments, eye-tracking subsystem 2606 may use the vector between the center of the eye's pupil 2622 and the corneal reflections to compute the gaze direction of eye 2601. In some embodiments, the disclosed systems may perform a calibration procedure for an individual (using, e.g., supervised or unsupervised techniques) before tracking the user's eyes. For example, the calibration procedure may include directing users to look at one or more points displayed on a display while the eye-tracking system records the values that correspond to each gaze position associated with each point.

In some embodiments, eye-tracking subsystem 2606 may use two types of infrared and/or near-infrared (also known as active light) eye-tracking techniques: bright-pupil and dark-pupil eye tracking, that may be differentiated based on the location of an illumination source with respect to the optical elements used. If the illumination is coaxial with the optical path, then eye 2601 may act as a retroreflector as the light reflects off the retina, thereby creating a bright pupil effect similar to a red-eye effect in photography. If the illumination source is offset from the optical path, then the eye's pupil 2622 may appear dark because the retroreflection from the retina is directed away from the sensor. In some embodiments, bright-pupil tracking may create greater iris/pupil contrast, allowing more robust eye tracking with iris pigmentation, and may feature reduced interference (e.g., interference caused by eyelashes and other obscuring features). Bright-pupil tracking may also allow tracking in lighting conditions ranging from total darkness to a very bright environment.

In some embodiments, control subsystem 2608 may control light source 2602 and/or optical subsystem 2604 to reduce optical aberrations (e.g., chromatic aberrations and/or monochromatic aberrations) of the image that may be caused by or influenced by eye 2601. In some examples, as mentioned above, control subsystem 2608 may use the tracking information from eye-tracking subsystem 2606 to perform such control. For example, in controlling light source 2602, control subsystem 2608 may alter the light generated by light source 2602 (e.g., by way of image rendering) to modify (e.g., pre-distort) the image so that the aberration of the image caused by eye 2601 is reduced.

The disclosed systems may track both the position and relative size of the pupil (since, e.g., the pupil dilates and/or contracts). In some examples, the eye-tracking devices and components (e.g., sensors and/or sources) used for detecting and/or tracking the pupil may be different (or calibrated differently) for different types of eyes. For example, the frequency range of the sensors may be different (or separately calibrated) for eyes of different colors and/or different pupil types, sizes, and/or the like. As such, the various eye-tracking components (e.g., infrared sources and/or sensors) described herein may need to be calibrated for each individual user and/or eye.

The disclosed systems may track both eyes with and without ophthalmic correction, such as that provided by contact lenses worn by the user. In some embodiments, ophthalmic correction elements (e.g., adjustable lenses) may be directly incorporated into the artificial reality systems described herein. In some examples, the color of the user's eye may necessitate modification of a corresponding eye-tracking algorithm. For example, eye-tracking algorithms may need to be modified based at least in part on the differing color contrast between a brown eye and, for example, a blue eye.

FIGS. 27A-B show a more detailed illustration of various aspects of the eye-tracking subsystem illustrated in FIG. 26. As shown in FIG. 27A, an eye-tracking subsystem 2700 may include at least one source 2704 and at least one sensor 2706. Source 2704, which may include a light source, optical element, and encapsulant layer, may generally represents any type or form of element capable of emitting radiation. In some examples, source 2704 may generate visible, infrared, and/or near-infrared radiation. In some examples, source 2704 may radiate non-collimated infrared and/or near-infrared portions of the electromagnetic spectrum towards an eye 2702 of a user. Source 2704 may utilize a variety of sampling rates and speeds. For example, the disclosed systems may use sources with higher sampling rates in order to capture fixational eye movements of a user's eye 2702 and/or to correctly measure saccade dynamics of the user's eye 2702. As noted above, any type or form of eye-tracking technique may be used to track the user's eye 2702, including optical-based eye-tracking techniques, ultrasound-based eye-tracking techniques, etc.

Sensor 2706 generally represents any type or form of element capable of detecting radiation, such as radiation reflected off the user's eye 2702. Examples of sensor 2706 include, without limitation, a charge coupled device (CCD), a photodiode array, a complementary metal-oxide-semiconductor (CMOS) based sensor device, and/or the like. In some examples, sensor 2706 may represent a sensor having predetermined parameters, including, but not limited to, a dynamic resolution range, linearity, and/or other characteristic selected and/or designed specifically for eye tracking.

As detailed above, eye-tracking subsystem 2700 may generate one or more glints. As detailed above, a glint 2703 may represent reflections of radiation (e.g., infrared radiation from an infrared source, such as source 2704) from the structure of the user's eye. In various embodiments, glint 2703 and/or the user's pupil may be tracked using an eye-tracking algorithm executed by a processor (either within or external to an artificial reality device). For example, an artificial reality device may include a processor and/or a memory device in order to perform eye tracking locally and/or a transceiver to send and receive the data necessary to perform eye tracking on an external device (e.g., a mobile phone, cloud server, or other computing device).

FIG. 27B shows an example image 2705 captured by an eye-tracking subsystem, such as eye-tracking subsystem 2700. In this example, image 2705 may include both the user's pupil 2708 and a glint 2710 near the same. In some examples, pupil 2708 and/or glint 2710 may be identified using an artificial-intelligence-based algorithm, such as a computer-vision-based algorithm. In one embodiment, image 2705 may represent a single frame in a series of frames that may be analyzed continuously in order to track the eye 2702 of the user. Further, pupil 2708 and/or glint 2710 may be tracked over a period of time to determine a user's gaze.

In some examples, eye-tracking subsystem 2700 may be configured to identify and measure the inter-pupillary distance (IPD) of a user. In some embodiments, eye-tracking subsystem 2700 may measure and/or calculate the IPD of the user while the user is wearing the artificial reality system. In these embodiments, eye-tracking subsystem 2700 may detect the positions of a user's eyes and may use this information to calculate the user's IPD.

As noted, the eye-tracking systems or subsystems disclosed herein may track a user's eye position and/or eye movement in a variety of ways. In some examples, one or more light sources and/or optical sensors may capture an image of the user's eyes. The eye-tracking subsystem may then use the captured information to determine the user's inter-pupillary distance, interocular distance, and/or a 3D position of each eye (e.g., for distortion adjustment purposes), including a magnitude of torsion and rotation (i.e., roll, pitch, and yaw) and/or gaze directions for each eye. In some examples, infrared light may be emitted by the eye-tracking subsystem and reflected from each eye. The reflected light may be received or detected by an optical sensor and analyzed to extract eye rotation data from changes in the infrared light reflected by each eye.

The eye-tracking subsystem may use any of a variety of different methods to track the eyes of a user. For example, a light source (e.g., infrared light-emitting diodes) may emit a dot pattern onto each eye of the user. The eye-tracking subsystem may then detect (e.g., via an optical sensor coupled to the artificial reality system) and analyze a reflection of the dot pattern from each eye of the user to identify a location of each pupil of the user. Accordingly, the eye-tracking subsystem may track up to six degrees of freedom of each eye (i.e., 3D position, roll, pitch, and yaw) and at least a subset of the tracked quantities may be combined from two eyes of a user to estimate a gaze point (i.e., a 3D location or position in a virtual scene where the user is looking) and/or an IPD.

In some cases, the distance between a user's pupil and a display may change as the user's eye moves to look in different directions. The varying distance between a pupil and a display as viewing direction changes may be referred to as "pupil swim" and may contribute to distortion perceived by the user as a result of light focusing in different locations as the distance between the pupil and the display changes. Accordingly, measuring distortion at different eye positions and pupil distances relative to displays and generating distortion corrections for different positions and distances may allow mitigation of distortion caused by pupil swim by tracking the 3D position of a user's eyes and applying a distortion correction corresponding to the 3D position of each of the user's eyes at a given point in time. Thus, knowing the 3D position of each of a user's eyes may allow for the mitigation of distortion caused by changes in the distance between the pupil of the eye and the display by applying a distortion correction for each 3D eye position. Furthermore, as noted above, knowing the position of each of the user's eyes may also enable the eye-tracking subsystem to make automated adjustments for a user's IPD.

In some embodiments, a display subsystem may include a variety of additional subsystems that may work in conjunction with the eye-tracking subsystems described herein. For example, a display subsystem may include a varifocal subsystem, a scene-rendering module, and/or a vergence-processing module. The varifocal subsystem may cause left and right display elements to vary the focal distance of the display device. In one embodiment, the varifocal subsystem may physically change the distance between a display and the optics through which it is viewed by moving the display, the optics, or both. Additionally, moving or translating two lenses relative to each other may also be used to change the focal distance of the display. Thus, the varifocal subsystem may include actuators or motors that move displays and/or optics to change the distance between them. This varifocal subsystem may be separate from or integrated into the display subsystem. The varifocal subsystem may also be integrated into or separate from its actuation subsystem and/or the eye-tracking subsystems described herein.

In some examples, the display subsystem may include a vergence-processing module configured to determine a vergence depth of a user's gaze based on a gaze point and/or an estimated intersection of the gaze lines determined by the eye-tracking subsystem. Vergence may refer to the simultaneous movement or rotation of both eyes in opposite directions to maintain single binocular vision, that may be naturally and automatically performed by the human eye. Thus, a location where a user's eyes are verged is where the user is looking and is also typically the location where the user's eyes are focused. For example, the vergence-processing module may triangulate gaze lines to estimate a distance or depth from the user associated with intersection of the gaze lines. The depth associated with intersection of the gaze lines may then be used as an approximation for the accommodation distance, that may identify a distance from the user where the user's eyes are directed. Thus, the vergence distance may allow for the determination of a location where the user's eyes may be focused, and a depth from the user's eyes at which the eyes are focused, thereby providing information (such as an object or plane of focus) for rendering adjustments to the virtual scene.

The vergence-processing module may coordinate with the eye-tracking subsystems described herein to make adjustments to the display subsystem to account for a user's vergence depth. When the user is focused on something at a distance, the user's pupils may be slightly farther apart than when the user is focused on something close. The eye-tracking subsystem may obtain information about the user's vergence or focus depth and may adjust the display subsystem to be closer together when the user's eyes focus or verge on something close and to be farther apart when the user's eyes focus or verge on something at a distance.

The eye-tracking information generated by the above-described eye-tracking subsystems may also be used, for example, to modify various aspect of how different computer-generated images are presented. For example, a display subsystem may be configured to modify, based on information generated by an eye-tracking subsystem, at least one aspect of how the computer-generated images are presented. For instance, the computer-generated images may be modified based on the user's eye movement, such that if a user is looking up, the computer-generated images may be moved upward on the screen. Similarly, if the user is looking to the side or down, the computer-generated images may be moved to the side or downward on the screen. If the user's eyes are closed, the computer-generated images may be paused or removed from the display and resumed once the user's eyes are back open.

The above-described eye-tracking subsystems can be incorporated into one or more of the various artificial reality systems described herein in a variety of ways. For example, one or more of the various components of system 2600 and/or eye-tracking subsystem 2700 may be incorporated into augmented-reality system 2400 in FIG. 24 and/or virtual-reality system 2500 in FIG. 25 to enable these systems to perform various eye-tracking tasks (including one or more of the eye-tracking operations described herein).

EXAMPLE EMBODIMENTS

Example 1. A device may include a light source configured to emit a light beam through a light-emissive surface of the light source, and an optical element supported by the light-emissive surface, and configured to receive the light beam along a first direction and redirect the light beam along a second direction, where the second direction is different to the first direction, the optical element includes a material having a refractive index of greater than 2 at the wavelength of the light beam.

Example 2. The device of example 1, where the light source and optical element are integrated into a monolithic light-emitting module.

Example 3. The device of examples 1 or 2, where the material includes a semiconductor.

Example 4. The device of any of examples 1-3, where the semiconductor includes an arsenide semiconductor, a phosphide semiconductor, or a nitride semiconductor.

Example 5. The device of any of examples 1-4, where the light source includes a laser.

Example 6. The device of any of examples 1-5, where the laser is a vertical cavity surface-emissive laser.

Example 7. The device of any of examples 1-6, where the optical element is formed on the light emissive surface of the laser.

Example 8. The device of any of examples 1-7, where the device is a head-mounted device, and the device is configured to illuminate an eye of a user using the light beam.

Example 9. The device of any of examples 1-8, where the device further includes a light sensor configured to detect a reflection of the light beam from the eye.

Example 10. The device of any of examples 1-9, where the device is an augmented reality device or a virtual reality device.

Example 11. The device of any of examples 1-10, where the optical element includes a metamaterial layer.

Example 12. The device of example 10, where the metamaterial layer includes an arrangement of nanostructures.

Example 13. The device of any of examples 10-11, where the nanostructures each have a nanostructure parameter, where the nanostructure parameter has a spatial variation as a function of position within the metamaterial layer, and the spatial variation is configured to improve the illumination uniformity of a target illuminated by the light beam.

Example 14. The device of any of examples 10-13, where the nanostructure parameter includes one or more of: a lateral dimension, a cross-sectional area, a length dimension, a composition, a nanostructure spacing, a cross-sectional shape, a cross-sectional shape anisotropy, a cross-sectional uniformity, a taper, a refractive index, a refractive index anisotropy, a coating thickness, a hollow core thickness, a volume fraction of at least one component, or an orientation.

Example 15. The device of any of examples 10-14, where the nanostructures include nanopillars, the nanopillars have a diameter, and the nanostructure parameter is a nanopillar diameter.

Example 16. The device of any of examples 10-14, where the nanostructures include polarization-sensitive nanostructures.

Example 17. A method, including fabricating a laser having an emissive surface, forming a layer on the emissive surface of the laser, forming a resist layer on the layer, the resist layer having a shape determined by a spatially non-uniform thickness of the resist layer, and etching the shape of the resist layer into the layer to form an optical element having a shaped exit surface, where the optical element is supported by the emissive surface of the surface-emissive laser, receives light from the surface-emissive laser, and is configured to redirect the light by refraction through the shaped exit surface to illuminate a remote target.

Example 18. The method of example 17, where the shaped exit surface is an oblique surface, and the optical element includes a prism.

Example 19. The method of any of examples 17-18, where the shaped exit surface includes a curved exit surface.

Example 20. The method of any of examples 17-19, where forming the layer on the emissive surface of the laser includes forming a passivation layer on the emissive surface, and then forming the layer on the passivation layer.

As detailed above, the devices and systems described and/or illustrated herein may broadly include any type or form of computing device or system capable of executing computer-readable instructions, such as those contained within the modules described herein. In some configurations, these device(s) may include at least one memory device and at least one physical processor.

In some examples, the term "memory device" generally refers to any type or form of volatile or non-volatile storage device or medium capable of storing data and/or computer-readable instructions. In some examples, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In some examples, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although discussed as separate elements, example modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the modules described herein may transform data, physical devices, and/or representations of physical devices from one form to another. For example, one or more of the modules recited herein may receive data to be transformed, transform the data, output a result of the transformation to perform a function, use the result of the transformation to perform a function, and store the result of the transformation to perform a function. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device. In some examples, data may include configuration data related one or both of the user's eye(s) (e.g., external surface profile the cornea, lens focus, gaze direction, gaze time, gaze trajectory, eye accommodation data, pupil diameter, and/or eye vergence data).

In some embodiments, the term "computer-readable medium" may generally refer to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The disclosures of the following US Applications are incorporated, in their entirety, by this reference: U.S. Provisional Application Nos. 62/803,001 and 62/802,995, both filed 8 Feb. 2019, U.S. Provisional Application No. 62/841,728, filed 1 May 2019, and U.S. application Ser. No. 16/720,024, filed 19 Dec. 2019.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

What is claimed is:

1. A device, comprising:
   a plurality of light source modules, wherein each light source module of the plurality of light source modules comprises:
      a light source configured to emit a light beam through a light-emissive surface; and
      an optical element supported by the light-emissive surface and configured to receive the light beam along a first direction and redirect the light beam along a second direction,
   wherein:
      the second direction is different from the first direction;
      the optical element comprises a material that has a refractive index of greater than 2 at a wavelength of the light beam;
      a deviation angle between the first direction and the second direction for each light source module of the plurality of light source modules is based on a location within the device and configured so that a target is illuminated by all light source modules of the plurality of light source modules;
      the device is a wearable device;
      the target includes an eye of a user when the user wears the device; and
      each optical element of the plurality of light source modules has an aspheric surface configured to provide the deviation angle based on a lateral offset from a center of the eye.

2. The device of claim 1, wherein the light source and the optical element are integrated into a monolithic light-emitting module.

3. The device of claim 1, wherein the material comprises a semiconductor.

4. The device of claim 1, wherein the material comprises at least one of an arsenide semiconductor, a phosphide semiconductor, or a nitride semiconductor.

5. The device of claim 1, wherein the light source comprises a laser.

6. The device of claim 5, wherein the laser is a vertical cavity surface-emissive laser.

7. The device of claim 5, wherein the optical element is formed on the light-emissive surface of the laser.

8. The device of claim 1, wherein:
   the device is a head-mounted device;
   the device comprises an eye tracker; and
   the eye tracker comprises the light source.

9. The device of claim 8, wherein the device further comprises a light sensor configured to detect a reflection of the light beam from the eye.

10. The device of claim 1, wherein the device is an augmented reality device or a virtual reality device.

11. The device of claim 1, wherein the optical element comprises a metamaterial layer.

12. The device of claim 11, wherein the metamaterial layer comprises an arrangement of nanostructures.

13. The device of claim 12, wherein each nanostructure of the arrangement of nanostructures has a nanostructure parameter, wherein the nanostructure parameter has a spatial variation as a function of position within the metamaterial layer, the spatial variation being configured to improve illumination uniformity of the target illuminated by the light beam.

14. The device of claim 13, wherein the nanostructure parameter includes at least one of: a lateral dimension, a cross-sectional area, a length dimension, a composition, a nanostructure spacing, a cross-sectional shape, a cross-sectional shape anisotropy, a cross-sectional uniformity, a taper, a nanostructure refractive index, a nanostructure refractive index anisotropy, a coating thickness, a hollow core thickness, a volume fraction of at least one component, or an orientation.

15. The device of claim 13, wherein the arrangement of nanostructures comprises nanopillars, and the nanostructure parameter is a nanopillar diameter.

16. The device of claim 13, wherein the arrangement of nanostructures comprises polarization-sensitive nanostructures.

17. A method, comprising:
   fabricating a laser having an emissive surface;
   forming a layer on the emissive surface of the laser;
   forming a resist layer on the layer, the resist layer having a shape determined by a spatially non-uniform thickness of the resist layer;
   etching the shape of the resist layer into the layer to form an optical element having a shaped exit surface, thereby forming a light source module including the laser and the optical element; and
   fabricating a device comprising a plurality of light source modules including the light source module,
   wherein:
      the optical element is supported by the emissive surface of the laser, receives light from the laser, and is configured to redirect the light through a deviation angle by refraction through the shaped exit surface to illuminate a target;
      the deviation angle for each light source module of the plurality of light source modules is based on a location within the device and configured so that the target is illuminated by the plurality of light source modules;
      the device is a wearable device;
      the target includes an eye of a user when the user wears the device; and
      each optical element of the plurality of light source modules has an aspheric surface configured to provide the deviation angle based on a lateral offset from a center of the eye.

18. The method of claim 17, wherein the shaped exit surface is an oblique surface, and the optical element comprises a prism.

19. The method of claim 17, wherein the shaped exit surface includes a curved exit surface.

20. The method of claim 17, wherein forming the layer on the emissive surface of the laser comprises forming a passivation layer on the emissive surface and then forming the layer on the passivation layer.

* * * * *